(12) United States Patent
Furukawa et al.

(10) Patent No.: US 8,143,628 B2
(45) Date of Patent: Mar. 27, 2012

(54) FLEXIBLE DISPLAY AND MANUFACTURING METHOD OF THE SAME

(75) Inventors: Tadahiro Furukawa, Tokyo (JP); Shizuo Tokito, Tokyo (JP); Youji Inoue, Tokyo (JP); Mitsunori Suzuki, Tokyo (JP)

(73) Assignees: Kyodo Printing Co., Ltd. (JP); Nippon Hoso Kyokai (JP)

( * ) Notice: Subject to any disclaimer, the term of this patent is extended or adjusted under 35 U.S.C. 154(b) by 103 days.

(21) Appl. No.: 12/856,911

(22) Filed: Aug. 16, 2010

(65) Prior Publication Data
US 2011/0037916 A1 Feb. 17, 2011

Related U.S. Application Data

(62) Division of application No. 11/265,172, filed on Nov. 3, 2005, now Pat. No. 7,825,582.

(30) Foreign Application Priority Data

Nov. 8, 2004 (JP) .................................. 2004-323527
Jun. 29, 2005 (JP) .................................. 2005-190623

(51) Int. Cl.
*G09G 5/00* (2006.01)

(52) U.S. Cl. ................................ 257/72; 257/59; 349/43

(58) Field of Classification Search .......... 313/495–512; 257/40, 59, 72, E51.046; 345/30, 36, 44, 345/45; 315/169.3, 169.4; 349/43–44
See application file for complete search history.

(56) References Cited

U.S. PATENT DOCUMENTS

| 2001/0015256 A1 | 8/2001 | Yamazaki et al. |
| 2002/0093610 A1 | 7/2002 | Furukawa et al. |
| 2003/0160235 A1 | 8/2003 | Hirai |
| 2005/0093435 A1 | 5/2005 | Suh et al. |

FOREIGN PATENT DOCUMENTS

| JP | 2003-131199 A | 5/2003 |
| JP | 2003-255857 | 9/2003 |
| JP | 2003-318195 | 11/2003 |
| JP | 2004-281183 | 10/2004 |

*Primary Examiner* — Karabi Guharay
*Assistant Examiner* — Elmito Breval
(74) *Attorney, Agent, or Firm* — Bacon & Thomas, PLLC

(57) ABSTRACT

A flexible display of the present invention is an active matrix flexible display in which a TFT is provided for each pixel. In the flexible display, an adhesive layer, a protective layer, a gate electrode for the TFT, which is buried in the protective layer, a gate insulating layer for the TFT, source and drain electrodes for the TFT, a pixel electrode electrically connected to the drain electrode, an organic active layer for the TFT, an organic EL layer including a red (R) emitting layer, a green (G) emitting layer and a blue (B) emitting layer, which are formed on a plurality of the pixel electrodes, a metal electrode, and a sealing layer are formed on a plastic film.

4 Claims, 34 Drawing Sheets

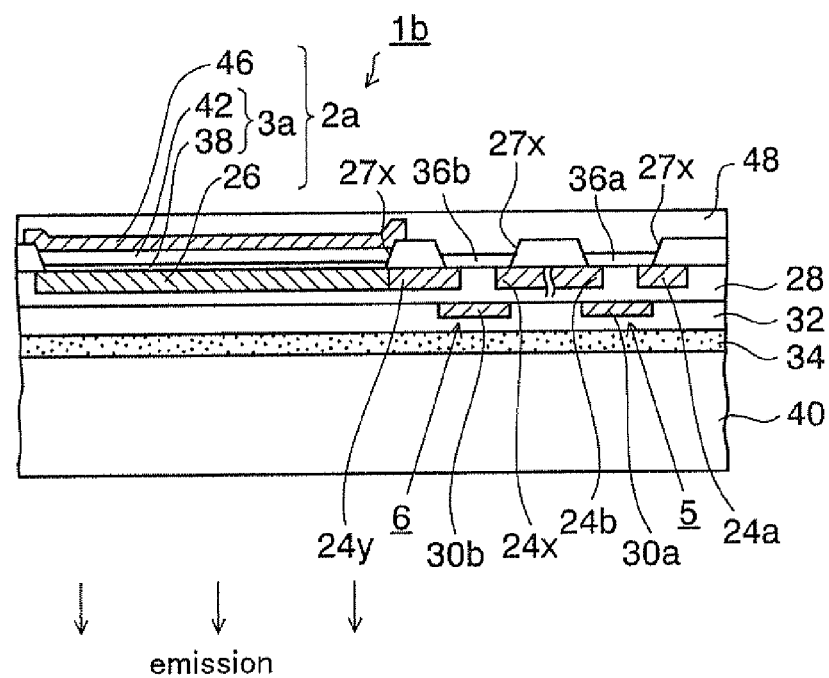

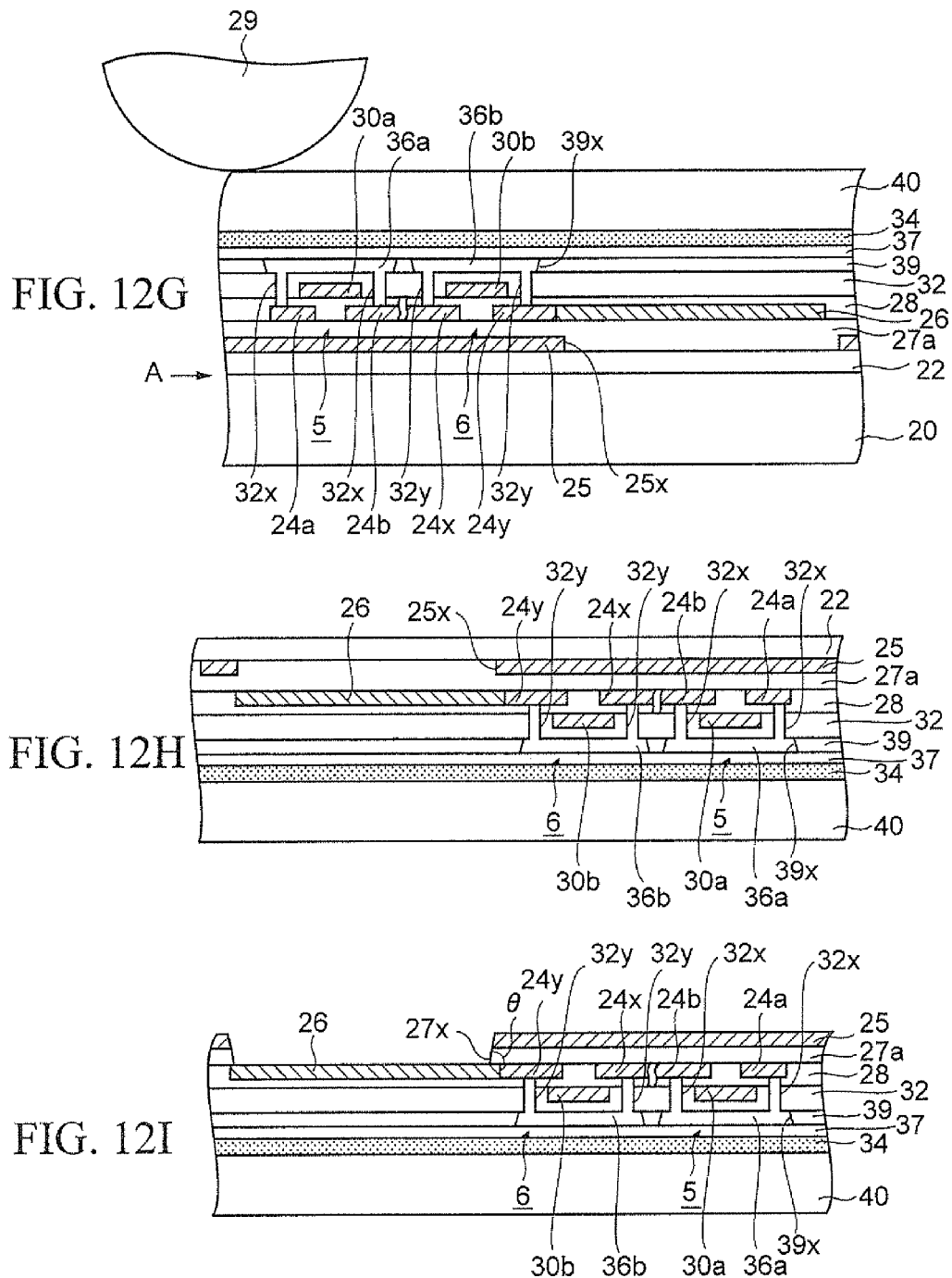

FLEXIBLE DISPLAY AND MANUFACTURING METHOD OF THE SAME

CROSS REFERENCE TO RELATED APPLICATIONS

The present application is a Divisional application of U.S. patent application Ser. No. 11/265,172, filed Nov. 3, 2005 now U.S. Pat. No. 7,825,582.

BACKGROUND OF THE INVENTION

1. Field of the Invention

The present invention relates to a flexible display and a manufacturing method thereof. More particularly, the present invention relates to a flexible display applicable to an organic EL display, a liquid crystal display and the like which use a plastic film as a substrate, and a manufacturing method thereof.

2. Description of the Related Art

There has been a rapid increase in applications of a display device, such as an organic EL (electroluminescence) display and a liquid crystal display, to information device and the like. A flexible display using a plastic film as a substrate has recently attracted attention. Such a flexible display can be utilized not only for an ultraslim and light mobile device which can be housed while being rolled up and is easily carried around but also for a large-sized display.

However, since the plastic film has low rigidity and a low heat distortion temperature, heat distortion such as warping and expansion/contraction is likely to occur in manufacturing steps involving heat treatment. Thus, in a manufacturing method by which various elements are formed directly on the plastic film, conditions of the manufacturing steps involving heat treatment are limited, and it becomes difficult to perform high-accuracy alignment. Consequently, it may be impossible to manufacture an element substrate having desired characteristics.

In order to avoid the problem as described above, there is a method of manufacturing an element substrate for a liquid crystal device in the following manner (Patent Document 1 Japanese Patent Laid-Open Official Gazette No. 2003-131199)). Specifically, without having manufacturing conditions limited, a transparent electrode, a color filter layer and the like are formed on a heat-resistant and rigid glass substrate while being aligned with high accuracy. Thus, a transfer layer is formed. Thereafter, the transfer layer is transferred and formed on a plastic film.

Moreover, in order to obtain a display having excellent display characteristics, active drive including a drive transistor for each pixel is required. A flexible display requires flexible TFT elements which can follow bending. A low-temperature polysilicon TFT or an amorphous silicon TFT as a conventional drive transistor may not obtain sufficient reliability. Thus, as a drive transistor of the flexible display, an organic TFT using a flexible organic semiconductor layer, which can follow bending, as an active layer has attracted attention.

Patent Document 2 (Japanese Patent Laid-Open Official Gazette No. 2003-255857) describes a method of manufacturing an organic EL display in the following manner. Specifically, a gate electrode, a gate insulating film, an organic semiconductor layer and source and drain electrodes are sequentially formed on a substrate. Thereafter, an organic EL element is formed on an anode connected to the drain electrode.

Moreover, Patent Document 3 (Japanese Patent Laid-Open Official Gazette No. 2003-318195) describes a method of transferring an organic TFT, which is formed of a gate electrode, a gate insulating film, an organic semiconductor layer and source and drain, from a heat-resistant substrate to a surface substrate (a plastic substrate) after a separating layer is formed on the heat-resistant substrate and the organic TFT is formed thereon.

Meanwhile, as to an organic semiconductor layer and an organic EL layer, there is a problem that performance thereof is deteriorated by photolithography and etching steps, which involve an organic solvent, water, plasma, an electron beam, heat treatment or the like, and therefore the layers hardly function.

In Patent Documents 2 and 3 described above, it is required to pattern the source and drain and the like after the organic semiconductor layer is formed. Thus, deterioration in performance of the organic semiconductor layer in the photolithography step may become a problem.

As described above, a method of manufacturing a flexible display which uses a plastic film as a substrate and includes organic TFTs has not been sufficiently established. Therefore, there has been demanded a method of stably forming, with high yield, desired organic TFTs or organic EL elements on the plastic film.

SUMMARY OF THE INVENTION

It is an object of the present invention to provide a flexible display which uses a plastic film as a substrate and includes organic TFTs, and a manufacturing method thereof. Specifically, the flexible display is manufactured with high yield without causing any trouble.

The present invention relates to a flexible display and is an active matrix flexible display in which a TFT is provided for each pixel. The flexible display includes: a plastic film; an adhesive layer formed on the plastic film; a protective layer formed on the adhesive layer; a gate electrode for the TFT, which is buried in the protective layer; a gate insulating layer for the TFT, which covers the gate electrode; source and drain electrodes for the TFT, which are formed on the gate insulating layer and disposed at predetermined intervals on the gate electrode; a pixel electrode which is formed on the gate insulating layer and is electrically connected to the drain 2 electrode; an organic active layer for the TFT, which is formed on a space between the source and drain electrodes and is electrically connected to the source and drain electrodes; an organic EL layer including an emitting layer formed on the pixel electrode of each pixel; a metal electrode formed on the organic EL layer; and a sealing layer which covers the metal electrode.

In order to obtain the flexible display of the present invention, first, a transfer layer is formed on a heat-resistant and rigid temporary substrate (a glass substrate and the like) so as to have desired film characteristics without having manufacturing conditions limited, the transfer layer being formed of a peelable layer, source and drain electrodes, a pixel electrode, a gate insulating layer, a gate electrode and a protective layer. Thereafter, the transfer layer is transferred and formed in a state of being inverted upside down on a plastic film with an adhesive layer interposed therebetween. Next, after the peelable layer is removed, an organic active layer electrically connected to the source and drain electrodes exposed to the upper side is formed on a space between the source and drain electrodes by use of mask vapor deposition, an ink jet method and the like.

Subsequently, an organic EL layer including an emitting layer is formed on a pixel electrode of each pixel by use of the mask vapor deposition, the ink jet method and the like. Furthermore, after a metal electrode is formed on the organic EL layer, the metal electrode is covered with a sealing layer.

In the present invention described above, the emitting layer may be formed of a red (R) emitting layer, a green (G) emitting layer and a blue (B) emitting layer. Alternatively, by using a white emitting layer as the emitting layer, a color filter layer buried in the adhesive layer may be formed between the adhesive layer and the protective layer. Alternatively, in the case of improving color saturation, a full-color display may be realized in such a manner that the emitting layer is formed of emitting layers of three primary colors, a color filter layer is formed between the adhesive layer and the protective layer, and the color filter layer is combined with electroluminescence of the three primary colors.

Unlike the present invention, in a structure in which a TFT including an organic active layer, a pixel electrode and an organic EL layer are formed directly on a plastic film, a photolithography step is required after the organic active layer is formed. Thus, performance of the organic active layer is deteriorated. Moreover, in the case where a low-resistance pixel electrode (ITO) is formed, high-temperature heat treatment is involved. Thus, there is a problem that the plastic film is thermally deformed.

However, in the present invention, a patterning step by photolithography which adversely affects the organic active layer and the organic EL layer (a step of forming the source electrode, the drain electrode, the pixel electrode and the gate electrode) and a step involving high-temperature heat treatment (a step of forming the pixel electrode and the like) are performed on the temporary substrate. After those electrodes are transferred onto the plastic film, the organic active layer and the organic EL layer are formed by use of the mask vapor deposition, the ink jet method and the like. Thus, there is no longer a risk that performance of the organic active layer and the organic EL layer is deteriorated by various processing in the photolithography step.

As described above, in the flexible display of the present invention, the organic active layer and the organic EL layer for the TFT are formed, with high yield, on the plastic film without causing any trouble. Thus, manufacturing costs can be reduced and reliability can be improved.

The flexible display of the present invention can also be applied to an active matrix liquid crystal display by omitting the organic EL layer and the like.

Moreover, the present invention relates to a method of manufacturing a flexible display and is a method of manufacturing an active matrix flexible display in which a TFT is provided for each pixel. The method includes the steps of: forming a peelable layer on a temporary substrate; forming source and drain electrodes for the TFT on the peelable layer, and forming a pixel electrode electrically connected to the drain electrode; forming a gate insulating layer for the TFT, which covers the source electrode, the drain electrode and the pixel electrode; forming a gate electrode for the TFT in a portion on the gate insulating layer on a space between the source and drain electrodes; forming a protective layer which covers the gate electrode; attaching a plastic film to the protective layer with an adhesive layer interposed therebetween; removing the temporary substrate from an interface with the peelable layer, and transferring onto the plastic film the peelable layer, the source electrode, the drain electrode, the pixel electrode, the gate insulating layer, the gate electrode and the protective layer; exposing upper surfaces of the source electrode, the drain electrode and the pixel electrode by removing the peelable layer; forming an organic active layer for the TFT, which is electrically connected to the source and drain electrodes, on the space between the source and drain electrodes; forming an organic EL layer including an emitting layer on the pixel electrode of each pixel before or after the organic active layer is formed; forming a metal electrode on the organic EL layer; and forming a sealing layer which covers the metal electrode.

By use of the manufacturing method of the present invention, the flexible display having the configuration described above can be easily manufactured.

In the present invention described above, the organic active layer and the organic EL layer for the TFT are formed by use of mask vapor deposition, an ink jet method or printing. In the case where the ink jet method or printing is adopted, before the organic active layer and the organic EL layer are formed, an organic insulating layer pattern is formed, which has openings provided on the space between the source and drain electrodes and on the pixel electrode. Thereafter, in a state where the organic insulating layer pattern is set to be a barrier, the organic active layer and the organic EL layer are formed while being aligned in the openings, respectively.

Moreover, the present invention relates to a flexible display and is an active matrix flexible display in which a TFT is provided for each pixel. The flexible display includes: a plastic film; an adhesive layer formed on the plastic film; a barrier insulating layer formed on the adhesive layer; a TFT which is formed on or above the barrier insulating layer and has a structure in which an organic active layer, a gate insulating layer and a gate electrode are formed sequentially from the bottom and source and drain electrodes are electrically connected to the organic active layer; a pixel electrode which is formed above the barrier insulating layer and is electrically connected to the drain electrode of the TFT; an organic EL layer including an emitting layer formed on the pixel electrode of each pixel; a metal electrode formed on the organic EL layer; and a sealing layer which covers the metal electrode.

The flexible display of the present invention is manufactured by use of a transfer technology. First, a transfer layer is formed on a heat-resistant and rigid temporary substrate (a glass substrate and the like) so as to have desired film characteristics without having manufacturing conditions limited. Specifically, the transfer layer includes a TFT, which is formed so as to have a peelable layer and an organic active layer on the top, a pixel electrode connected to a drain electrode of the TFT, and a barrier insulating layer. Thereafter, the transfer layer is transferred and formed in a state of being inverted upside down on a plastic film with an adhesive layer interposed therebetween. Subsequently, after the peelable layer is removed, an organic EL layer including an emitting layer is formed on the pixel electrode of each pixel. Furthermore, after a metal electrode is formed on the organic EL layer, the metal electrode is covered with a sealing layer.

In the present invention, a patterning step by photolithography which adversely affects the organic active layer and the organic EL layer (a step of forming the gate electrode, the source electrode and the drain electrode of the TFT and the pixel electrode) is performed on the temporary substrate before the organic active layer and the organic EL layer are formed. Furthermore, after the organic active layer connected to the source and drain electrodes is formed on the temporary substrate by use of mask vapor deposition and the like, the barrier insulating layer is formed to obtain the transfer layer. Thereafter, after the transfer layer is transferred in a state of being inverted upside down on the plastic film, the organic EL layer is formed on the pixel electrode exposed to the top by use of the mask vapor deposition and the like. By adopting the manufacturing method as described above, there is no longer a risk that characteristics of the organic active layer and the organic EL layer are deteriorated by various processing in the photolithography step.

In the flexible display of the present invention, as in the case of the invention described above, the organic active layer and the organic EL layer for the TFT are formed, with high yield, on the plastic film without causing any trouble. Thus, manufacturing costs can be reduced and reliability can be improved.

BRIEF DESCRIPTION OF THE DRAWINGS

FIGS. 6A to 6K are cross-sectional views showing a method of manufacturing a flexible display according to a third embodiment of the present invention.

FIGS. 12A to 12L are cross-sectional views showing a method of manufacturing a flexible display according to a seventh embodiment of the present invention.

DESCRIPTION OF THE PREFERRED EMBODIMENTS

With reference to the accompanying drawings, embodiments of the present invention will be described below.

First Embodiment

Figure 1A:
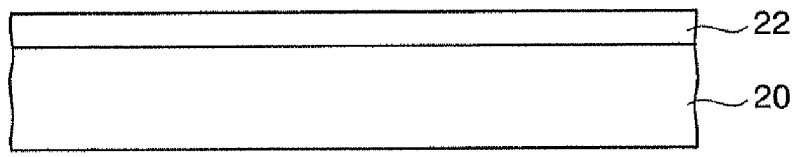
FIGS. 1A to 1M are cross-sectional views showing a method of manufacturing a flexible display according to a first embodiment of the present invention.

FIGS. 1A to 1M are cross-sectional views sequentially showing a method of manufacturing a flexible display according to a first embodiment of the present invention. FIG. 2 is a cross-sectional view showing a flexible display (an organic EL display) according to the first embodiment of the present invention. In the first embodiment, description will be given by taking the case of applying the present invention to the organic EL display as an example. In the method of manufacturing a flexible display according to the first embodiment of the present invention, as shown in FIG. 1A, first, a glass substrate 20 as a temporary substrate is prepared, and a peelable layer 22 made of a polyimide resin and the like is formed on the glass substrate 20.

Figure 1B:
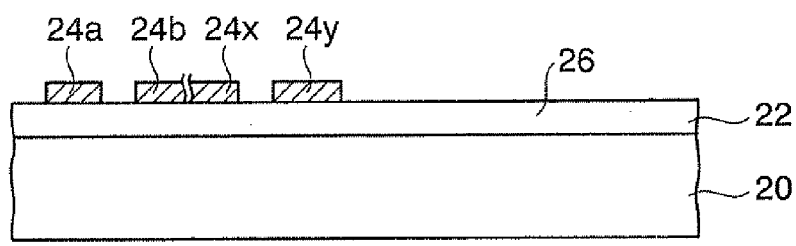
Figure 2:
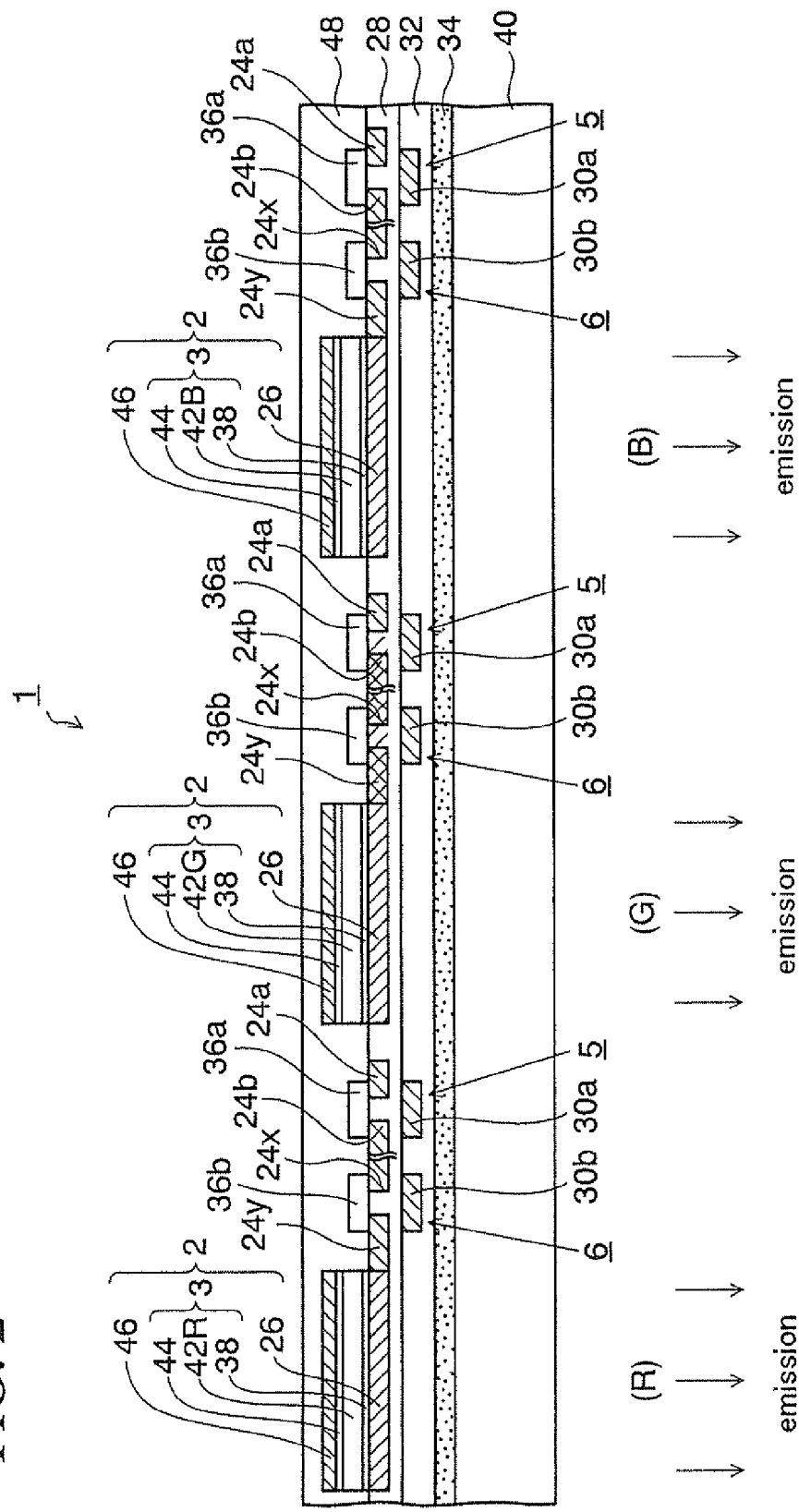
FIG. 2 is a cross-sectional view showing a flexible display (an organic EL display) of the first embodiment.

Thereafter, as shown in FIG. 1B, a conductive layer made of gold (Au) having a thickness of, for example, 100 nm or the like is formed on the peelable layer 22. Subsequently, the conductive layer is patterned by photolithography and etching. Thus, a source electrode 24a and a drain electrode 24b of a switching TFT (thin film transistor) (hereinafter referred to as a Sw-TFT) and a source electrode 24x and a drain electrode 24y of a driving TFT (hereinafter referred to as a Dr-TFT) are formed.

Figure 1C:
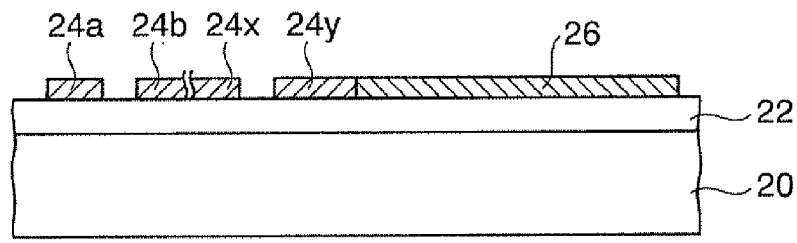

Subsequently, by use of a sputtering method, a transparent conductive layer such as an ITO (indium tin oxide) layer having a thickness of, for example, 150 nm is formed on the peelable layer 22, the source electrodes 24a and 24x and the drain electrodes 24b and 24y. Thereafter, the transparent conductive layer is patterned by photolithography and etching. Thus, as shown in FIG. 1C, a pixel electrode 26 electrically connected to the drain electrode 24y for the Dr-TFT is formed on the peelable layer 22. Note that the pixel electrode 26 may be formed so as to overlap with an end of the drain electrode 24y for the Dr-TFT. In this embodiment, the ITO layer to be the pixel electrode 26 is formed above the heat-resistant glass substrate 20. Thus, it is possible to adopt a sputtering method using a deposition temperature of about 200 Ž, and the like. Thus, the pixel electrode 26 (ITO) is formed so as to have low-resistance (a specific resistance value: $3 \times 10^{-4}$ Ω'cm or less) electrical characteristics.

Figure 1D:
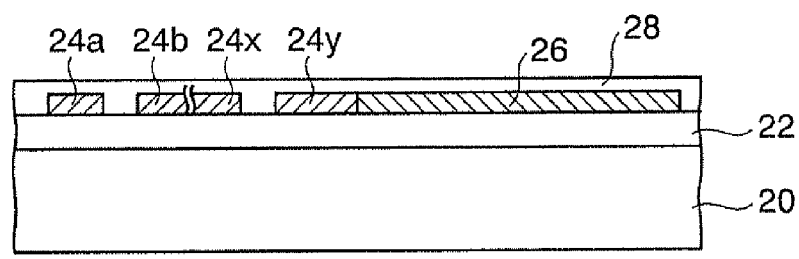

Next, as shown in FIG. 1D, gate insulating layer 28 is formed, gate insulating layer covering the source electrodes 24a and 24x, the drain electrodes 24b and 24y and the pixel electrode 26. As the gate insulating layer 28, a silicon oxide layer ($SiO_x$ layer) or a tantalum oxide layer ($Ta_2O_5$ layer) which has a thickness of, for example, 200 nm is used. The insulating layer described above is formed by use of CVD, a sputtering method or the like.

Thereafter, a conductive layer made of tantalum (Ta), aluminum (Al), ITO or the like is formed on the gate insulating layer 28 by use of vapor deposition, the sputtering method or the like. Subsequently, the conductive layer is patterned by photolithography and etching.

Figure 1E:
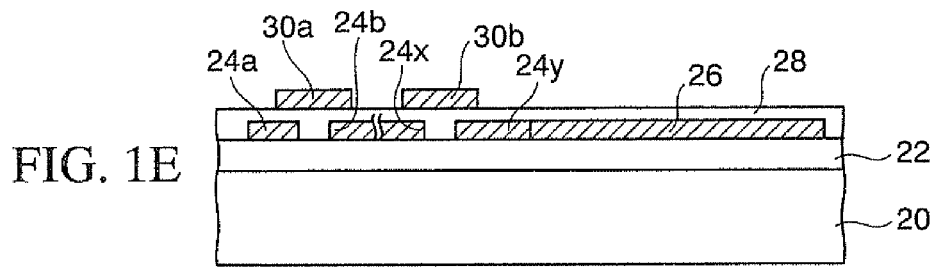

Thus, as shown in FIG. 1E, a gate electrode 30a for the Sw-TFT is formed on the gate insulating layer 28 in a portion above a space between the source and drain electrodes 24a and 24b for the Sw-TFT so as to overlap above ends thereof, respectively. Moreover, at the same time, a gate electrode 30b for the Dr-TFT is formed on the gate insulating layer 28 in a portion above a space between the source and drain electrodes 24x and 24y for the Dr-TFT so as to overlap above ends thereof, respectively.

Accordingly, on the glass substrate 20, the source electrodes 24a and 24x, the drain electrodes 24b and 24y, the pixel electrode 26, and the gate electrodes 30a and 30b are formed while being miniaturized with high accuracy in a desired pattern by photolithography.

Figure 1F:
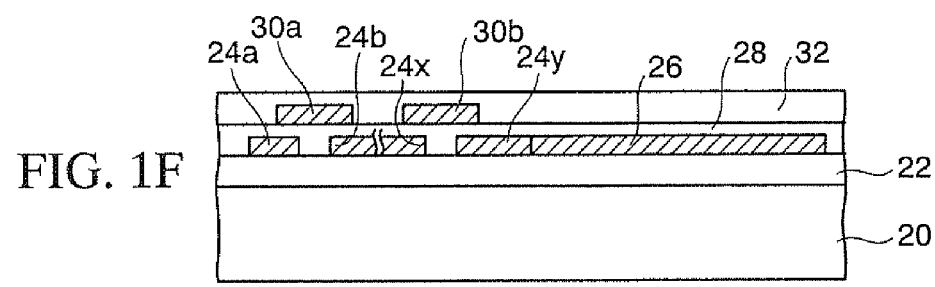

Subsequently, as shown in FIG. 1F, protective layer 32 is formed, the protective layer covering the respective gate electrodes 30a and 30b and is made of an acrylic resin and the like. Thus, steps of the gate electrodes 30a and 30b are covered with the protective layer 32 and flattened.

Figure 1G:
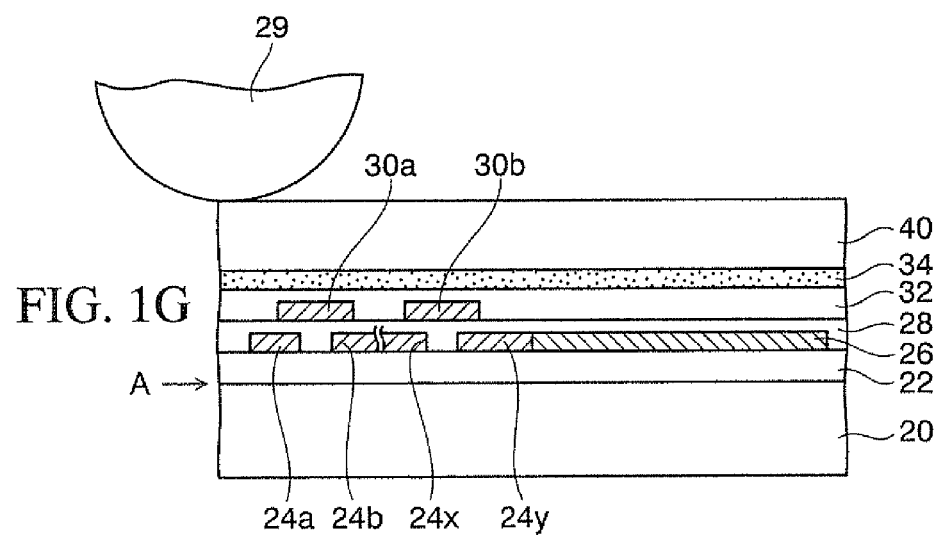

Next, as shown in FIG. 1G, a plastic film 40 is disposed on an upper surface of the structure shown in FIG. 1F with an adhesive layer 34 interposed therebetween. Furthermore, the adhesive layer 34 is hardened by heat treatment to attach the plastic film 40 to the structure shown in FIG. 1F. As the plastic film 40, a polyethersulfone film, a polycarbonate film or the like, which has a thickness of 100 to 200 fÊm, is preferably used.

Subsequently, as also shown in FIG. 1G, a roll 29 is fixed to one end of the plastic film 40, and the glass substrate 20 is peeled while the roll 29 is being rotated. In this event, the glass substrate 20 is peeled along an interface (the portion A in FIG. 1G) between the glass substrate 20 and the peelable layer 22, and is discarded.

Figure 1H:
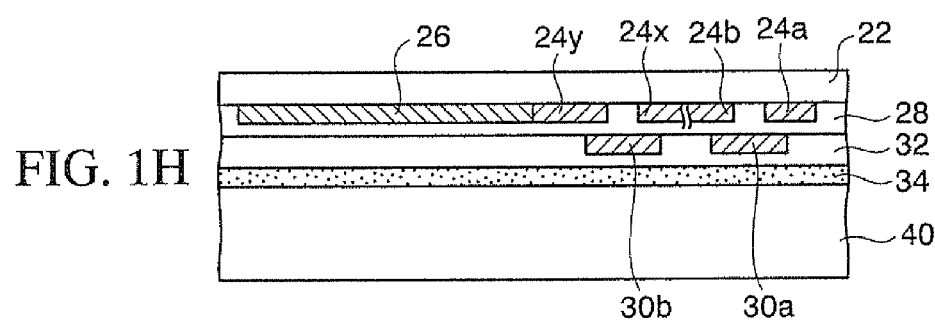

Thus, as shown in FIG. 1H, on the plastic film 40, the adhesive layer 34, the protective layer 32, the gate electrodes 30a and 30b, the gate insulating layer 28, the source electrodes 24a and 24x, the drain electrodes 24b and 24y and the pixel electrode 26, and the peelable layer 22 are transferred and formed sequentially from the bottom.

Thereafter, as shown in FIG. n, the peelable layer 22 is removed by use of oxygen gas plasma. Thus, upper surfaces of the source electrodes 24a and 24x, the drain electrodes 24b and 24y, and the pixel electrode 26 are exposed.

Figure 1I:
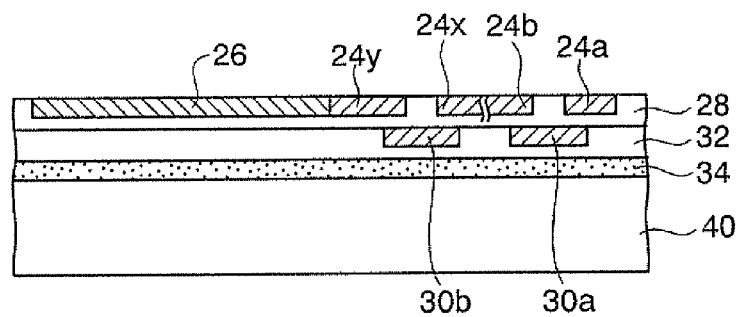
Figure 1J:
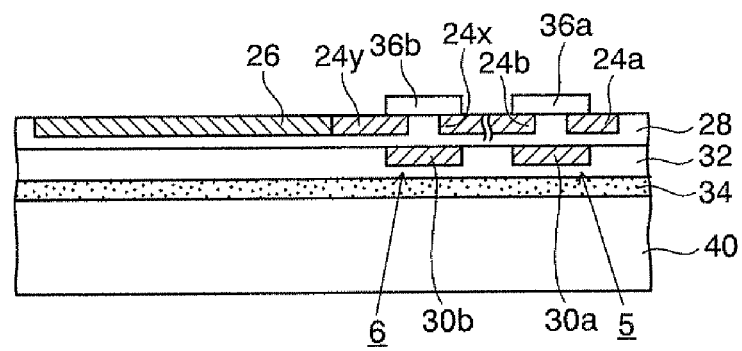

Next, as shown in FIG. 1I, an organic active layer 36a for the Sw-TFT is formed on the gate insulating layer 28 in a portion on the space between the source and drain electrodes 24a and 24b for the Sw-TFT so as to overlap with the ends thereof, respectively. In this event, simultaneously, an organic active layer 36b for the Dr-TFT is formed on the gate insulating layer 28 in a portion on the space between the source and drain electrodes 24x and 24y for the Dr-TFT so as to overlap with the ends thereof, respectively. As a material for each of the organic active layers 36a and 36b, an organic semiconductor such as pentacene, sexithiophene and polythiophene is used. The organic active layers 36a and 36b are formed by mask vapor deposition, each of which has a thickness of, for example, 50 nm. The mask vapor deposition is a method of forming a pattern simultaneously with deposition by moving a shadow mask with high accuracy in a vacuum evaporator. Therefore, without using photolithography, the patterned organic active layers 36a and 36b can be formed. Thus, there is no risk that performance of the organic active layers 36a and 36b is deteriorated by wet processing, plasma and the like in the photolithography step.

Accordingly, a Sw-TFT 5 is obtained, the Sw-TFT including the gate electrode 30a, the gate insulating layer 28, the source electrode 24a, the drain electrode 24b and the organic active layer 36a. Moreover, at the same time, a Dr-TFT 6 is obtained, the Dr-TFT including the gate electrode 30b, the gate insulating layer 28, the source electrode 24x, the drain electrode 24y and the organic active layer 36b.

As described above, in this embodiment, without having manufacturing conditions limited, the source electrodes 24a and 24x, the drain electrodes 24b and 24y, the pixel electrode 26, and the gate electrodes 30a and 30b, all of which have desired film characteristics, are patterned and formed with high accuracy on the heat•resistant glass substrate 20 by photolithography. Subsequently, after the electrodes described above are transferred onto the plastic film 40, the organic active layers 36a and 36b are formed. Therefore, there is no longer a risk that the performance of the organic active layers 36a and 36b is deteriorated in the photolithography step for forming the pixel electrode 26 and the like.

Figure 1K:
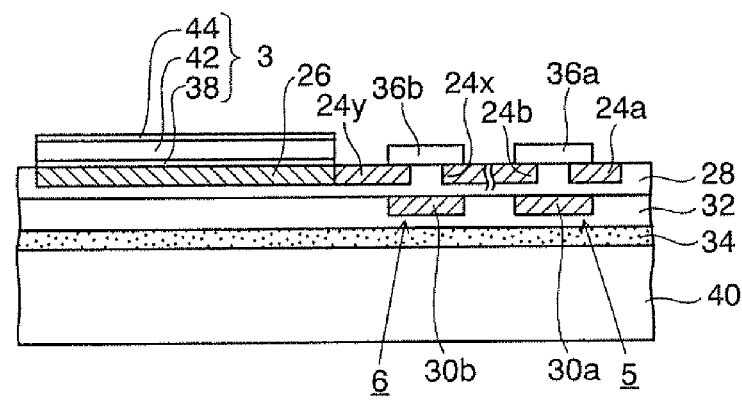

Subsequently, as shown in FIG. 1K, a hole transport layer 38 having a thickness of, for example, 30 nm is selectively formed on the pixel electrode 26 by mask vapor deposition. As the hole transport layer 38, $F_¿$-NPD that is an aromatic tertiary amine derivative or the like is suitably used.

Furthermore, as also shown in FIG. 1K, a low-molecular-weight emitting layer 42 having a thickness of, for example, 70 nm is selectively formed on the hole transport layer 38 by mask vapor deposition. In this embodiment, description is given of the case where a full-color display is realized by separately forming emitting layers of three primary colors, as an example. Thus, as described later with reference to FIG. 2, a red emitting layer, a green emitting layer and a blue emitting layer are formed, respectively, on the hole transport layer 38 in respective pixel parts of three primary colors (red (R), green (G) and blue (B)) The pixel parts (subpixels) of the three primary colors form a pixel that is a display unit.

As the low-molecular-weight emitting layer 42, one obtained by mixing a doping material with a host material is used. The doping material (molecules) emits light. As the host material, there are, for example, Alq3 and a distyryl arylene derivative (DPVBi). As the doping material, there are, for example, coumarin 6 which emits green light, DCJTB which emits red light, and the like.

Subsequently, as also shown in FIG. 1K, an electron transport layer 44 is formed on the emitting layer 42 by mask vapor deposition. As the electron transport layer 44, a quinolinol aluminum complex (Alq3) or the like is suitably used.

Thus, an organic EL layer 3 is obtained, the organic EL layer including the hole transport layer 38, the emitting layer 42 and the electron transport layer 44.

Note that only one of the hole transport layer 38 and the electron transport layer 44 may be formed or both of the hole transport layer 38 and the electron transport layer 44 may be omitted.

Moreover, the organic EL layer 3 may be first formed after the peelable layer 22 is removed (FIG. 1I), and, thereafter, the organic active layers 36a and 36b for the TFT may be formed.

Figure 1L:
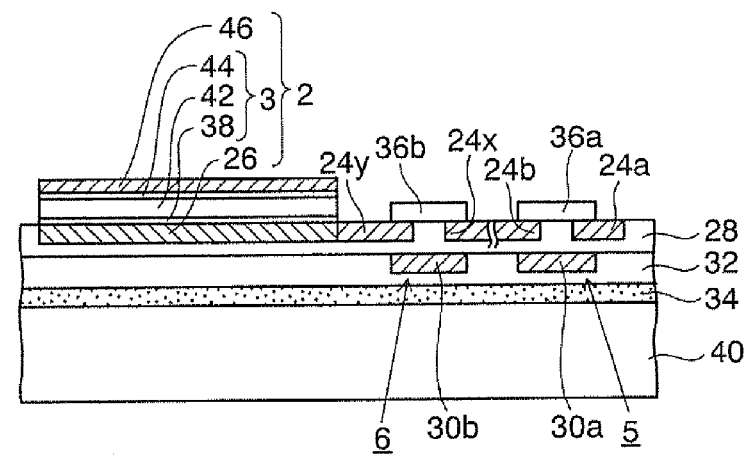

Furthermore, as shown in FIG. 1L, a metal electrode 46 is selectively formed on the electron transport layer 44 by mask vapor deposition. As the metal electrode 46, a lithium fluoride/aluminum (LiF/Al) laminated film or the like is suitably used. A thickness of a LiF layer is set to 0.2 to 1 nm, and a thickness of an Al layer is set to 100 to 200 nm.

Note that, in the case where the respective organic active layers 36a and 36b are selectively covered with an insulating layer by mask vapor deposition, printing or the like, the metal electrode 46 may be formed on the entire upper surface of the structure shown in FIG. 1K.

Thus, an organic EL element 2 is obtained, the organic EL element including the pixel electrode 26, the organic EL layer 3 and the metal electrode 46.

As described above, in this embodiment, photolithography is not used in the step of forming the organic active layers 36a and 36b and the organic EL layer 3 and the subsequent steps. Thus, there is no longer a risk that performance of the organic active layers 36a and 36b and the organic EL layer 3 is deteriorated by various processing in the photolithography step.

Figure 1M:
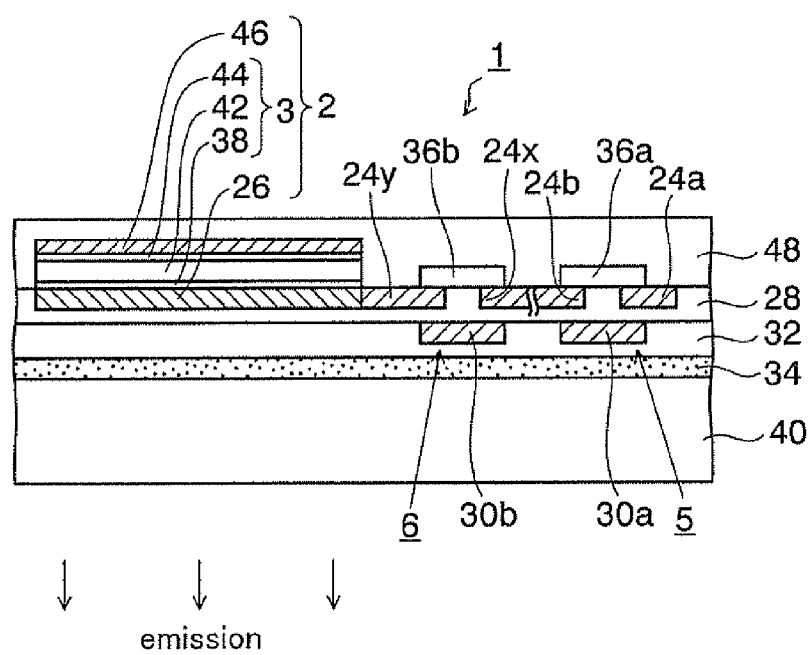

Thereafter, as shown in FIG. 1M, a sealing layer 48 is formed, which covers the organic EL element 2, the Sw-TFT 5 and the Dr-TFT 6. As the sealing layer 48, a silicon oxide layer (SiOx), a silicon nitride layer (SiNx) or the like is used. The sealing layer 48 is formed by low-temperature CVD at a deposition temperature of about 100 Ž, for example. Alternatively, the sealing layer 48 may be formed by attaching a resin film having a moisture' proof layer formed therein.

Accordingly, a flexible organic EL display 1 according to the first embodiment of the present invention is completed.

As described above, in the method of manufacturing a flexible display according to the first embodiment, first, a transfer layer is formed with high accuracy on the heat-resistant glass substrate 20 without having manufacturing conditions limited. Specifically, the transfer layer includes the peelable layer 22, the source electrodes 24a and 24x, the drain electrodes 24b and 24y, the pixel electrode 26, the gate insulating layer 28, the gate electrodes 30a and 30b, and the protective layer 32. Thereafter, the transfer layer is transferred and formed in a state of being inverted upside down on the plastic film 40 with the adhesive layer 34 interposed therebetween. Next, after the peelable layer 22 is removed, the organic active layers 36a and 36b for the TFTs are formed by the mask vapor deposition on the spaces between the source electrodes 24a and 24x and the drain electrodes 24b and 24y.

Furthermore, the hole transport layer 38, the three-primary-color emitting layer 42 and the electron transport layer 44 are sequentially formed on the pixel electrode 26 by the mask vapor deposition to obtain the organic EL layer 3. Subsequently, after the metal electrode 46 is formed on the organic EL layer 3, the metal electrode 46 and the organic EL layer 3 are covered with the sealing layer 48.

In this embodiment, a patterning step (the step of forming the source electrodes 24a and 24x, the drain electrodes 24b and 24y, the pixel electrode 26, and the gate electrodes 30a and 30b) by photolithography which adversely affects the organic active layers 36a and 36b and the emitting layer 42 is performed on the glass substrate 20. Subsequently, after the electrodes described above are transferred onto the plastic film 40, the organic active layers 36a and 36b and the emitting layer 42 are formed by the mask vapor deposition. Therefore, there is no longer a risk that the characteristics of the organic active layers 36a and 36b and the emitting layer 42 are deteriorated by various processing in the photolithography step.

As described above, in this embodiment, it is made possible to stably manufacture, with high yield, an organic EL display which uses a plastic film as a substrate and includes organic TFTs.

FIG. 2 shows pixel parts of three primary colors (a red pixel part (R), a green pixel part (G) and a blue pixel part (B)) in the flexible display of the first embodiment. As shown in FIG. 2, in the flexible organic EL display 1 of the first embodiment, the plastic film 40 is used as a substrate, and the protective film 32 is formed thereon with the adhesive layer 34 interposed therebetween. In the protective film 32 in the respective pixel parts (R), (G) and (B) of the three primary colors, the gate electrodes 30a of the Sw-TFTs 5 and the gate electrodes 30b of the Dr-TFTs 6 are buried, respectively. On the respective gate electrodes 30a and 30b, the gate insulating layer 28 is formed.

Furthermore, on the gate insulating layer 28 in the respective pixel parts (R), (G) and (B) of the three primary colors, the source and drain electrodes 24a and 24b for the SW-TFTs 5, the source and drain electrodes 24x and 24y for the Dr-TFTs 6, and, the pixel electrodes 26 electrically connected to the drain electrodes 24y for the Dr-TFTs 6 are formed, respectively.

Moreover, on the respective pixel electrodes 26 in the respective pixel parts (R), (G) and (B) of the three primary colors, the organic EL layers 3 formed of the hole transport layers 38, emitting layers 42R, 42G and 42B, and the electron transport layers 44 are formed, respectively. The red emitting layer 42R, the green emitting layer 42G and the blue emitting layer 42B are provided so as to correspond to the respective pixel parts (R), (G) and (B) of the three primary colors.

Furthermore, the metal electrodes 46 are formed, respectively, on the organic EL layers S in the respective pixel parts (R), (G) and (B) of the three primary colors. In the respective pixel parts (R), (G) and (B), the organic EL elements 2 formed of the pixel electrodes 26, the organic EL layers S and the metal electrodes 46 are provided, respectively. On the organic EL elements 2, the Dr-TFTs 6 and the Sw-TFTs 5, the sealing layer 48 which covers the elements and the TFTs is formed.

Figure 3:
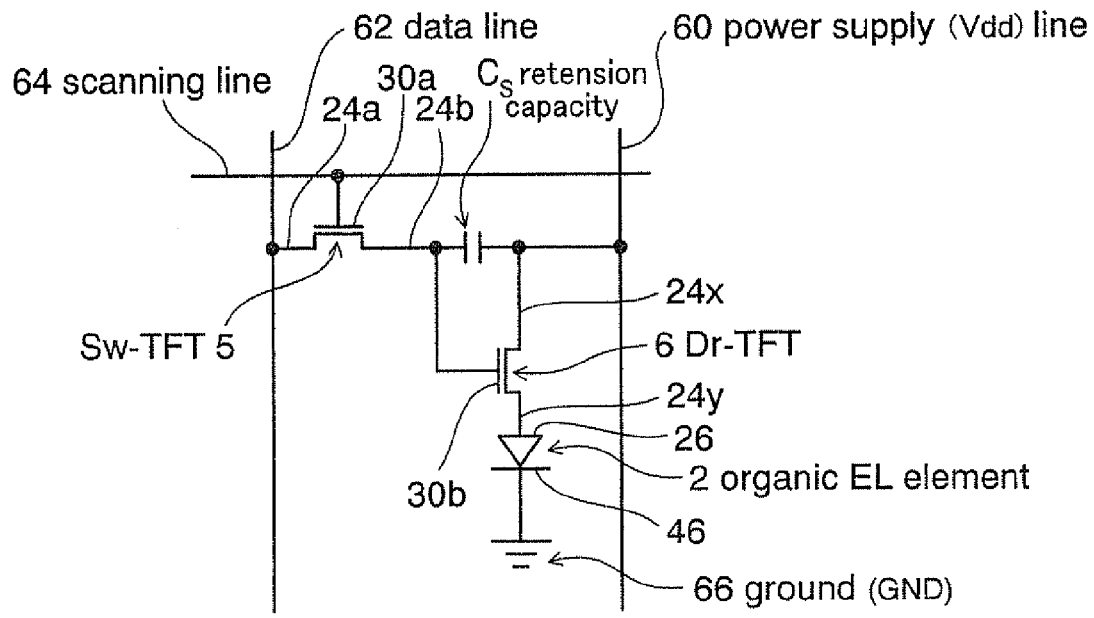
FIG. 3 is a view showing an equivalent circuit in one pixel part of the flexible display according to the first embodiment of the present invention.
Figure 4:
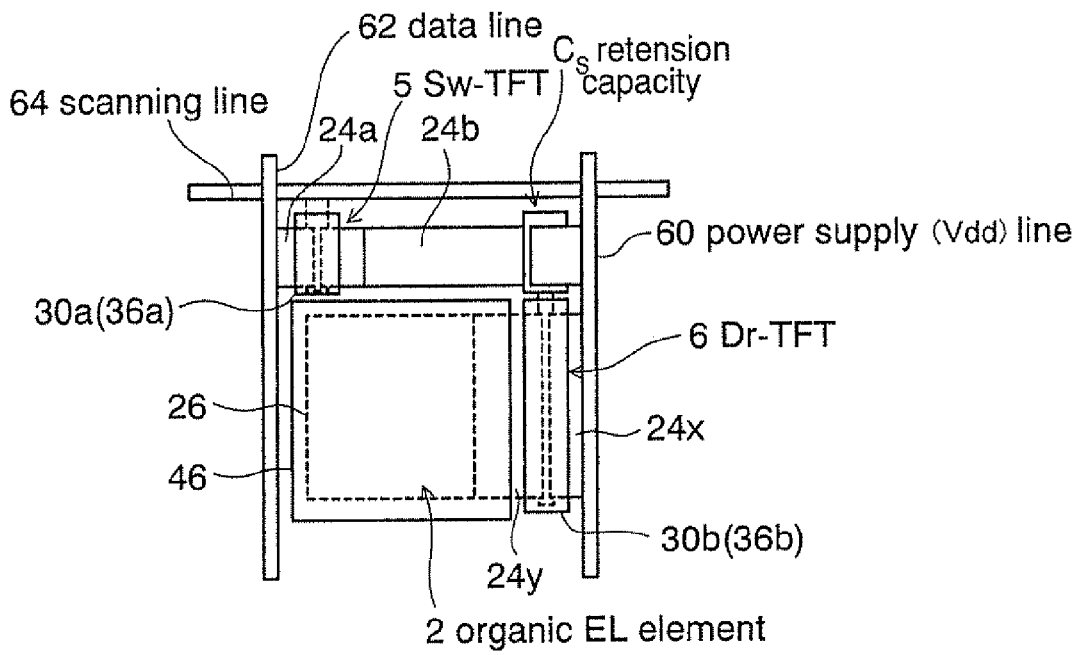
FIG. 4 is a plan view of one pixel part of the flexible display according to the first embodiment of the present invention.

FIG. 3 is a view showing an equivalent circuit in one pixel part of the flexible display according to the first embodiment of the present invention. FIG. 4 is a plan view of one pixel part of the flexible display according to the first embodiment of the present invention.

As shown in FIGS. 3 and 4, in the flexible organic EL display 1 of the first embodiment, the metal electrode 46 (cathode) of the organic EL element 2 is connected to a ground (GND) 66, and the pixel electrode 26 (anode) of the organic EL element 2 is connected to the drain electrode 24y of the Dr-TFT 6. The source electrode 24x of the Dr-TFT 6 is connected to a power supply (Vdd) line 60. In addition, a retention capacity Cs is formed between the gate electrode 30b of the Dr-TFT 6 and the power supply (Vdd) line 60. Moreover, the drain electrode 24b of the Sw-TFT 5 is connected to the gate electrode 30b of the Dr-TFT 6, and the source electrode 24a of the Sw-TFT 5 is connected to a data line 62. Furthermore, the gate electrode 30a of the Sw-TFT 5 is connected to a scan line 64.

The following operations are performed in the equivalent circuit shown in FIG. 3. First, when a potential of the scan line 64 is set in a selected state and a write potential is applied to the scan line 64, the SW-TFT 5 is connected and the retention capacity Cs is charged or discharged. Thus, a gate potential of the Dr-TFT 6 is set to be the write potential Next, when the potential of the scan line 64 is set in a nonselected state, the scan line 64 and the Dr-TFT 6 are electrically disconnected from each other. However, the gate potential of the Dr-TFT 6 is stably retained by the retention capacity Cs.

Meanwhile, a current flowing through the Dr-TFT 6 and the organic EL element 2 is set to have a value corresponding to a value of a gate-source voltage of the Dr-TFT 6. Thus, the organic EL element 2 continues to emit light with luminance corresponding to the current value.

A plurality of pixels having the configuration as described above are arranged in a matrix manner, and write is repeated through the data lines 62 while the scan lines 64 is being sequentially selected. Thus, an active matrix organic EL display can be composed. Consequently, lights of predetermined colors are emitted to the outside from the respective emitting layers 42R, 42G and 42B in the respective pixel parts (R), (G) and (B). Thus, a color image is obtained (the direction indicated by the arrows in FIG. 2).

Note that, as a problem of the organic TFT, there is a variation in characteristics of the organic TFT. Particularly, if there is a variation in a threshold voltage (Vth) of the Dr-TFT 6, there occurs a variation in illuminance within a screen of a display. Thus, there have been taken measures to compensate for the variation in the threshold voltage (Vth) of the Dr-TFT 6 by providing a compensation circuit in the equivalent circuit shown in FIG. 3. As such a compensation circuit, there are a current program system and a voltage program system, in which two transistors are added (Reference: 2003 FPD Technology Outlook, Electronic Journal Publishing (2003)).

There has been developed a method of adding a compensation circuit to a circuit using a low-temperature polysilicon TFT or an amorphous silicon TFT. However, similar effects can also be obtained by adding a compensation circuit to a circuit using an organic TFT as in the case of this embodiment.

Note that, in the first embodiment described above, as in the case of a second embodiment to be described next, more color filter layers buried in the adhesive layer 34 may be provided by attaching the plastic film 40 by use of the adhesive layer 34 after color filter layers are formed on the protective layer 32. In this case, a full-color display is realized by combination of the color filter layers and the light emission of red (R), green (G) and blue (B). Thus, color saturation can be improved.

Second Embodiment

Figure 5:
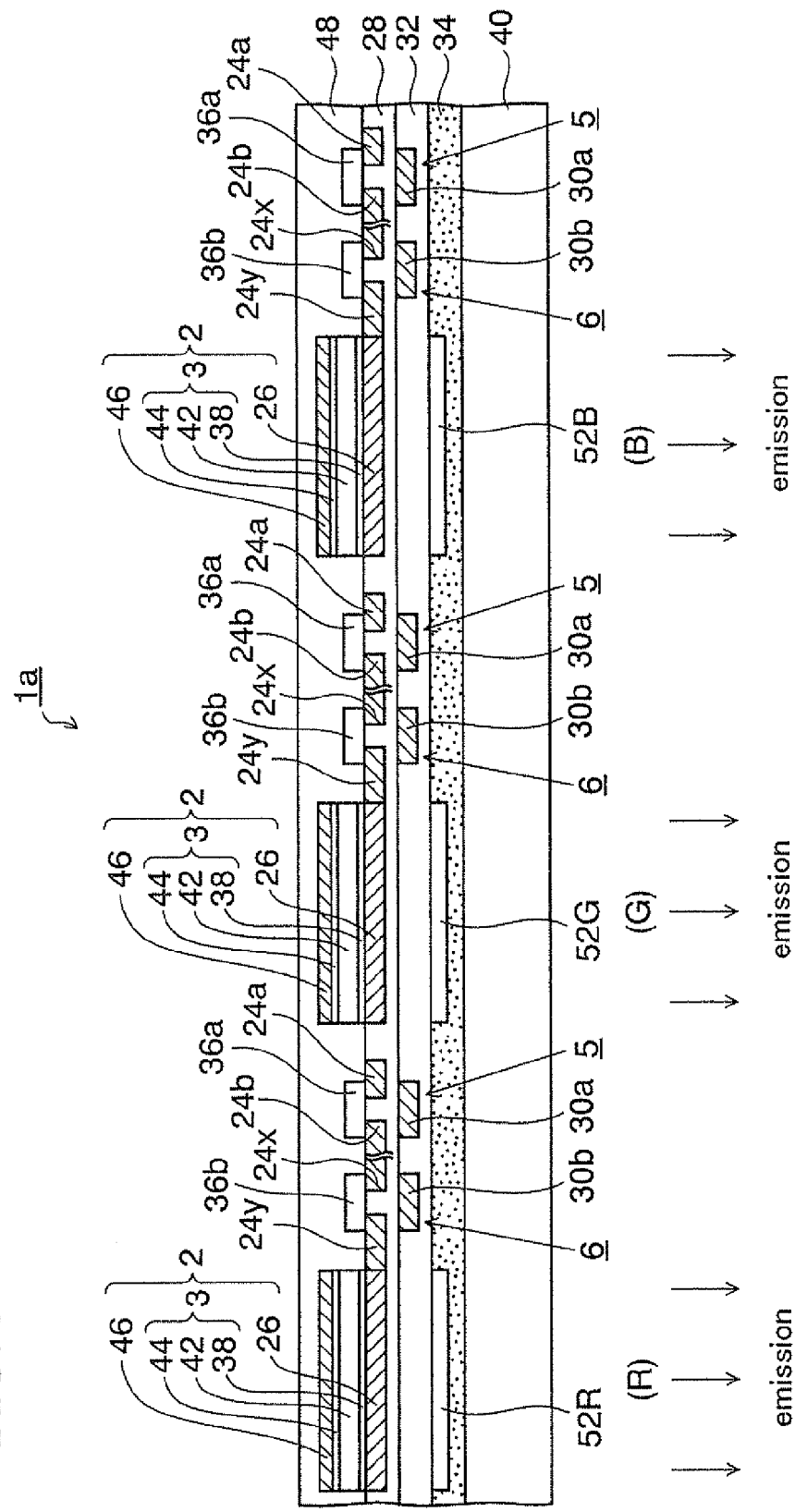
FIG. 5 is a cross-sectional view showing a flexible display (an organic EL display) according to a second embodiment of the present invention.

FIG. 5 is a cross-sectional view showing a flexible display (an organic EL display) according to a second embodiment of the present invention. In the second embodiment, a full-color display is realized by using a white emitting layer as an emitting layer in an organic EL layer and combining color filter layers. In FIG. 5, the same components as those of the first embodiment shown in FIG. 2 are denoted by the same reference numerals, and description thereof will be omitted.

As shown in FIG. 5, a flexible organic EL display 1a of the second embodiment is formed by replacing all the red, green and blue layers 42R, 42G and 42B in the first embodiment shown in FIG. 2 with white emitting layers 42. Moreover, between a protective layer 32 and an adhesive layer 34, color filter layers 52R, 52G and 52B are formed in a state of being buried in the adhesive layer 34. The color filter layers include a red color filter layer 52R formed in a red pixel part (R), a green color filter layer 52G 14 formed in a green pixel part (G), and a blue color filter layer 52B formed in a blue pixel part (B). In the second embodiment, white light is emitted from the white emitting layers 42 in the respective pixel parts (R), (G) and (B). Thereafter, the white light passes through the color filter layers 52R, 52G and 52B of the three primary colors. Thus, a color image is obtained (the direction indicated by the arrows in FIG. 5).

In a method of manufacturing a flexible display according to the second embodiment, the color filter layers 52R, 52G and 52B are formed on the protective layer 32 after the step of FIG. 1F in the first embodiment. Specifically, on the protective layer 32 above respective pixel electrodes 26 corresponding to the pixel parts (R), (G) and (B) of the three primary colors, the red color filter layer 52R, the green color filter layer 52G and the blue color filter layer 52B are sequentially formed. The respective color filter layers 52R, 52G and 52B are formed by patterning photosensitive coating films of a pigment dispersion type, for example, by photolithography. Thereafter, a plastic film 40 is attached to the color filter layers 52R, 52G and 52B with the adhesive layer 34 interposed therebetween. Subsequently, as in the case of the first embodiment, a transfer layer is transferred and formed on the plastic film 40.

Thereafter, by use of a method similar to that of the first embodiment, a sealing layer 48 is formed after organic active layers 36a and 36b and organic EL elements 2 are formed.

The flexible organic EL display 1a of the second embodiment achieves the same effects as those of the first embodiment.

Third Embodiment

FIGS. 6A to 6K are cross-sectional views sequentially showing a method of manufacturing a flexible display according to a third embodiment of the present invention. In the first embodiment, the organic active layers and the organic EL layers for the TFTs are formed by the mask vapor deposition. Meanwhile, in the third embodiment, organic active layers and organic EL layers for TFTs are formed by an ink jet method or printing. In the third embodiment, detailed description of the same steps as those of the first embodiment will be omitted.

Figure 6A:
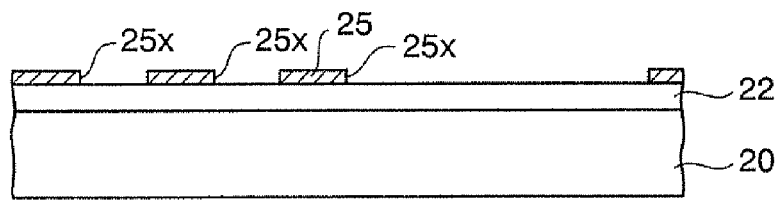

First, as shown in FIG. 6A, after a peelable layer 22 is formed on a glass substrate 20 as in the case of the first embodiment, a mask metal layer 25 having openings 25x provided in required portions is patterned on the peelable layer 22. As a material of the mask metal layer 25, aluminum (Al), silver (Ag) or the like is used. The openings 25x of the mask metal layer 25 are provided in portions corresponding to regions where organic active layers and a pixel electrode (an emitting layer) for TFTs to be formed later are formed.

Figure 6B:
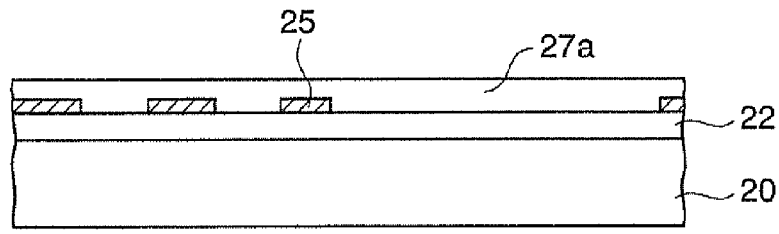

Next, as shown in FIG. 6B, after a coating film such as a polyimide resin is formed on the peelable layer 22 and the mask metal layer 25 by use of a spin coating method, printing or the like, the coating film is hardened by heat treatment at a temperature of 200 to 300 Ê. Thus, an organic insulating layer 27a having a thickness of, for example, 2 to 5 fÊm is obtained. As the organic insulating layer 27a, besides the polyimide resin, used is, material which can be etched by plasma of gas consisting mainly of oxygen gas, such as a PMMA (polymethyl methacrylate) resin and an acrylic resin. In this embodiment, formation of the organic insulating layer 27a, which involves heat treatment, is performed on the glass substrate 20. Thus, a plastic film to be a substrate at the end is never thermally deformed.

Figure 6C:
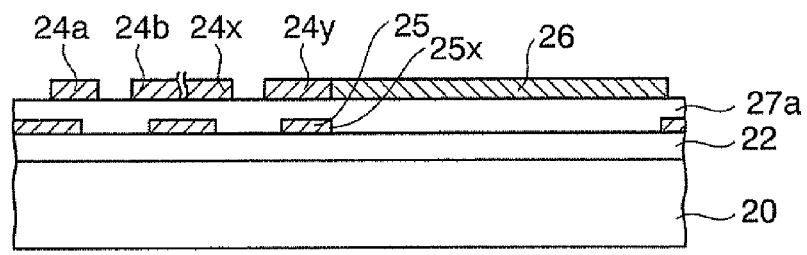

Subsequently, as shown in FIG. 6C, by use of a method similar to that of the first embodiment, source and drain electrodes 24a and 24b for a SW-TFT and source and drain electrodes 24x and 24y for a Dr-TFT are formed on the organic insulating layer 27a. Thereafter, a pixel electrode 26 is formed, which is electrically connected to the drain electrode 24y for the Dr-TFT.

Figure 6D:
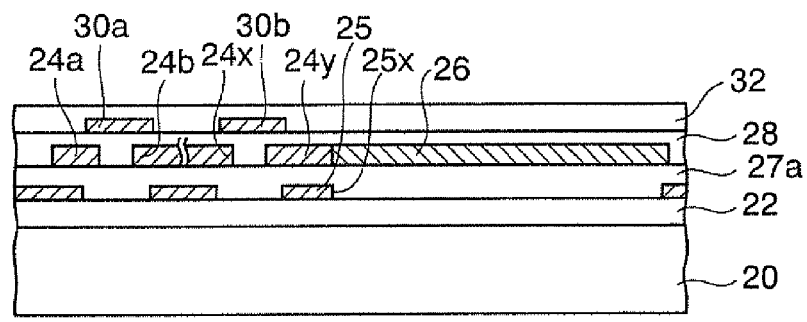

Furthermore, as shown in FIG. 6D, by use of a method similar to that of the first embodiment, a gate insulating layer 28 is formed, the gate insulating layer covering the source electrodes 24a and 24x, the drain electrodes 24b and 24y, and the pixel electrode 26. Thereafter, a gate electrode 30a for the SW-TFT and a gate electrode 30b for the Dr-TFT are formed on the gate insulating layer 28. Furthermore, a protective layer 32 which covers the gate electrodes 30a and 30b is formed.

Figure 6E:
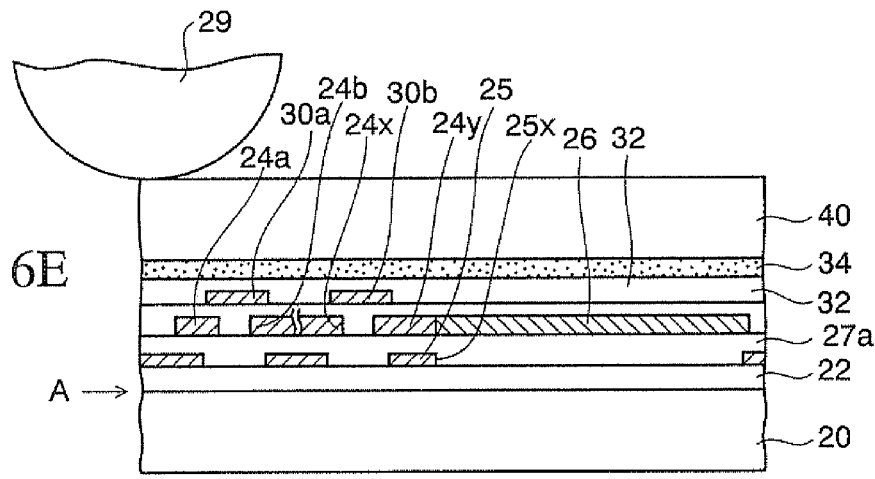

Next, as shown in FIG. 6E, by use of a method similar to that of the first embodiment, a plastic film 40 is attached to an upper surface of the structure shown in FIG. 6D with the adhesive layer 34 interposed therebetween. Thereafter, the glass substrate 20 is peeled while a roll 29 fixed to one end of the plastic film 40 is being rotated. In this event, the glass substrate 20 is peeled along an interface (the portion A in FIG. 6E) between the glass substrate 20 and the peelable layer 22, and is discarded.

Figure 6F:
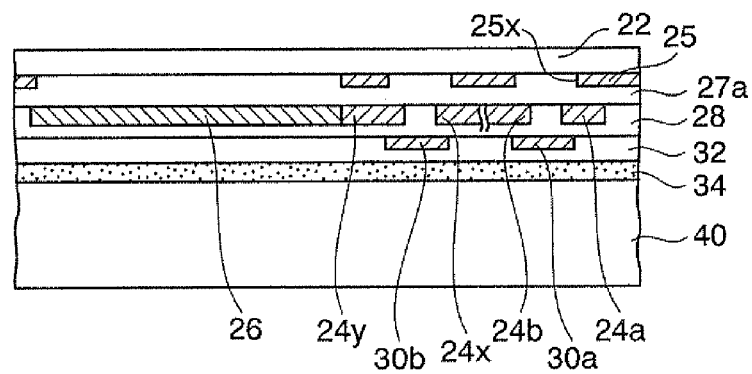

Thus, as shown in FIG. 6F, on the plastic film 40, the adhesive layer 34, the protective layer 32, the gate electrodes 30a and 30b, the gate insulating layer 28, the source electrodes 24a and 24x, the drain electrodes 24b and 24y, the pixel electrode 26, the organic insulating layer 27a, the mask metal layer 25 and the peelable layer 22 are transferred and formed sequentially from the bottom.

Figure 6G:
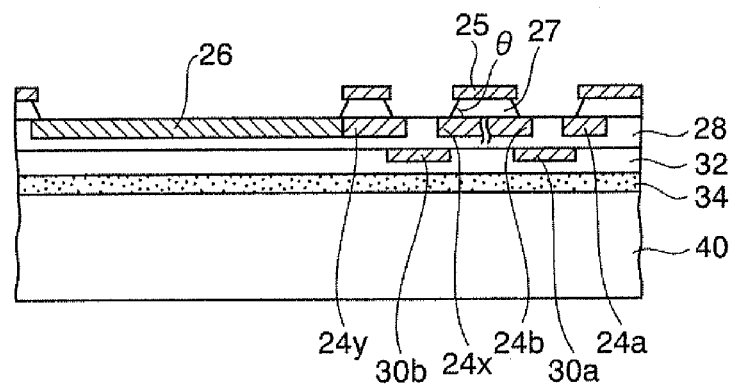

Thereafter, as shown in FIG. 6G, the peelable layer 22 is removed by use of oxygen gas plasma, and the organic insulating layer 27a is etched by using the exposed mask metal layer 25 as a mask and using the oxygen gas plasma. Thus, an organic insulating layer pattern 27 is obtained. By using oxygen gas plasma in an isotropic etching device, the organic insulating 16 layer 27a (the polyimide resin or the PMMA resin) is isotropically etched from the mask metal layer 25. Thus, the organic insulating layer pattern 27 having a forward tapered shape (a shape which gets gradually wider toward its bottom) is obtained. In this embodiment, it is possible to obtain the organic insulating layer pattern 27 having a forward tapered shape with a tapered angle f1E (FIG. 6G) of 60° or less (preferably 60° to)30°).

Note that, in the case where the acrylic resin is used as the organic insulating layer 27a, the layer is etched by use of plasma of mixed gas obtained by adding gas containing fluorine atoms such as $CF_4$ to oxygen gas by 2 to 5%.

Figure 6H:
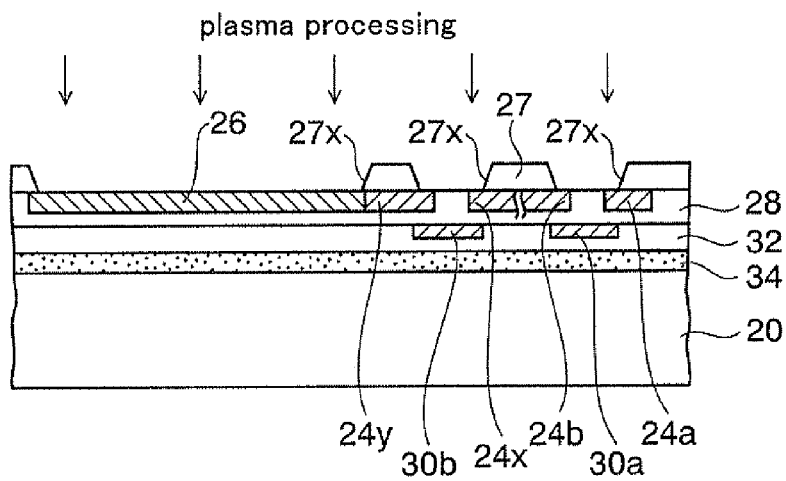

Subsequently, as shown in FIG. 6H, the mask metal layer 25 is selectively removed with respect to the underlying layer. For example, in the case where an Al layer is used as the mask metal layer 25, wet etching using a solution containing phosphoric acid is adopted. Thus, the mask metal layer 25 is removed without damaging the pixel electrode 26, the source electrodes 24a and 24x, the drain electrodes 24b and 24y, and the like.

Thus, the organic insulating layer pattern 27 having the forward tapered shape is exposed and formed in a state where openings 27x are provided on the pixel electrode 26 and on spaces between the source electrodes 24a and 24x and the drain electrodes 24b and 24y, respectively.

Thereafter, the upper surface of the structure shown in FIG. 6H is exposed to plasma of gas containing fluorine atoms ($CF_4$, $SF_6$, $CHF_3$ or the like). Thus, adhesion of the fluorine atoms to upper surfaces and sides of the organic insulating layer pattern 27 allows the pattern to have water repellency for repelling liquids. At the same time, the exposed surface of the pixel electrode 26 becomes hydrophilic.

Figure 6I:
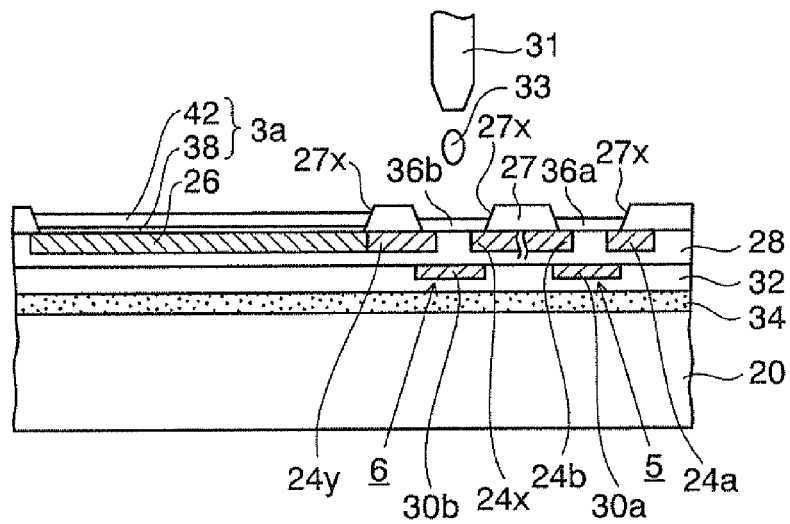

Next, as shown in FIG. 6I, a coating liquid 33 for forming organic active layers of TFTs is applied from a nozzle 31 of an ink jet apparatus (not shown) into the openings 27x of the organic insulating layer pattern 27 on the spaces between the source electrodes 24a and 24x and the drain electrodes 24b and 24y. Thus, coating films are formed. Furthermore, the coating films are baked at a temperature of 100 to 200 Ž to be dried. Thus, an organic active layer 36a for the Sw-TFT and an organic active layer 36b for the Dr-TFT are formed. As the coating liquid 33 for forming the organic active layers 36a and 36b, one containing an organic semiconductor material such as pentacene, sexithiophene and poly thiophene, which are described in the first embodiment, is used. In this event, since the surface of the organic insulating layer pattern 27 is set to be water-repellent, even if the nozzle 31 of the ink jet apparatus is slightly shifted from the openings 27x of the organic insulating layer pattern 27, the coating liquid 33 flows toward the openings 27x to be accumulated therein. Thus, a Sw-TFT 5 and a Dr-TFT 6 are obtained, both of which have the similar structures as those of the first embodiment.

Subsequently, as also shown in FIG. 6I, by use of the same ink jet method, a coating liquid (not shown) of a thiophene-based conductive polymer (PEDOT/PSS) is applied to the opening 27x of the organic insulating layer pattern 27 on the pixel electrode 26. Thereafter, the coating liquid is baked at a temperature of 100 to 200 Ê to be dried. Thus, a hole transport layer 38 is formed.

Furthermore, as also shown in FIG. 6I, by use of the same ink jet method, a coating liquid for forming an emitting layer is applied to the hole transport layer 38 in the opening 27x of the organic insulating layer pattern 27. Thereafter, the coating liquid is baked at a temperature of 100 to 200 Ž to be dried. Thus, an emitting layer 42 is formed. Although FIG. 6I shows only one pixel part, as in the case of the first embodiment, a red emitting layer, a green emitting layer and a blue emitting layer are formed, respectively, on the hole transport layers 38 in the respective pixel parts (R), (G) and (B) of the three primary colors.

As a material of the emitting layers for forming the emitting layers of the three primary colors, there are a fI-conjugated polymer emitting material and a pigment-containing polymer emitting material. To be more specific, as the fI-conjugated polymer emitting material, there are polyfluorene (PF) dielectrics (red, green and blue), poly-spiro dielectrics (red, green and blue), polyparaphenylene dielectrics, polythiophene dielectrics, and the like.

Meanwhile, as the pigment-containing polymer emitting material, there are a pigment dispersion PVK (red, green and blue) that is an emitting material obtained by dispersing a phosphorescent or fluorescent low-molecular-weight pigment in polyvinylcarbazole (PVK); and a side-chain integration PVK (red, green and blue) that is a phosphorescent polymer in which a phosphorescent base such as $Ir(ppy)_3$ is integrated with a side chain of PVK.

The materials described above are dissolved in a solvent such as xylene, toluene, chloroform, anisole, tetradecane, dichloroethane, chlorobenzene, benzene and dichlorobenzene. Thereafter, coating liquids (ink) for forming the emitting layers of the respective colors are prepared.

As described above, an organic EL layer 3a is obtained, the organic EL layer including the hole transport layer 38 and the emitting layer 42. Note that, as in the case of the first embodiment, an electron transport layer may be further formed on the emitting layer 42 or only one of the hole transport layer 38 and the electron transport layer may be formed. Alternatively, both of the hole transport layer 38 and the electron transport layer may be omitted.

In the third embodiment, the organic active layers 36a and 36b and the organic EL layer 3a for the TFTs are formed by use of the ink jet method. Thus, as in the case of the first embodiment, there is no risk that performance of the organic active layers 36a and 36b and the organic EL layer 3a is deteriorated by various processing in the photolithography step.

Moreover, when the hole transport layer 38 and the emitting layer 42 are formed by use of the ink jet method, since the surface of the organic insulating layer pattern 27 is set to be water-repellent, the hole transport layer 38 and the emitting layer 42 are formed so as to be aligned in the opening 27x of the organic insulating layer pattern 27.

Note that the organic EL layer 3a may be formed first before the organic active layers 36a and 36b are formed. Moreover, the organic active layers 36a and 36b and the organic EL layer 3a may be formed by screen printing instead of the ink jet method.

Figure 6J:
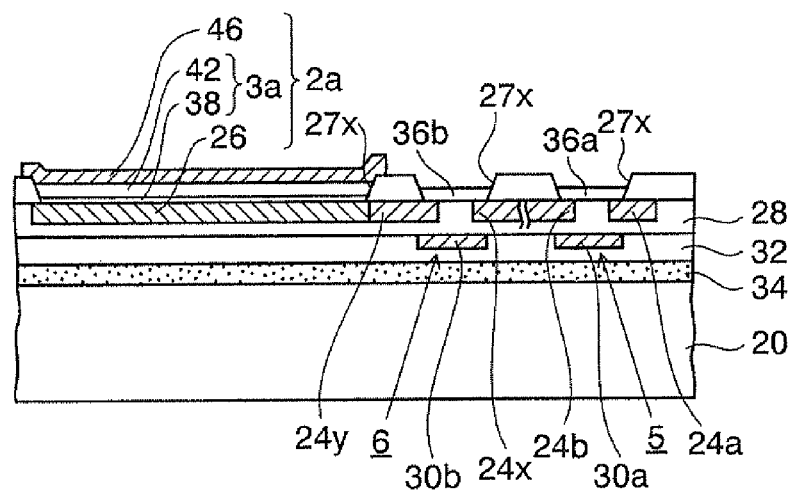

Next, as shown in FIG. 6J, a metal electrode 46, such as a calcium/aluminum (Ca/Al) laminated film, a barium (Ba) film and a barium/aluminum (Ba/A!) laminated film, is formed on the emitting layer 42 by mask vapor deposition.

Thus, an organic EL element 2a is obtained, the organic EL element including the pixel electrode 26, the organic EL layer 3a and the metal electrode 46.

Thereafter, as shown in FIG. 6K, a sealing layer 48 which covers the organic EL element 2a, the SW-TFT 5 and the Dr-TFT 6 is formed, as in the case of the first embodiment.

Thus, a flexible organic EL display 1b of the third embodiment is completed.

As shown in FIG. 6K, in the flexible organic EL display 1b of the third embodiment, the plastic film 40 is used as a substrate, and the protective film 32 is formed thereon with the adhesive layer 34 interposed therebetween. In the protective film 32, the gate electrode 30a of the Sw-TFT 5 and the gate electrode 30b of the Dr-TFT 6 are buried. On the gate electrodes 30a and 30b, the gate insulating layer 28 is formed.

Moreover, on the gate insulating layer 28, the source and drain electrodes 24a and 24b for the SW-TFT 5, the source and drain electrodes 24x and 24y for the Dr-TFT 6, and the pixel electrode 26 electrically connected to the drain electrode 24y for the Dr-TFT 6 are formed.

Furthermore, the organic insulating layer pattern 27 is formed, which has the openings 27x provided on the pixel electrode 26 and on the spaces between the source electrodes 24a and 24x and the drain electrodes 24b and 24y. The organic insulating layer pattern 27 is formed to have a forward tapered shape with a tapered angle of 60< or less, and has a water-repellent surface.

Moreover, in the openings 27x of the organic insulating layer pattern 27 on the spaces between the source electrodes 24a and 24x and the drain electrodes 24b and 24y, the organic active layers 36a and 36b for the Sw-TFT 5 and the Dr-TFT 6 are formed, respectively. The hole transport layer 38 and the emitting layer 42 are formed in the opening 27x of the organic insulating layer pattern 27 on the pixel electrode 26. As in the case of FIG. 2 of the first embodiment, a plurality of the pixel electrodes 26 are set in a red (R) pixel part, a green (G) pixel part and a blue (B) pixel part. Moreover, red, green and blue emitting layers (not shown) are formed so as to correspond to the pixel parts of the respective colors. Furthermore, the hole transport layer 38 and the emitting layer 42 form the organic EL layer 3a. The organic EL layer 3a is formed with high accuracy in each of the pixel parts of the three primary colors while being defined by the organic insulating layer pattern 27 which functions as a partition wall in formation of the layer by use of the ink jet method.

Furthermore, the metal electrode 46 is formed on the organic EL layer 3a, and the organic EL element 2a is formed of the pixel electrode 26, the organic EL layer 3a and the metal electrode 46. The sealing layer 48 which covers the organic EL element 2a, the Sw-TFT 5 and the Dr-TFT 6 is formed thereon.

The flexible organic EL display 1b of the third embodiment has the configuration as described above. As in the case of the first embodiment, lights of predetermined colors are emitted to the outside from the emitting layers 42 of the respective colors. Thus, a color image is obtained (the direction indicated by the arrows in FIG. 6K).

In the method of manufacturing a flexible display according to the third embodiment, first, a transfer layer is formed with high accuracy on the heat-resistant glass substrate 20 without having manufacturing conditions limited. Specifically, the transfer layer includes the peelable layer 22, the mask metal layer 25, the organic insulating layer 27a, the source electrodes 24a and 24x, the drain electrodes 24b and 24y, the pixel electrode 26, the gate insulating layer 28, the gate electrodes 30a and 30b, and the protective layer 32.

Thereafter, the transfer layer is transferred and formed in a state of being inverted upside down on the plastic film 40 with the adhesive layer 34 interposed therebetween. Next, after the peelable layer 22 is removed by use of oxygen plasma, the organic insulating layer 27a is continuously etched by using the exposed mask metal layer 25 as a mask and using the oxygen plasma. Thereafter, the mask metal layer 25 is removed.

Accordingly, the organic insulating layer pattern 27 is formed, which has the openings 27x provided on the pixel electrode 26 above the plastic film 40 and on the spaces between the source electrodes 24a and 24x and the drain electrodes 24b and 24y. Thereafter, surface treatment is performed by use of the plasma of the gas containing fluorine atoms. Thus, the surface of the organic insulating layer pattern 27 is set to be water-repellent, and the surface of the pixel electrode 26 is set to be hydrophilic.

Furthermore, by use of the ink jet method, the organic active layers 36a and 36b are formed in the openings 27x of the organic insulating layer pattern 27 on the spaces between the source electrodes 24a and 24x and the drain electrodes 24b and 24y. Subsequently, in the opening 27x of the organic insulating layer pattern 27 on the pixel electrode 26, the hole transport layer 38 and the emitting layer 42 of each of the three primary colors are sequentially formed by use of the ink jet method. Thus, the organic EL layer 3a is obtained. In this event, the organic insulating layer pattern 27 is formed 'to have a forward tapered shape and a water-repellent surface. Accordingly, the organic insulating layer pattern 27 serves as a partition wall to allow the respective coating liquids to flow into the openings 27x with high accuracy. Thus, the organic active layers 36a and 36b and the organic EL layer 3a are formed with high alignment accuracy. Thereafter, the metal electrode 46 is formed on the organic EL layer 3a to obtain the organic EL element 2a. Subsequently, the sealing layer 48 which covers the organic EL element 2a is formed.

In the third embodiment, a patterning step (the step of forming the source electrodes 24a and 24x, the drain electrodes 24b and 24y, the pixel electrode 26, and the gate electrodes 30a and 30b) by photolithography which adversely affects the organic active layers 36a and 36b and the organic EL layer 3a is performed on the glass substrate 20. Subsequently, after the electrodes described above are transferred onto the plastic film 40, the organic active layers 36a and 36b and the organic EL layer 3a are formed by use of the ink jet method. Therefore, there is no longer a risk that the organic active layers 36a and 36b and the organic EL layer 3a are deteriorated by various processing in the photolithography step.

As described above, in the third embodiment, it is made possible to stably manufacture, with high yield, a flexible organic EL display which uses a plastic film as a substrate and includes organic TFTs.

Fourth Embodiment

FIGS. 7A to 7H are cross-sectional views showing a method of manufacturing a flexible display according to a fourth embodiment of the present invention. FIG. 8 is a cross-sectional view showing a flexible display (a liquid crystal display) according to the fourth embodiment of the present invention. In the fourth embodiment, the case of applying the present invention to a liquid crystal display will be described as an example. In the fourth embodiment, detailed description of the same steps as those of the first embodiment will be omitted. Moreover, the same components as those of the first embodiment are denoted by the same reference numerals, and description thereof will be omitted.

Figure 7A:
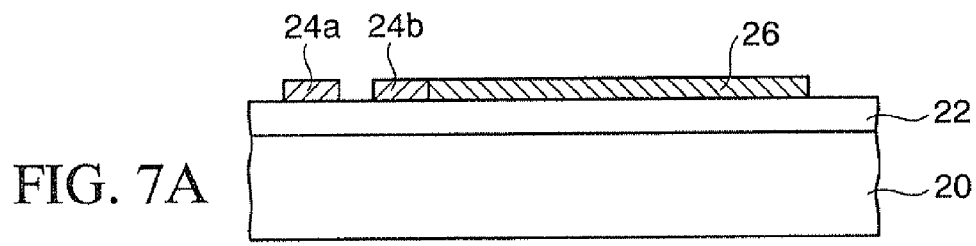
FIGS. 7A to 7H are cross-sectional views showing a method of manufacturing a flexible display according to a fourth embodiment of the present invention.
Figure 8:
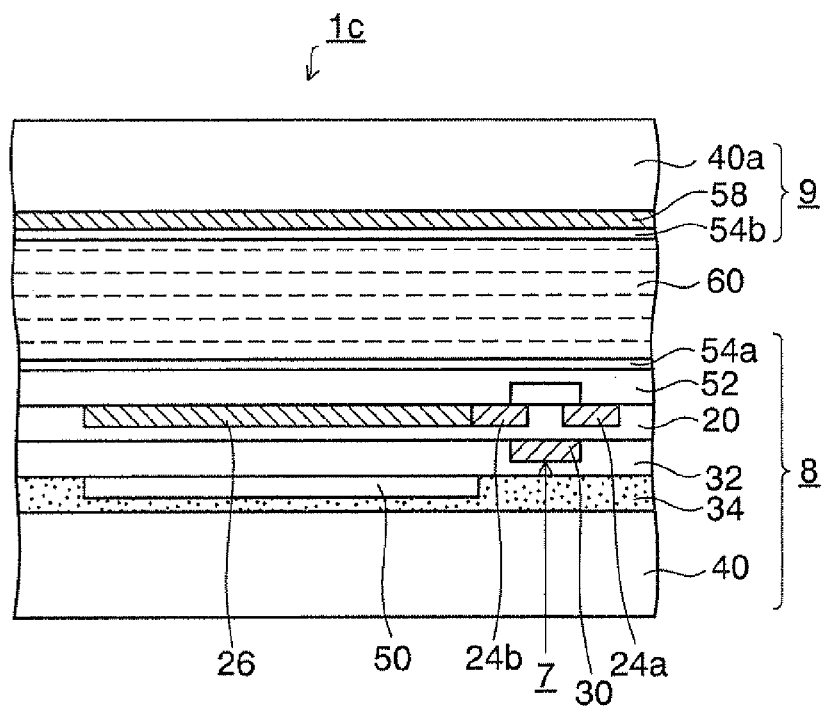
FIG. 8 is a cross-sectional view showing a flexible display (a liquid crystal display) according to the fourth embodiment of the present invention.

In the method of manufacturing a flexible display according to the fourth embodiment of the present invention, as shown in FIG. 7A, first, a peelable layer 22 is formed on a glass substrate 20 as a temporary substrate. Thereafter, source and drain electrodes 24a and 24b of a TFT for switching are formed. Subsequently, a pixel electrode 26, which is electrically connected to the drain electrode 24b and is made of ITO or the like, is formed on the peelable layer 22.

Figure 7B:
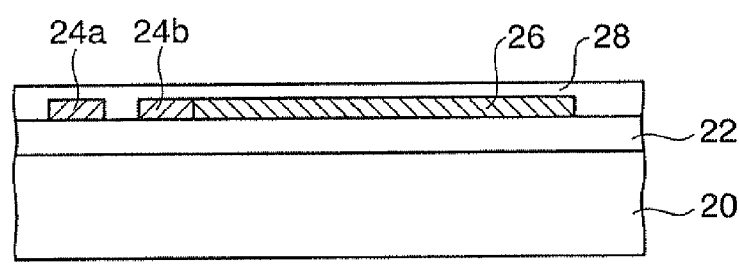
Figure 7C:
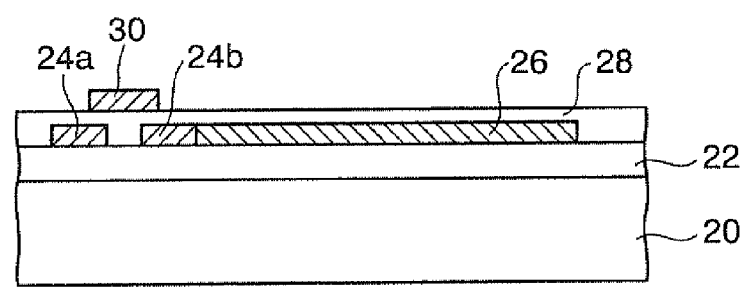

Next, as shown in FIG. 7B, a gate insulating layer 28 is formed, the gate insulating layer covering the source electrode 24a, the drain electrode 24b and the pixel electrode 26. Thereafter, as shown in FIG. 7C, a gate electrode 30 for the TFT is formed on the gate insulating layer 28 in a portion above a space between the source and drain electrodes 24a and 24b so as to overlap above ends thereof.

Figure 7D:
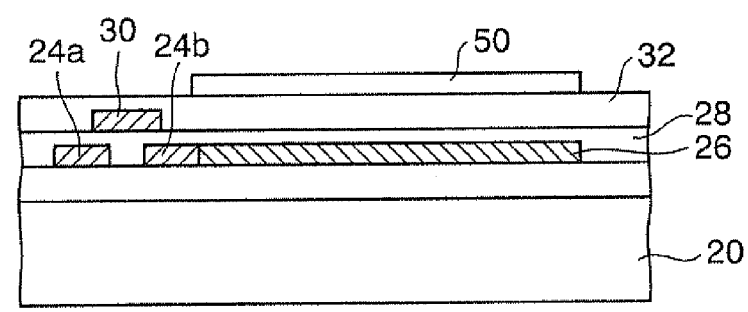

Subsequently, as shown in FIG. 7D, after a protective layer 32 which covers the gate electrode 30 is formed, a color filter layer 50 is formed on the protective layer 32 in a portion corresponding to the pixel electrode 26. In this embodiment, description is given of the case where a full-color display is realized by the color filter layer 50, as an example. Although FIG. 7D shows only one pixel part, a red (R) color filter layer, a green (G) color filter layer and a blue (B) color filter layer are formed, respectively, above the respective pixel electrodes 26 in respective pixel parts (R), (G) and (B) of the three primary colors as shown in FIG. 2 of the first embodiment. The pixel parts (subpixels) of the three primary colors form a pixel that is a display unit. The respective color filter layers 50 of the three primary colors are formed by sequentially patterning photosensitive coating films of a pigment dispersion type, for example, by photolithography.

Figure 7E:
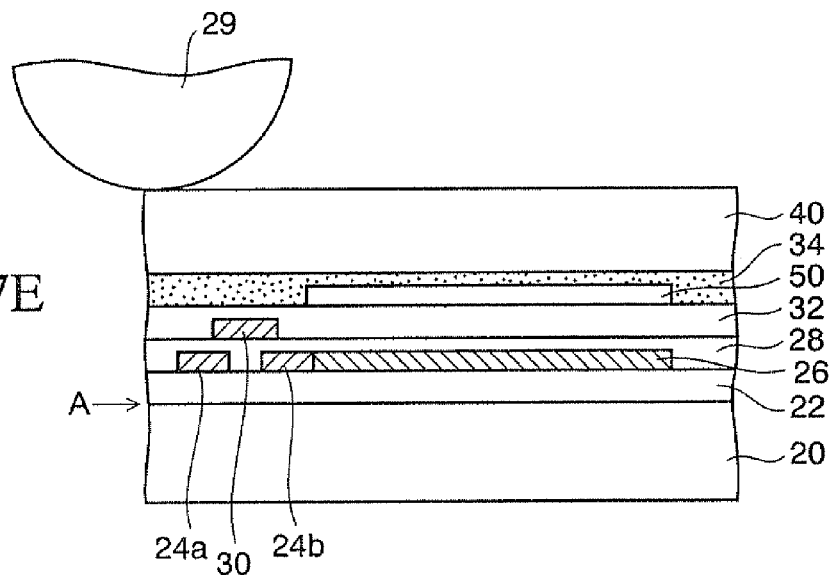

Subsequently, as shown in FIG. 7E, a first plastic film 40 is attached to the structure shown in FIG. 7D with an adhesive layer 34 interposed therebetween. Thereafter, the glass substrate 20 is peeled while a roll 29 fixed to one end of the first plastic film 40 is being rotated. In this event, the glass substrate 20 is peeled along an interface (the portion A in FIG. 7E) between the glass substrate 20 and the peelable layer 22, and is discarded.

Figure 7F:
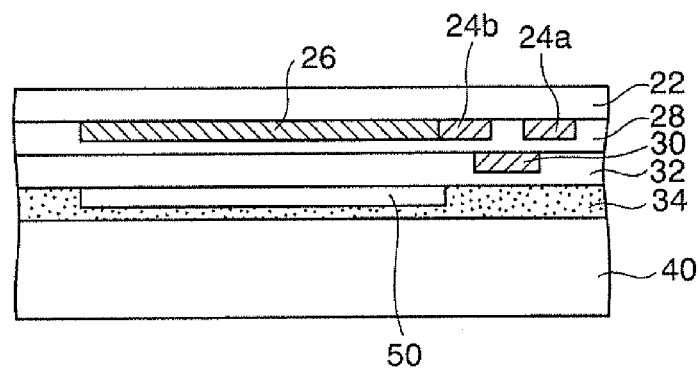

Thus, as shown in FIG. 7F, on the first plastic film 40, the adhesive layer 34, the color filter layer 50, the protective layer 32, the gate electrode 30, the gate insulating layer 28, the source and drain electrodes 24a and 24b and the pixel electrode 26, and the peelable layer 22 are transferred and formed sequentially from the bottom.

Figure 7G:
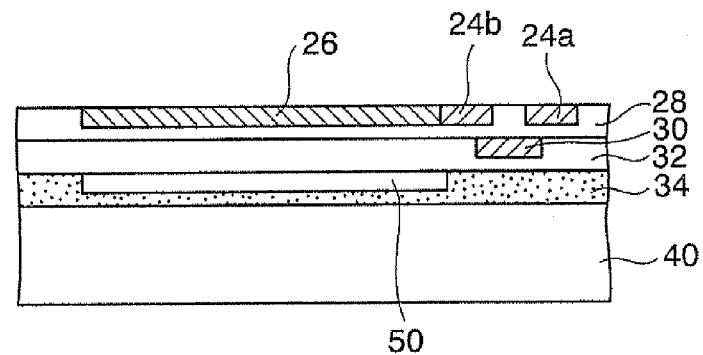

Next, as shown in FIG. 7G, by removing the peelable layer 22, upper surfaces of the source electrode 24a, the drain electrode 24b and the pixel electrode 26 are exposed.

Figure 7H:
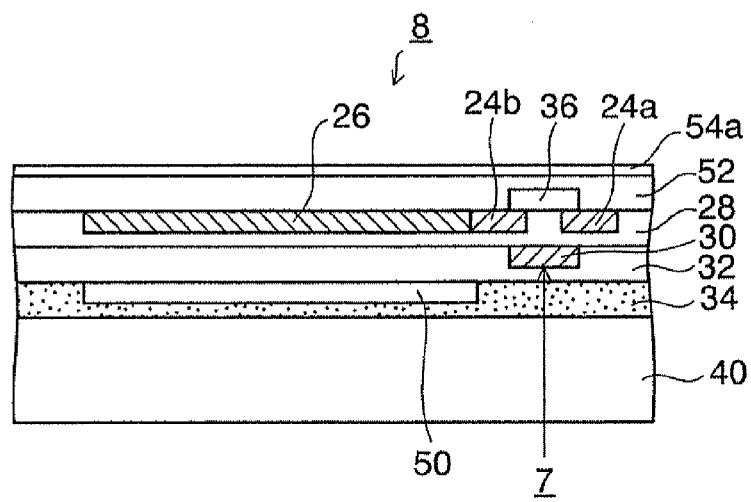

Thereafter, as shown in FIG. 7H, an organic active layer 36 for the TFT is formed on a space between the source and drain electrodes 24a and 24b by mask vapor deposition. Thus, a TFT 7 for switching is obtained, the TFT including the gate electrode 30, the gate insulating layer 28, the source and drain electrodes 24 and 24b, and the organic active layer 36.

Note that, as in the case of the third embodiment, an organic insulating layer pattern, which has an opening provided on the space between the source and drain electrodes 24a and 24b, may be provided to form the organic active layer 36 in the opening by use of an ink jet method or screen printing.

Subsequently, a resin layer 52, which covers the organic active layer 36, is formed by use of a photo-setting resin such as a PVA (polyvinyl alcohol) resin. Thus, a step of the organic active layer 36 is flattened. Thereafter, a first alignment film 54a for aligning liquid crystal is formed on the resin layer 52.

Note that, if there is no trouble caused by the step of the organic active layer 36, the resin layer 52 may be omitted.

Thus, a TFT substrate 8 for a liquid crystal display is obtained.

As shown in FIG. 7H, in the TFT substrate 8 for the liquid crystal display, the first plastic film 40 is used as a substrate, the adhesive layer 34 is formed thereon, and the color filter layer 50 is buried in the adhesive layer 34. Moreover, the protective layer 32 is formed on the color filter layer 50, and the gate electrode 30 is buried in the protective layer 32. On the gate electrode 30, the gate insulating layer 28 is formed.

Furthermore, on the gate insulating layer 28, the source and drain electrodes 24a and 24b for the TFT 7 and the pixel electrode 26 electrically connected to the drain electrode 24b are formed. On the space between the source and drain electrodes 24a and 24b, the organic active layer 36 for the TFT 7 is formed. Moreover, both ends of the organic active layer 36 are electrically connected to the source and drain electrodes 24a and 24b, respectively.

The organic active layer 36 is covered with the resin layer 52, and the step thereof is flattened. On the resin layer 52, the first alignment film 54a is formed.

Next, as shown in FIG. 8, the TFT substrate 8 and a counter substrate 9 are prepared. The counter substrate 9 is basically composed of a second plastic film 40a, a common electrode 58 which is formed thereon and made of ITO or the like, and a second alignment film 54b formed thereon. In a state where a predetermined space is secured, by use of a spacer, between the TFT substrate 8 and the counter substrate 9, the both substrates are attached so as to face each other by use of a seal member (not shown) which is provided in a peripheral part. Furthermore, liquid crystal 60 is sealed between the TFT substrate 8 and the counter substrate 9.

Thus, a flexible liquid crystal display Ic of the fourth embodiment is completed. Note that the color filter layer 50 may be provided in the counter substrate 9 instead of providing the color filter layer 50 in the TFT substrate 8.

Although not particularly shown in the drawings, a data bus line is connected to the source electrode 24a of the TFT 7, and a gate bus line is connected to the gate electrode 30 of the TFT 7. At a predetermined timing, a gradation voltage is sequentially applied to the pixel electrode 26 of each pixel from the gate bus line and the data bus line through the TFT 7. Thus, an image is displayed.

In the fourth embodiment, as in the case of the first embodiment, it is not required to perform a photolithography step after the organic active layer 36 in the TFT substrate 8 is formed. Thus, there is no longer a risk that performance of the organic active layer 36 is deteriorated by various processing in the photolithography step.

As described above, in the fourth embodiment, it is made possible to stably manufacture, with high yield, an active matrix flexible liquid crystal display which uses an element substrate having organic TFTs formed on a plastic film.

Fifth Embodiment

Figure 9A:
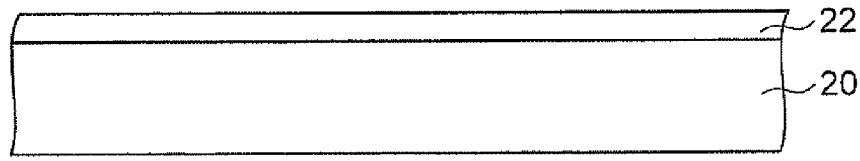
FIGS. 9A to 9O are cross-sectional views showing a method of manufacturing a flexible display according to a fifth embodiment of the present invention.
Figure 9B:
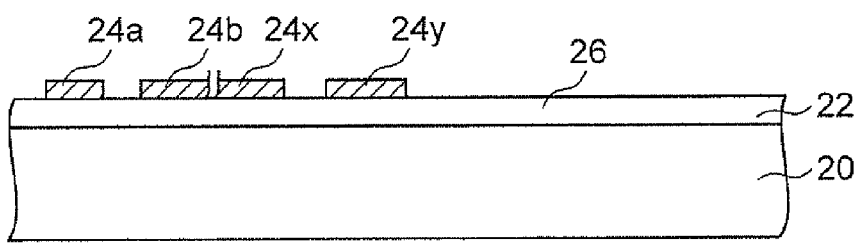
Figure 9C:
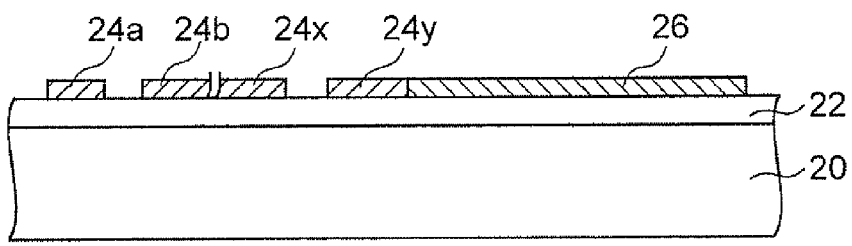
Figure 9D:
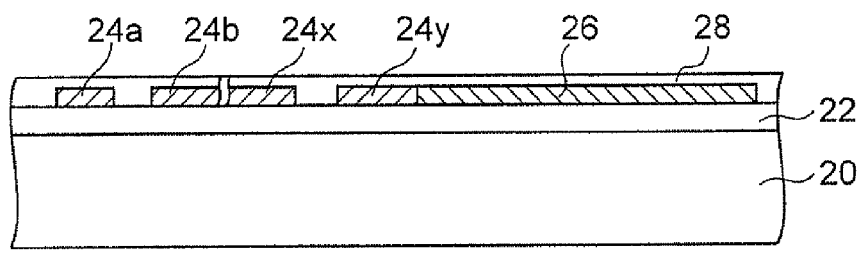
Figure 9E:
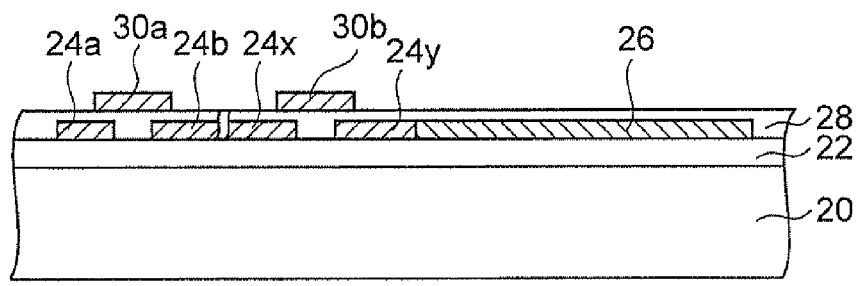
Figure 9F:
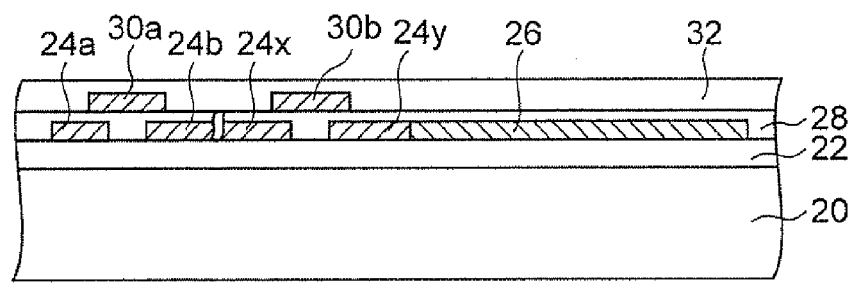
Figure 9G:
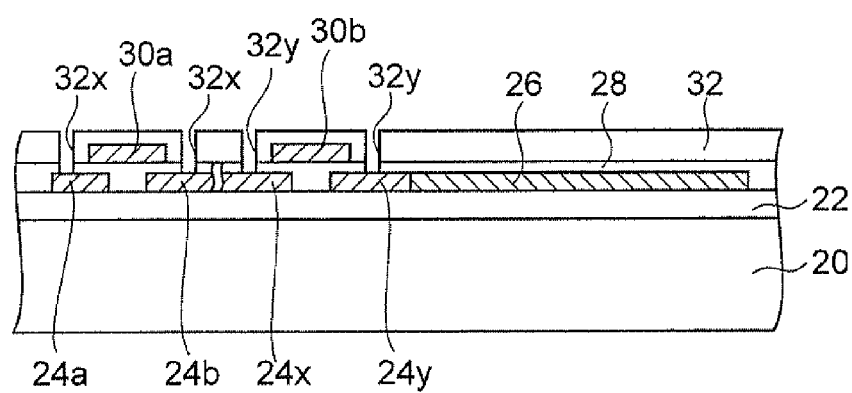
Figure 9H:
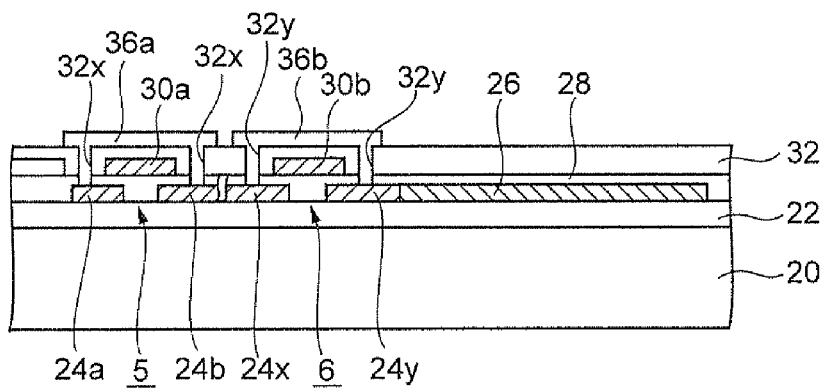
Figure 9I:
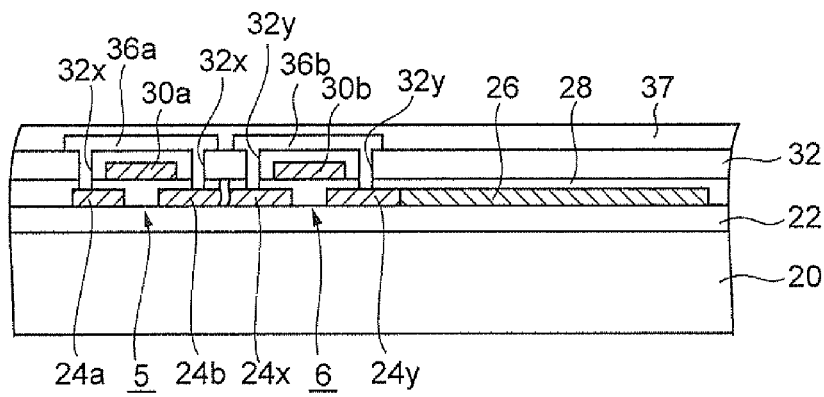
Figure 9J:
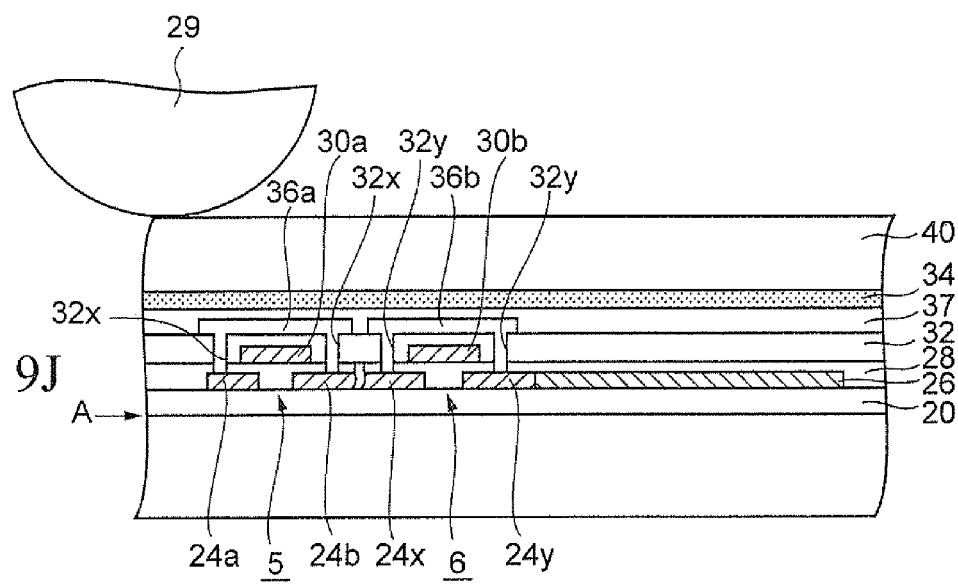
Figure 9K:
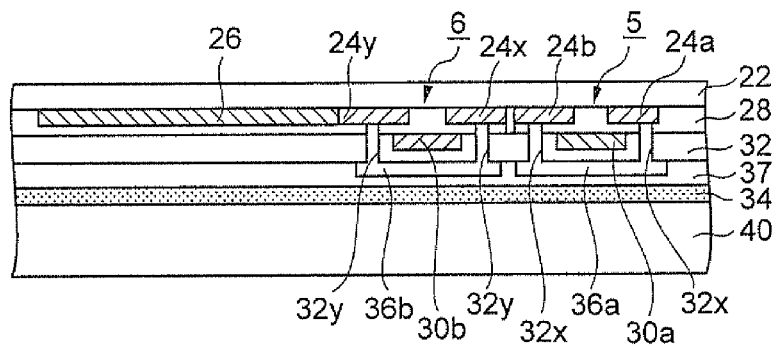
Figure 9L:
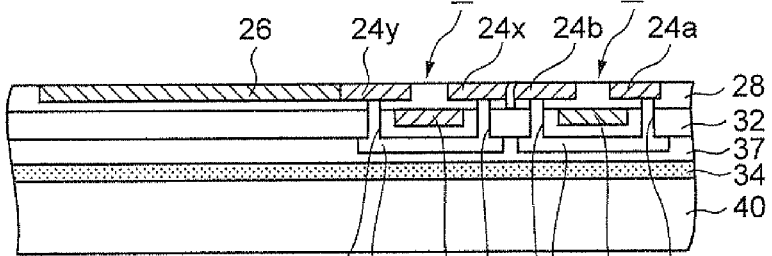
Figure 9M:
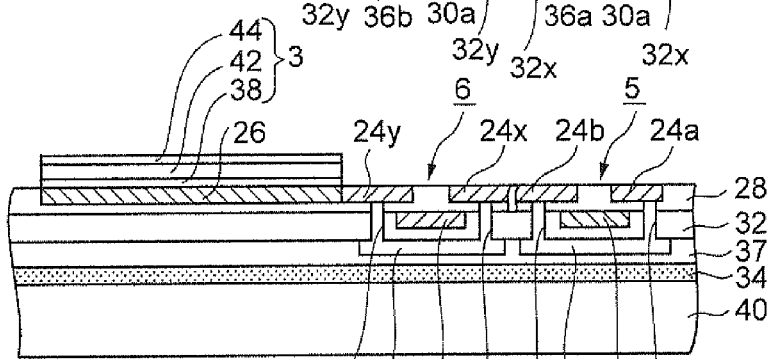
Figure 9N:
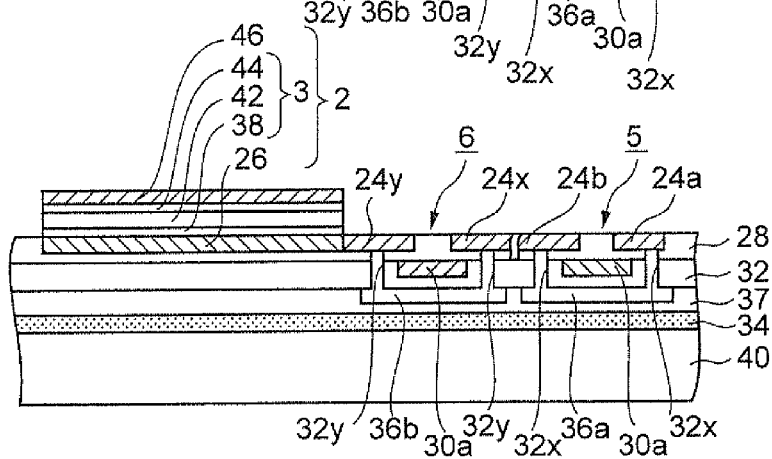
Figure 9O:
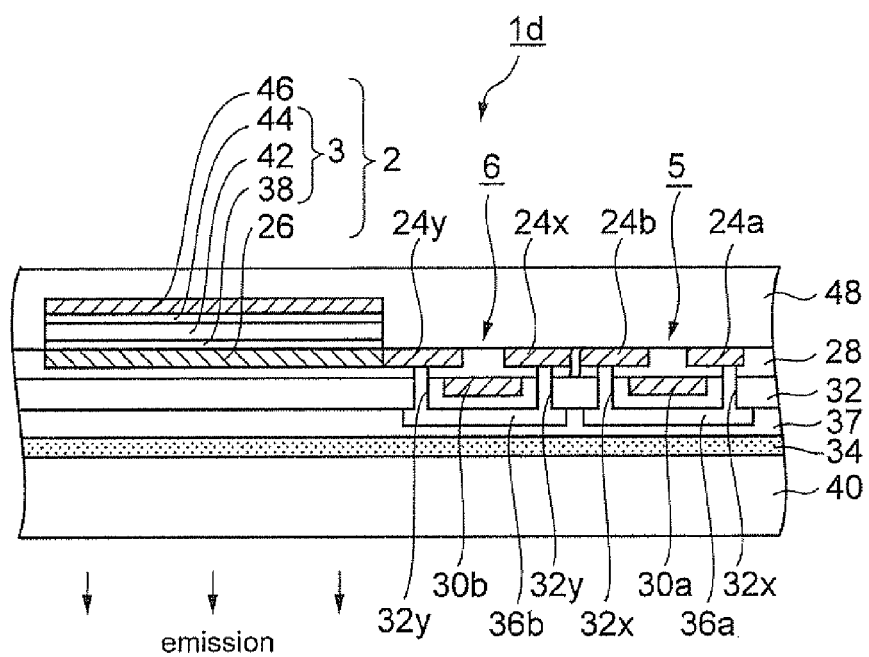
Figure 10:
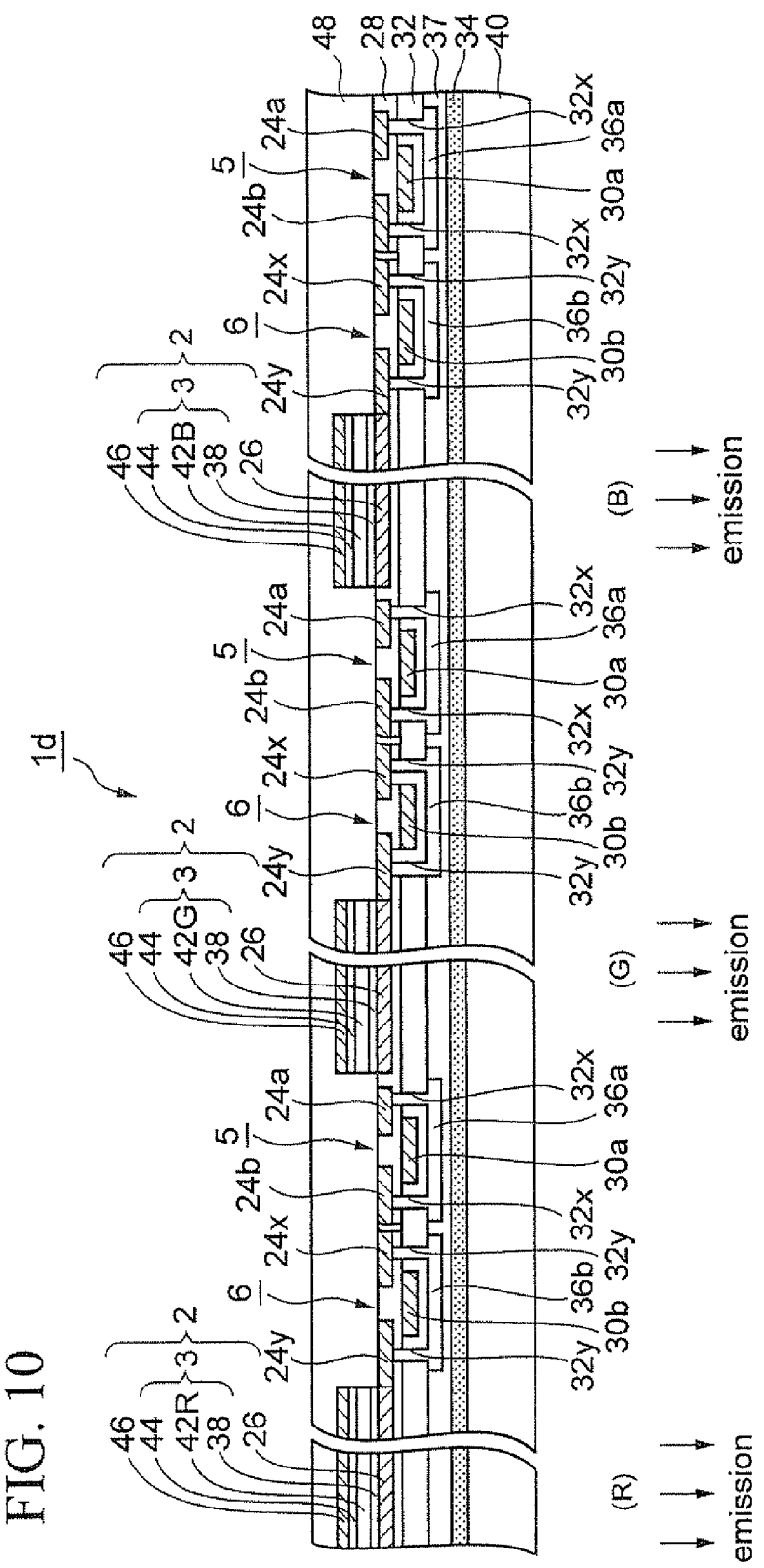
FIG. 10 is a cross-sectional view showing a flexible display (an organic EL display) according to the fifth embodiment of the present invention.

FIGS. 9A to 9O are cross-sectional views showing a method of manufacturing a flexible display according to a fifth embodiment of the present invention. FIG. 10 is a cross-sectional view showing a flexible display (an organic EL display) according to the fifth embodiment of the present invention. In the fifth embodiment, the case of applying the present invention to an organic EL display will be described as an example. In the method of manufacturing a flexible display according to the fifth embodiment of the present invention, as shown in FIG. 9A, first, a glass substrate 20 is prepared as a temporary substrate, and a peelable layer 22 made of a polyimide resin and the like is formed on the glass substrate 20.

Thereafter, as shown in FIG. 9B, a conductive layer made of gold (Au) having a thickness of, for example, 100 nm or the like is formed on the peelable layer 22. Subsequently, the conductive layer is patterned by photolithography and etching. Thus, a source electrode 24a and a drain electrode 24b of a switching TFT (thin film transistor) (hereinafter referred to as a Sw-TFT) and a source electrode 24x and a drain electrode 24y of a driving TFT (hereinafter referred to as a Dr-TFT) are formed.

Subsequently, by use of a sputtering method, a transparent conductive layer such as an ITO (indium tin oxide) layer having a thickness of, for example, 150 nm is formed on the peelable layer 22, the source electrodes 24a and 24x and the drain electrodes 24b and 24y. Thereafter, the transparent conductive layer is patterned by photolithography and etching. Thus, as shown in FIG. 9C, a pixel electrode 26 electrically connected to the drain electrode 24y for the Dr-TFT is formed on the peelable layer 22. Note that the pixel electrode 26 may be formed so as to overlap with an end of the drain electrode 24y for the Dr-TFT. In this embodiment, the ITO layer to be the pixel electrode 26 is formed above the heat-resistant glass substrate 20. Thus, it is possible to adopt a sputtering method using a deposition temperature of about 200 Ž, and the like. Thus, the pixel electrode 26 (ITO) is formed so as to have low-resistance (a specific resistance value: 3~1O'4 f¶ Ecm or less) electrical characteristics.

Next, as shown in FIG. 9D, a protective layer 28 is formed, which covers the source electrodes 24a and 24x, the drain electrodes 24b and 24y and the pixel electrode 26, and is made of an acrylic resin or the like.

Thereafter, as shown in FIG. 9E, a conductive layer made of tantalum (Ta), aluminum (Al), chromium (Cr), IZO, ITO or the like is formed on the protective layer 28 by use of vapor deposition, the sputtering method or the like. Subsequently, the conductive layer is patterned by photolithography and etching. Thus, a gate electrode 30a for the Sw-TFT is formed on the protective layer 28 above a space between the source and drain electrodes 24a and 24b for the Sw-TFT so as to overlap above ends thereof, respectively. Moreover, at the same time, a gate electrode 30b for the Dr-TFT is formed on the protective layer 28 above a space between the source and drain electrodes 24x and 24y for the Dr-TFT so as to overlap above ends thereof, respectively.

Accordingly, on the glass substrate 20, the source electrodes 24a and 24x, the drain electrodes 24b and 24y, the pixel electrode 26, and the gate electrodes 30a and 30b are formed while being miniaturized with high accuracy in a desired pattern by photolithography.

Subsequently, as shown in FIG. 9F, a gate insulating layer 32 is formed. the gate insulating layer covering the respective gate electrodes 30a and 30b. As the gate insulating layer 32, a silicon oxide layer ($SiO_x$ layer), a tantalum oxide layer ($Ta_2O_5$ layer) or the like, which has a thickness of for example 200 nm is used. The insulating layer described above is formed by use of CVD, the sputtering method or the like.

Next, as shown in FIG. 9G, the gate insulating layer 32 and the protective layer 28 are processed by photolithography and etching. Thus, formed are first via holes 32x having depths that reach the source and drain electrodes 24a and 24b for the Sw-TFT, respectively, and second via holes 32y having depths that reach the source and drain electrodes 24x and 24y for the Dr-TFT, respectively.

Subsequently, as shown in FIG. 9H, an organic active layer 36a for the Sw-TFT is formed on the gate insulating layer 32.

Specifically, the organic active layer 36a is electrically connected to the source and drain electrodes 24a and 24b for the Sw-TFT through the first via holes 32x. At the same time, an organic active layer 36b for the Dr-TFT is formed on the gate insulating layer 32. Specifically, the organic active layer 36b is electrically connected to the source and drain electrodes 24x and 24y for the Dr-TFT through the second via holes 32y.

As a material for each of the organic active layers 36a and 36b, an organic semiconductor such as pentacene, sexithiophene and polythiophene is used. The organic active layers 36a and 36b are formed on the gate insulating layer 32 in a state of being buried in the first and second via holes 32x and 32y by mask vapor deposition. Each of the organic active layers 36a and 36b has a thickness of, for example, about 50 nm. The mask vapor deposition is a method of forming a pattern simultaneously with deposition by moving a shadow mask with high accuracy in a vacuum evaporator. Therefore, without using photolithography, the patterned organic active layers 36a and 36b can be formed. Thus, there is no risk that performance of the organic active layers 36a and 36b is deteriorated by wet processing, plasma and the like in the photolithography step.

Note that the organic active layers 36a and 36b may be formed after filling the first and second via holes 32x and 32y with a conductive material such as a conductive pste, as long as the organic active layers 36a and 36b are electrically connected to the source electrodes 24a and 24x and the drain electrodes 24b and 24y through the first and second via holes 32x and 32y.

Accordingly, a Sw-TFT 5 is obtained, the Sw-TFT including the gate electrode 30a, the gate insulating layer 32, the source electrode 24a, the drain electrode 24b and the organic active layer 36a connected to the source and drain electrodes 24a and 24b. Moreover, a Dr-TFT 6 is obtained, the Dr-TFT including the gate electrode 30b, the gate insulating layer 32, the source electrode 24x, the drain electrode 24y and the organic active layer 36b connected to the source and drain electrodes 24x and 24y.

Next, as shown in FIG. 9I, a barrier insulating layer 37 which covers the organic active layers 36a and 36b is formed. As the barrier insulating layer 37, an inorganic insulating layer, such as a silicon oxide layer ($SiO_x$), a silicon nitride layer ($SiN_x$) and a silicon oxide nitride layer (SiON), which can block intrusion of water vapor, is suitably used. Moreover, the barrier insulating layer 37 is formed by use of a CVD method or a sputtering method. Note that two or more layers may be selected from the $SiO_x$ layer, the $SiN_X$ layer and the SiON layer and laminated.

Thereafter, as shown in FIG. 9J, a plastic film 40 is disposed on an upper surface of the barrier insulating layer 37 shown in FIG. 9I with an adhesive layer 34 interposed therebetween. Furthermore, the adhesive layer 34 is hardened by heat treatment to attach the plastic film 40 to the structure shown in FIG. 9I. As the plastic film 40, a polyethersulfone film, a polycarbonate film or the like, which has a thickness of 100 to 200 fÊm, is preferably used.

Subsequently, as also shown in FIG. 9I, a roll 29 is fixed to one end of the plastic film 40, and the glass substrate 20 is peeled while the roll 29 is being rotated. In this event, the glass substrate 20 is peeled along an interface (the portion A in FIG. 9J) between the glass substrate 20 and the peelable layer 22, and is discarded.

Thus, as shown in FIG. 9K, on the plastic film 40, the adhesive layer 34, the barrier insulating layer 37, the organic active layers 36a and 36b, the gate insulating layer 32, the gate electrodes 30a and 30b, the protective layer 28, the source electrodes 24a and 24x, the drain electrodes 24b and 24y and the pixel electrode 26, and the peelable layer 22 are transferred and formed sequentially from the bottom.

Thereafter, as shown in FIG. 9L, the peelable layer 22 is removed by use of oxygen gas plasma. Thus, upper surfaces of the source electrodes 24a and 24x, the drain electrodes 24b and 24y, and the pixel electrode 26 are exposed.

As described above, in this embodiment, adopted is the method of transferring and forming the respective TFTs 5 and 6 in a state of being inverted upside down on the plastic film 40 after the TFTs are formed to have a structure in which the organic active layers 36a and 36b are disposed on the upper side on the glass substrate 20. Therefore, the organic active layers 36a and 36b are never exposed to the upper side of the plastic film 40 but are set in a state of being buried in the bottom. Thus, there is no longer a risk that the organic active layers 36a and 36b are damaged by the subsequent various processing steps.

Subsequently, as shown in FIG. 9M, a hole transport layer 38 having a thickness of, for example, 30 nm is selectively formed on the pixel electrode 26 by mask vapor deposition. As the hole transport layer 38, $f_{\beta}$-NPD that is an aromatic tertiary amine derivative or the like is suitably used. Furthermore, as also shown in FIG. 9M, a low-molecular-weight emitting layer 42 having a thickness of, for example, 70 nm is selectively formed on the hole transport layer 38 by mask vapor deposition. In this embodiment, description is given of the case where a full-color display is realized by forming emitting layers of three primary colors, as an example. Thus, as described later with reference to FIG. 10, a red emitting layer, a green emitting layer and a blue emitting layer are formed, respectively, on the hole transport layers 38 in respective pixel parts of three primary colors (red (R), green (G) and blue (B)). The pixel parts (subpixels) of the three primary colors form a pixel that is a display unit.

As the low-molecular-weight emitting layer 42, one obtained by mixing a doping material with a host material is used. The doping material (molecules) emits light. As the host material, there are, for example, Alq3 and a distyryl arylene derivative (DPVBi). As the doping material, there are, for example, coumarin 6 which emits green light DCJTB which emits red light, and the like.

Subsequently, as also shown in FIG. 9M, an electron transport layer 44 is formed on the emitting layer 42 by mask vapor deposition. As the electron transport layer 44, a quinolinol aluminum complex (Alq3) or the like is suitably used.

Thus, an organic EL layer 3 is obtained, the organic EL layer including the hole transport layer 38, the emitting layer 42 and the electron transport layer 44.

Note that only on of the hole transport layer 38 and the electron transport layer 44 may be formed or both of the hole transport layer 38 and the electron transport layer 44 may be omitted.

Furthermore, as shown in FIG. 9N, a metal electrode 46 is selectively formed on the electron transport layer 44 by mask vapor deposition. As the metal electrode 46, a lithium fluoride/aluminum (LiF/Al) laminated film or the like is suitably used. A thickness of a LiF layer is set to 0.2 to 1 nm, and a thickness of an Al layer is set to 100 to 200 nm.

Thus, an organic EL element 2 is obtained, the organic EL element including the pixel electrode 26, the organic EL layer 3 and the metal electrode 46.

As described above, in this embodiment, photolithography is not used in the step of forming the organic active layers 36a and 36b and the organic EL layer 3 and the subsequent steps. Thus, there is no longer a risk that performance of the organic active layers 36a and 36b and the organic EL layer 3 is deteriorated by various processing in the photolithography step.

Thereafter, as shown in FIG. 9O, a sealing layer 48 is formed, the sealing layer covering the organic EL element 2, the Sw-TFT 5 and the Dr-TFT 6. As the sealing layer 48, a silicon oxide layer ($SiO_x$), a silicon nitride layer ($SiN_x$), a silicon nitride layer ($SiN_x$) or the like is used. The sealing layer 48 is formed by low-temperature CVD at a deposition temperature of about 100 Ž, for example. Alternatively, the sealing layer 48 may be formed by attaching a resin film having a moisture-proof layer formed therein.

Accordingly, a flexible organic EL display 1d according to the fifth embodiment of the present invention is completed.

As described above, in the method of manufacturing a flexible display according to this embodiment, a patterning step (the step of forming the source electrodes 24a and 24x, the drain electrodes 24b and 24y, the pixel electrode 26, the gate electrodes 30a and 30b, and the via holes 32x and 32y) by photolithography which adversely affects the organic active layers 36a and 36b and the organic EL layer 3 is performed on the glass substrate 20 before the organic active layers 36a and 36b and the organic EL layers 3 are formed. Furthermore, the organic active layers 36a and 36b, which are connected to the source electrodes 24a and 24x and the drain electrodes 24b and 24y, and the barrier insulating layer 37, which covers the organic active layers 36a and 36b, are formed on the glass substrate 20. Thus, a transfer layer is obtained. Subsequently, after the transfer layer is transferred in a state of being inverted upside down on the plastic film 40, the organic EL element 2 is formed on a pixel electrode 26 by the mask vapor deposition.

By adopting the manufacturing method as described above, there is no longer a risk that characteristics of the organic active layers 36a and 36b and the organic EL layer 3 are deteriorated by various processing in the photolithography step. Moreover, after the transfer layer is transferred onto the plastic film 40 (the state shown in FIG. 9L), the source electrodes 24a and 24x, the drain electrodes 24b and 24y, and the pixel electrode 26 are exposed to the top. Moreover, the organic active layers 36a and 36b are set in the state of being buried in the bottom, Thus, even if the photolithography step is performed after the transfer and before formation of the organic EL element 2 (the step between FIG. 9L and FIG. 9M), there is no risk that the organic active layers 36a and 36b are damaged.

Therefore, it is possible to pattern, by photolithography, an insulating layer which covers the Sw-TFT 5 and the Dr-TFT 6 and has an opening on the pixel electrode 26. Thus, even in the case where the metal electrode 46 of the organic EL element 2 is formed on the entire surface over the plastic film 40, a degree of freedom for designing of the organic EL display can be increased without causing any trouble.

As described above, in this embodiment, it is made possible to stably manufacture, with high yield, an organic EL display which uses a plastic film as a substrate and includes organic TFTs. Furthermore, the barrier insulating layer 37 which can block water vapor is formed below the organic active layers 36a and 36b. Thus, water vapor from the outside air and moisture in the plastic film 40 are prevented from entering the organic active layers 36. Consequently, a highly reliable organic EL display can be realized.

FIG. 10 shows pixel parts of three primary colors (a red pixel part (R), a green pixel part (G) and a blue pixel part (B)) in the flexible display of the fifth embodiment. As shown in FIG. 10, in the flexible organic EL display 1d of the fifth embodiment, the plastic film 40 is used as a substrate, and the barrier insulating layer 37 is formed thereon with the adhesive layer 34 interposed therebetween. On the barrier insulating layer 37 in the respective pixel parts (R), (G) and (B) of the three primary colors, the organic active layers 36a of the Sw-TFTs 5 and the organic active layers 36b of the Dr-TFTs 6 are formed, respectively. Moreover, on the respective organic active layers 36a and 36b in the respective pixel parts (R), (G) and (B) of the three primary colors, the gate insulating layer 32 and the gate electrodes 30a and 30b are formed. Furthermore, on the respective gate electrodes 30a and 30b, the protective layer 28 is formed.

Moreover, on the protective layer 28 in the respective pixel parts (R), (G) and (B) of the three primary colors, the source and drain electrodes 24a and 24b for the Sw-TFTs 5, the source and drain electrodes 24x and 24y for the Dr-TFTs 6, and the pixel electrodes 26 electrically connected to the drain electrodes 24y for the Dr-TFTs 6 are formed, respectively.

The organic active layers 36a of the respective Sw-TFTs 5 in the respective pixel parts (R), (G) and (B) of the three primary colors are electrically connected to the source and drain electrodes 24a and 24b for the Sw-TFTs 5, respectively, through the first via holes 32x provided in the gate insulating layer 32 and the protective layer 28. Moreover, similarly, the organic active layers 36b of the respective Dr-TFTs 6 are electrically connected to the source and drain electrodes 24x and 24y for the Dr-TFTs 6, respectively, through the second via holes 32y provided in the gate insulating layer 32 and the protective layer 28.

Thus, the Sw-TFTs 5 and the Dr-TFTs 6 are disposed in the respective pixel parts (R), (G) and (B) of the three primary colors, respectively, the TFTs including the source electrodes 24a and 24x, the drain electrodes 24b and 24y, the gate electrodes 30a and 30b, the gate insulating layer 32 and the organic active layers 36a and 36b.

Moreover, on the respective pixel electrodes 26 in the respective pixel parts (R), (G) and (B) of the three primary colors, the organic EL layers 3 formed of the hole transport layers 38, emitting layers 42R, 42G and 42B, and the electron transport layers 44 are formed, respectively. The red emitting layer 42R, the green emitting layer 42G and the blue emitting layer 42B are provided so as to correspond to the respective pixel parts (R), (G) and (B) of the three primary colors.

Furthermore, the metal electrodes 46 are formed, respectively, on the organic EL layers 3 in the respective pixel parts (R), (G) and (B) of the three primary colors. In the respective pixel parts (R), (G) and (B), the organic EL elements 2 formed of the pixel electrodes 26, the organic EL layers 3 and the metal electrodes 46 are provided, respectively. On the organic EL elements 2, the Dr-TFTs 6 and the Sw-TFTs 5, the sealing layer 48 which covers the elements and the TFTs is formed.

In the flexible display 1d of the fifth embodiment, one pixel part is provided with the same configuration as that shown in the plan view of FIG. 4 so as to form the equivalent circuit shown in FIG. 3 in the first embodiment described above. Moreover, lights of predetermined colors are emitted to the outside from the respective emitting layers 42R, 42G and 42B in the respective pixel parts (R), (G) and (B). Thus, a color image is obtained (the direction indicated by the arrows in FIG. 10).

Note that, in the fifth embodiment described above, as in the case of a sixth embodiment to be described next, color filter layers may be provided between the protective layer 28 and the gate insulating layer 32 or between the gate insulating layer 32 and the barrier insulating layer 37. In this case, a full' color display is realized by combination of the color filter layers and the light emission of red (R), green (G) and blue (B). Thus, color saturation can be improved.

Sixth Embodiment

Figure 11:
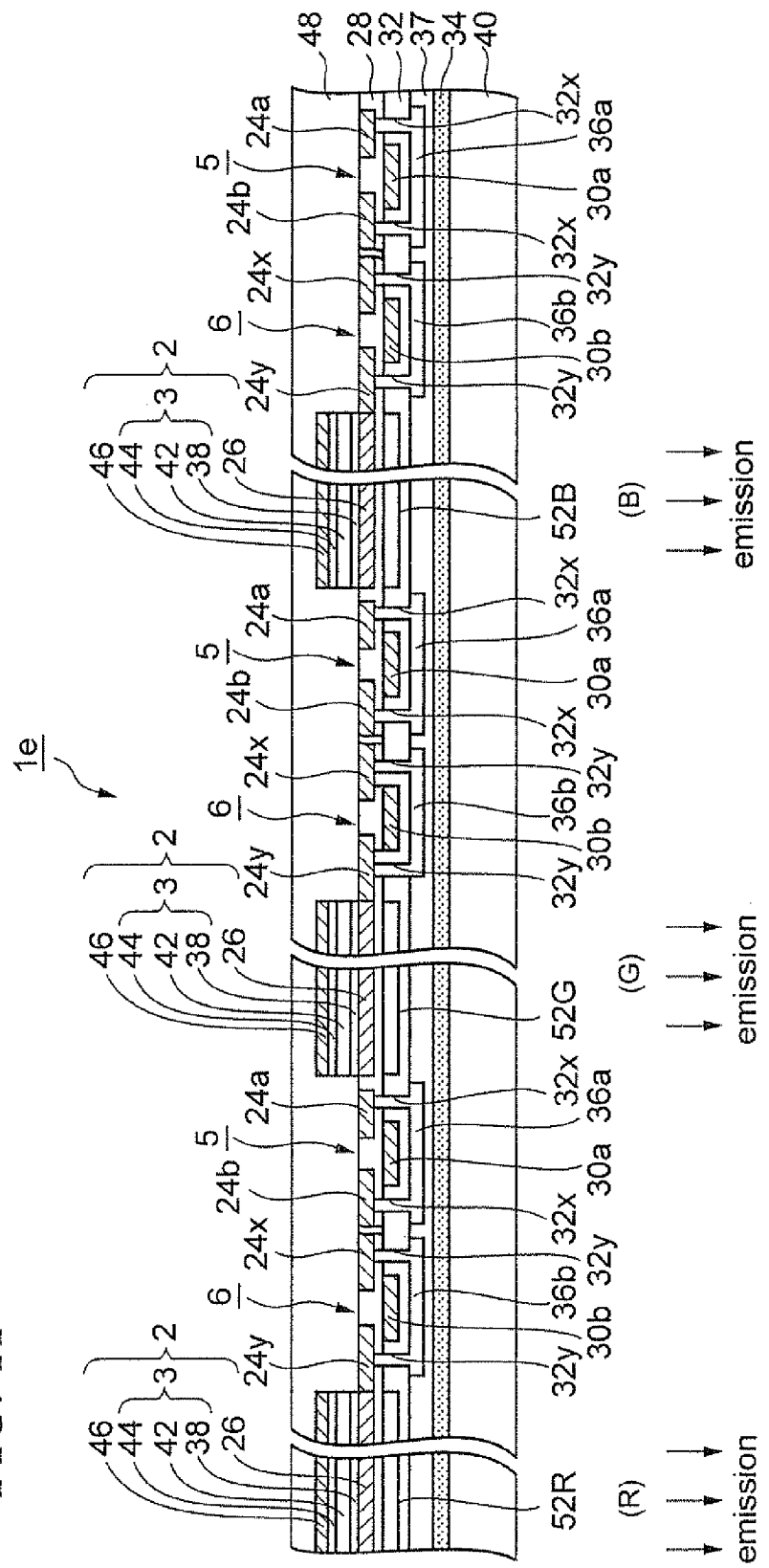
FIG. 11 is a cross-sectional view showing a flexible display (an organic EL display) according to a sixth embodiment of the present invention.

FIG. 11 is a cross-sectional view showing a flexible display (an organic EL display) according to a sixth embodiment of the present invention. In the sixth embodiment, a full-color display is realized by using a white emitting layer as an emitting layer in an organic EL layer and combining color filter layers. In FIG. 11, the same components as those of the fifth embodiment shown in FIG. 10 are denoted by the same reference numerals, and description thereof will be omitted.

As shown in FIG. 11, a flexible organic EL display 1e of the sixth embodiment is formed by replacing all the red, green and blue emitting layers 42R, 42G and 42B in the fifth embodiment shown in FIG. 10 with white emitting layers 42. Moreover, between a protective layer 28 and a gate insulating layer 32 in respective pixel parts (R), (G) and (B) of three primary colors, color filter layers 52R, 52G and 52B are formed, respectively. The color filter layers include a red color filter layer 52R formed in a red pixel part (R), a green color filter layer 52G formed in a green pixel part (G), and a blue color filter layer 52B formed in a blue pixel part (B). In the sixth embodiment, white light is emitted from the white emitting layers 42 in the respective pixel parts (R), (G) and (B). Thereafter, the white light passes through the color filter layers 52R, 52G and 52B of the three primary colors. Thus, a color image is obtained (the direction indicated by the arrows in FIG. 11).

In order to manufacture the flexible display 1e of the sixth embodiment, the red, green and blue color filter layers 52R, 52G and 52B are sequentially formed on the protective layer 28 on respective pixel electrodes 26 corresponding to the pixel parts (R), (G) and (B) of the three primary colors after the step of FIG. 9D in the fifth embodiment. The respective color filter layers 52R, 52G and 52B are formed by patterning photosensitive coating films of a pigment dispersion type, for example, by photolithography. Note that the color filter layers 52R, 52G and 52B may be formed at any stage as long as the layers are formed before the organic active layers 36a and 36b are formed. Therefore, the color filter layers 52R, 52G and 52B may be formed between the gate insulating layer 32 and the barrier insulating layer 37.

The flexible organic EL display 1e of the sixth embodiment achieves the same effects as those of the fifth embodiment.

Seventh Embodiment

FIGS. 12A to 12L are cross-sectional views showing a method of manufacturing a flexible display according to a seventh embodiment of the present invention. FIG. 13 is a cross' sectional view showing a flexible display according to the seventh embodiment of the present invention. In the fifth embodiment, the organic active layers and the organic EL layers are formed by the mask vapor deposition. Meanwhile, in the seventh embodiment, organic active layers and organic EL layers are formed by use of an ink jet method or printing. In the seventh embodiment, detailed description of the same steps as those of the fifth embodiment will be omitted.

Figure 12A:
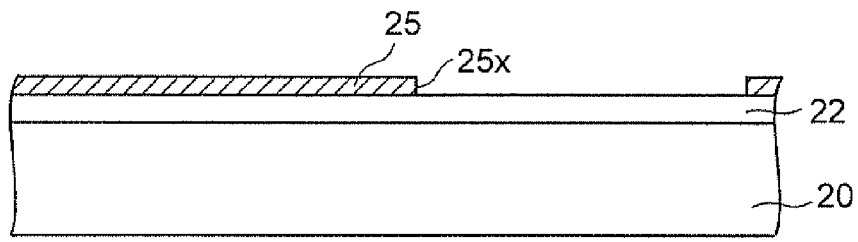
Figure 13:
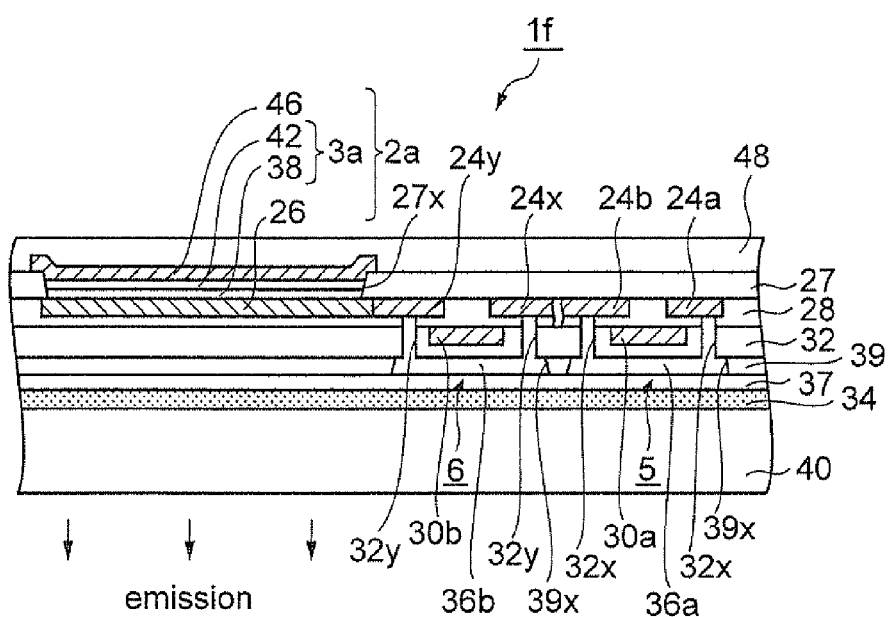
FIG. 13 is a cross-sectional view showing a flexible display (an organic EL display) according to the seventh embodiment of the present invention.

First, as shown in FIG. 12A, after a peelable layer 22 is formed on a glass substrate 20, a mask metal layer 25 having an opening 25x provided in a required portion is patterned on the peelable layer 22. As a material of the mask metal layer 25, aluminum (Al), silver (Ag) or the like is used. The opening 25x of the mask metal layer 25 is provided in a portion corresponding to a region where a pixel electrode (an emitting layer) for a TFT to be formed later is formed.

Figure 12B:
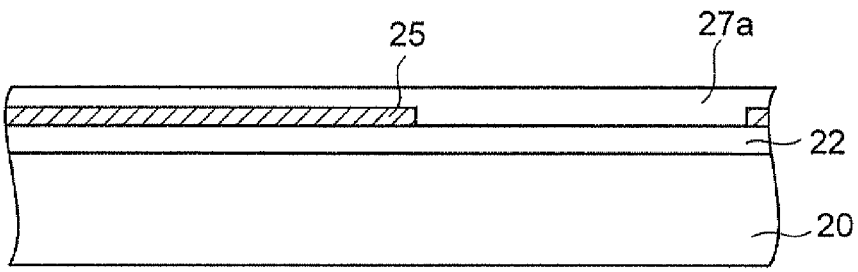

Next, as shown in FIG. 12B, after a coating film such as a polyimide resin is formed on the peelable layer 22 and the mask metal layer 25 by use of a spin coating method, printing or the like, the coating film is hardened by heat treatment at a temperature of 200 to 300 Z. Thus, a first organic insulating layer 27a having a thickness of, for example, 2 to 5 fÊm is obtained. As the first organic insulating layer 27a, besides the polyimide resin, a material which can be etched by plasma of gas consisting mainly of oxygen gas, such as a PMMA (polymethyl methacrylate) resin and an acrylic resin, is used. In this embodiment, formation of the first organic insulating layer 27a, which involves heat treatment, is performed on the glass substrate 20. Thus, a plastic film to be a substrate at the end is never thermally deformed.

Figure 12C:
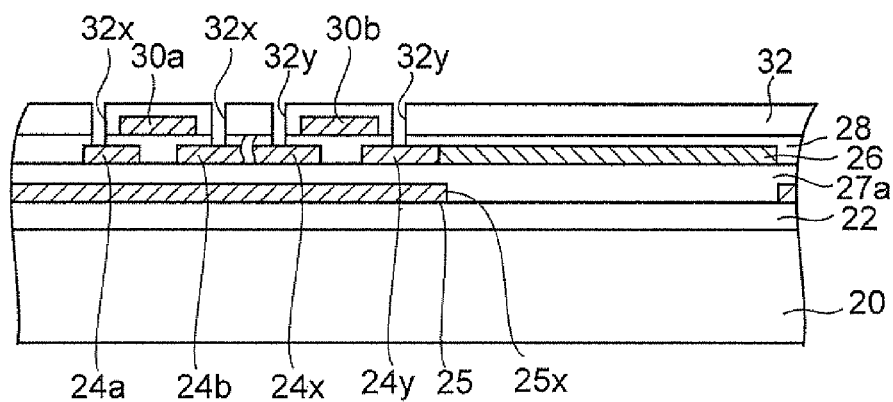

Subsequently, as shown in FIG. 12C, the steps of FIGS. 9D to 9G in the fifth embodiment are performed. Thus, as in the case of the fifth embodiment, source electrodes 24a and 24x, drain electrodes 24b and 24y, a pixel electrode 26 connected to the drain electrode 24y, a protective layer 28, gate electrodes 30a and 30b, and a gate insulating layer 32 are sequentially formed on the organic insulating layer 27a. Thereafter, first and second via holes 32x and 32y are formed, the via holes having depths that reach the source electrodes 24a and 24x and the drain electrodes 24b and 24y.

Figure 12D:
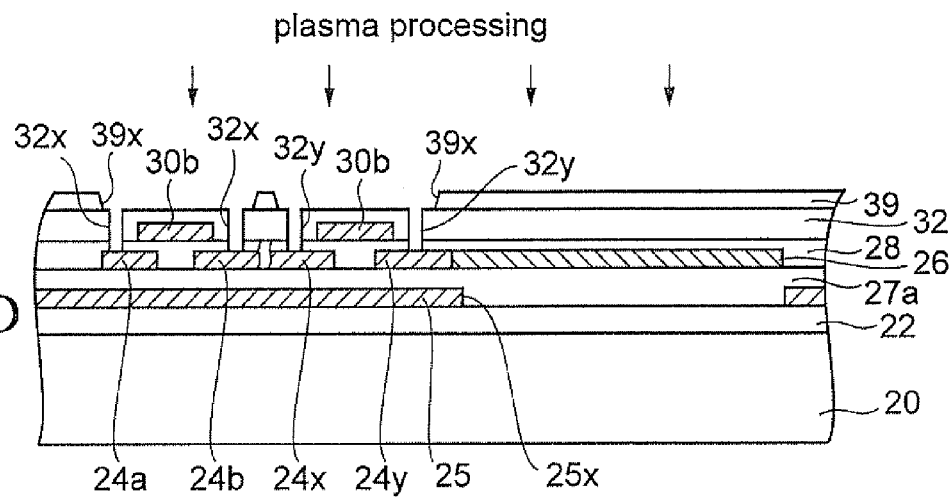

Next, as shown in FIG. 12D, a second organic insulating layer pattern 39, which has openings 39x provided in portions where organic active layers are formed, is formed on the gate insulating layer 32. The second organic insulating layer pattern 39 having the openings 39x provided therein may be formed by patterning photosensitive polyimide. Alternatively, the second organic insulating layer pattern 39 may be formed by patterning various resins (a polyimide resin, a PMMA resin or an acrylic resin) by use of the mask metal layer, as described in a step of forming a first organic resin layer pattern 27 to be described later.

Thereafter, the upper surface of the structure shown in FIG. 12D is processed by use of plasma of gas containing fluorine atoms, such as $CF_4$. Thus, a surface of the second organic insulating layer pattern 39 is set to be water-repellent, and exposed portions of the source electrodes 24a and 24x and the drain electrodes 24b and 24y exposed in the via holes 32x and 32y are set to be hydrophilic.

Figure 12E:
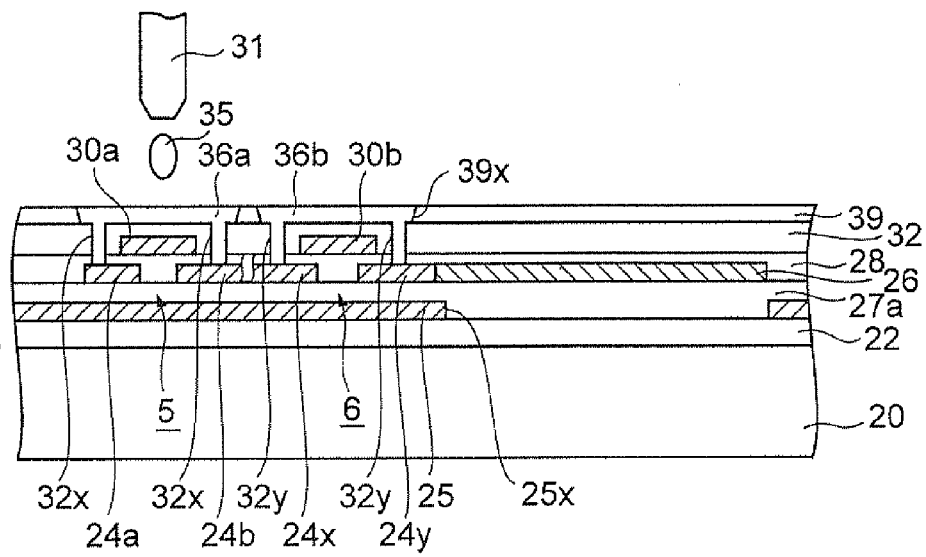

Next, as shown in FIG. 12E, a coating liquid 35 for forming organic active layers of TFTs is applied from a nozzle 31 of an ink jet apparatus (not shown) into the openings 39x of the second organic insulating layer pattern 39. Thus, coating films are formed. In this event, the coating liquid 35 fills the first and second via holes 32x and 32y and formed on the gate insulating layer 32 in the openings 39x of the second organic insulating layer pattern 39. Furthermore, the coating films are baked at a temperature of 100 to 200 Ž to be dried. Thus, an organic active layer 36a for a Sw-TFT and an organic active layer 36b for a Dr-TFT are obtained. As the coating liquid 35 for forming the organic active layers 36a and 36b, one containing an organic semiconductor material such as pentacene, sexithiophene and poly thiophene, which are described in the fifth embodiment, is used. In this event, since the surface of the second organic insulating layer pattern 39 is set to be water-repellent, even if the nozzle 31 of the ink jet apparatus is slightly shifted from the openings 39x of the second organic insulating layer pattern 39, the coating liquid 35 flows toward the openings 39x to be accumulated therein. Thus, a Sw-TFT 5 and a Dr-TFT 6 are obtained, both of which have the same structures as those of the fifth embodiment.

Figure 12F:
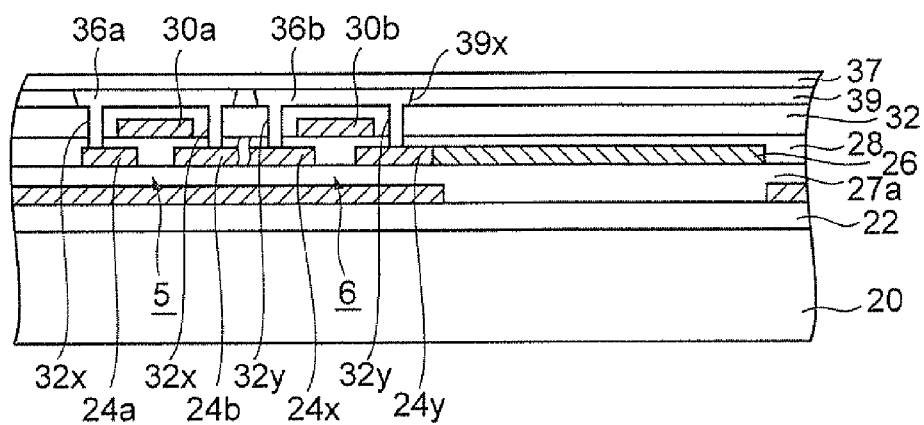

Next, as shown in FIG. 12F, a barrier insulating layer 37 is formed, the barrier insulating layer covering the organic active layers 36a and 36b, as in the case of the fifth embodiment.

Subsequently, as shown in FIG. 12G, by use of the same method as that of the fifth embodiment, a plastic film 40 is attached to an upper surface of the barrier insulating layer 37 shown in FIG. 12F with an adhesive layer 34 interposed therebetween. Thereafter, the glass substrate 20 is peeled while a roll 29 fixed to one end of the plastic film 40 is being rotated. In this event, the glass substrate 20 is peeled along an interface (the portion A in FIG. 12G) between the glass substrate 20 and the peelable layer 22, and is discarded.

Thus, as shown in FIG. 12H, on the plastic film 40, the adhesive layer 34, the barrier insulating layer 37, the organic active layers 36a and 36b and the second organic insulating layer pattern 39, the gate insulating layer 32, the gate electrodes 30a and 30b, the protective layer 28, the source electrodes 24a and 24x, the drain electrodes 24b and 24y and the pixel electrode 26, the first organic insulating layer 27a, the mask metal layer 25, and the peelable layer 22 are transferred and formed sequentially from the bottom.

Thereafter, as shown in FIG. 12I, the peelable layer 22 is removed by use of oxygen gas plasma, and the first organic insulating layer 27a is etched by using the exposed mask metal layer 25 as a mask and using the oxygen gas plasma. Thus, a first organic insulating layer pattern 27 having an opening 27x provided therein is obtained. By using oxygen gas plasma in an isotropic etching device, the first organic insulating layer 27 a (the polyimide resin or the PMMA resin) is isotropically etched from the mask metal layer 25. Thus, the first organic insulating layer pattern 27 having the opening 27x in a forward tapered shape (a shape which gets gradually wider toward its bottom) is obtained. In this embodiment, it is possible to obtain the first organic insulating layer pattern 27 having a forward tapered shape with a tapered angle ƒÆ (FIG. 12I) of 60< or less (preferably 60< to 30<).

Note that, in the case where the acrylic resin is used as the first organic insulating layer 27a, the layer is etched by use of plasma of mixed gas obtained by adding gas containing fluorine atoms, such as $CF_4$, to oxygen gas by 2 to 5%.

Figure 12J:
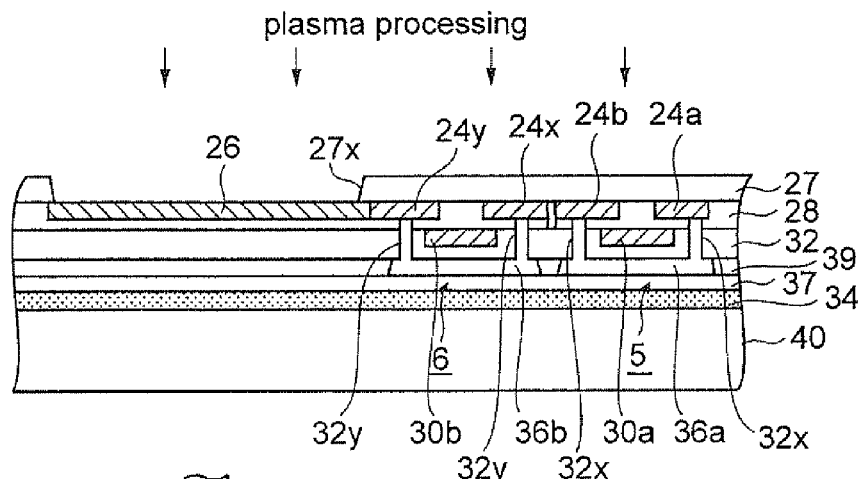

Subsequently, as shown in FIG. 12J, the mask metal layer 25 is selectively removed with respect to the underlying layer. For example, in the case where an Al layer is used as the mask metal layer 25, wet etching using a solution containing phosphoric acid is adopted. Thus, the mask metal layer 25 is removed without damaging the pixel electrode 26 and the like.

Thus, the first organic insulating layer pattern 27 having the forward tapered shape is exposed and formed in a state where the opening 27x is provided on the pixel electrode 26.

Thereafter, the upper surface of the structure shown in FIG. 12J is exposed to plasma of gas containing fluorine atoms ($CF_4$, $SF_6$, $CHF_3$ or the like). Thus, adhesion of the fluorine atoms to an upper surface and sides of the first organic insulating layer pattern 27 allows the pattern to have water repellency for repelling liquids. At the same time, the exposed surface of the pixel electrode 26 becomes hydrophilic.

Note that, in the above-described steps of patterning the first organic insulating layer 27a by use of the oxygen plasma, removing the mask metal layer 25 with chemicals, and plasma processing with fluorine gas, the organic active layers 36a and 36b exist at the bottom. However, the organic active layers 36a and 36b are protected by the pixel electrode 26, the source electrodes 24a and 24x, and the drain electrodes 24b and 24y. Thus, there is no risk that the organic active layers 36a and 36b are damaged by the processing described above.

Figure 12K:
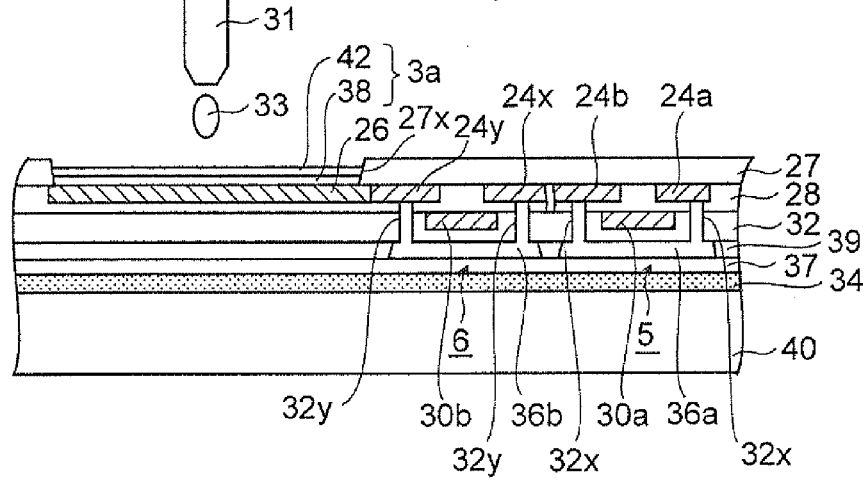

Subsequently, as shown in FIG. 12K, a coating liquid 33 of a thiophene conductive polymer (PEDOT/PSS) is applied from the nozzle 31 of the ink jet apparatus (not shown) to the surface of the pixel electrode 26 in the opening 27x of the first organic insulating layer pattern 27. Thereafter, the coating liquid is baked at a temperature of 100 to 200 Ž to be dried. Thus, a hole transport layer 38 is formed.

Furthermore, as also shown in FIG. 12K, by use of the same ink jet method, a coating liquid 33 for forming an emitting layer is applied to the hole transport layer 38 in the opening 27x of the first organic insulating layer pattern 27. Thereafter, the coating liquid is baked at a temperature of 100 to 200 Ž to be dried. Thus, an emitting layer 42 is formed. Note that, although FIG. 12K shows only one pixel part, as in the case of the fifth embodiment, a red emitting layer, a green emitting layer and a blue emitting layer are formed, respectively, on the hole transport layers 38 in the respective pixel parts (R), (G) and (B) of the three primary colors.

As materials of the emitting layers for forming the emitting layers of the three primary colors, there are a fl-conjugated polymer emitting material and a pigment" containing polymer emitting material To be more specific, as the fl-conjugated polymer emitting material, there are polyfluorene (PF) dielectrics (red, green and blue), poly-spiro dielectrics (red, green and blue), polyparaphenylene dielectrics, polythiophene dielectrics, and the like.

Meanwhile, as the pigment-containing polymer emitting material, there are: a pigment dispersion PVK (red, green and blue) that is an emitting material obtained by dispersing a phosphorescent or fluorescent low "molecular-weight pigment in polyvinylcarbazole (PVK); and a side-chain integration PVK (red, green and blue) that is a phosphorescent polymer in which a phosphorescent base such as Ir(ppy)$_3$ is integrated with a side chain of PVK.

The materials described above are dissolved in a solvent such as xylene, toluene, chloroform, anisole, tetradecane, dichloroethane, chlorobenzene, benzene and dichlorobenzene. Accordingly, coating liquids (ink) for forming the emitting layers of the respective colors are prepared.

Thus, an organic EL layer 3a is obtained, the organic EL layer including the hole transport layer 38 and the emitting layer 42. Note that, as in the case of the fifth embodiment, an electron transport layer may be further formed on the emitting layer 42 or only one of the hole transport layer 38 and the electron transport layer may be formed. Alternatively, both of the hole transport layer 38 and the electron transport layer may be omitted.

In the seventh embodiment, the organic EL layer 3a is formed by use of the ink jet method. Thus, as in the case of the fifth embodiment, there is no risk that performance of the organic EL layer 3a is deteriorated by various processing in the photolithography step.

Moreover, when the hole transport layer 38 and the emitting layer 42 are formed by use of the ink jet method, since the surface of the first organic insulating layer pattern 27 is set to be water-repellent, the hole transport layer 38 and the emitting layer 42 are formed so as to be positioned in a self-alignment manner in the opening 27x of the first organic insulating layer pattern 27.

Note that the organic EL layer 3a may be formed by screen printing instead of the ink jet method.

Figure 12L:
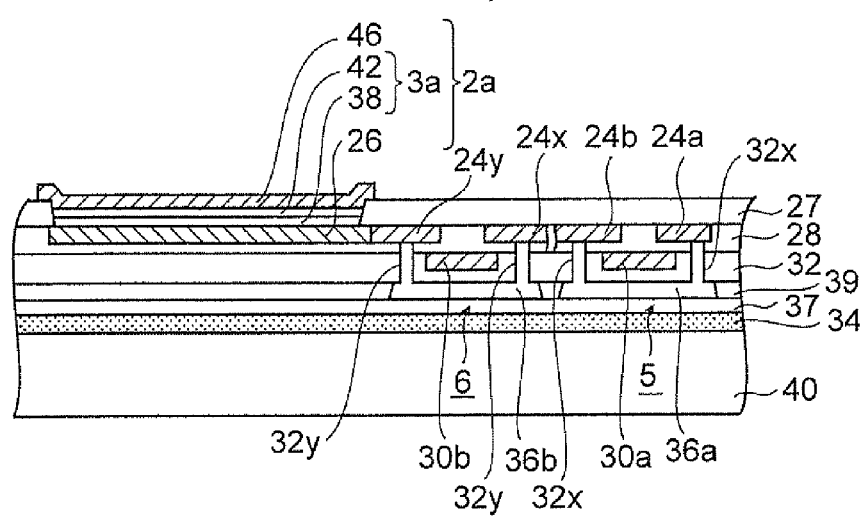

Next, as shown in FIG. 12L, a metal electrode 46, such as a calcium/aluminum (Ca/Al) laminated film, a barium (Ba) film and a barium/aluminum (Ba/Al) laminated film, is formed on the emitting layer 42 by mask vapor deposition. Thus, an organic EL element 2a is obtained, the organic EL element including the pixel electrode 26, the organic EL layer 3a and the metal electrode 46. Note that, since the first organic insulating layer pattern 27 is formed on the Sw-TFT 5 and the Dr-TFT 6, the metal electrode 46 may be formed on the entire surface.

Thereafter, as shown in FIG. 13, a sealing layer 48 which covers the organic EL element 2a is formed, as in the case of the fifth embodiment.

Thus, a flexible organic EL display if of the seventh embodiment is completed.

As shown in FIG. 13, in the flexible organic EL display if of the seventh embodiment, the plastic film 40 is used as a substrate, and the barrier insulating layer 37 is formed thereon with the adhesive layer 34 interposed therebetween. Moreover, in the openings 39x of the second organic insulating layer pattern 39 on the barrier insulating layer 37, the organic active layer 36a of the Sw-TFT 5 and the organic active layer 36b of the Dr-TFT 6 are formed. The second organic insulating layer pattern 39 functions as a partition wall in formation of the organic active layers 36a and 36b by use of the ink jet method. Accordingly, the organic active layers 36a and 36b are disposed with high alignment accuracy. On the respective organic active layers 36a and 36b, the gate insulating layer 32, the gate electrode 30a of the Sw-TFT 5 and the gate electrode 30b of the Dr-TFT 6 are sequentially formed. Moreover, on the respective gate electrodes 30a and 30b, the protective layer 28 is formed.

On the protective layer 28, formed are the source and drain electrodes 24a and 24b for the Sw-TFT 5, the source and drain electrodes 24x and 24y for the Dr-TFT 6, and the pixel electrode 26 electrically connected to the drain electrode 24y for the Dr-TFT 6. Furthermore, the respective organic active layers 36a and 36b are electrically connected to the source electrodes 24a and 24x and the drain electrodes 24b and 24y, respectively, through the first and second via holes 32x and 32y provided in the gate insulating layer 32 and the protective layer 28.

Thus, as in the case of the fifth embodiment, the Sw-TFT 5 and the Dr-TFT 6 are formed, the TFTs including the source electrodes 24a and 24x, the drain electrodes 24b and 24y, the gate electrodes 30a and 30b, the gate insulating layer 32, and the organic active layers 36a and 36b.

Furthermore, the first organic insulating layer pattern 27 having the opening 27x provided on the pixel electrode 26 is formed above the Sw-TFT 5 and the Dr-TFT 6. The first organic insulating layer pattern 27 is formed to have a forward tapered shape with a tapered angle of 60< or less, and has a water-repellent surface.

Moreover, on the pixel electrode 26 in the opening 27x of the first organic insulating layer pattern 27, the hole transport layer 38 and the emitting layer 42 are formed. As in the case of FIG. 10 of the fifth embodiment, a plurality of the pixel electrodes 26 are set in a red (R) pixel part, a green (G) pixel part and a blue (B) pixel part. Moreover, red, green and blue emitting layers (not shown) are formed so as to correspond to the pixel parts of the respective colors. Furthermore, the hole transport layer 38 and the emitting layer 42 form the organic EL layer 3a. The organic EL layer 3a is formed with high accuracy in each of the pixel parts of the three primary colors while being defined by the first organic insulating layer pattern 27 which functions as a partition wall in formation of the layer by use of the ink jet method.

Moreover, the metal electrode 46 is formed on the organic EL layer 3a, and the organic EL element 2a is formed of the pixel electrode 26, the organic EL layer 3a and the metal electrode 46. Furthermore, the sealing layer 48 which covers the organic EL element 2a is formed.

The flexible organic EL display If of the seventh embodiment has the configuration as described above. As in the case of the fifth embodiment, lights of predetermined colors are emitted to the outside from the emitting layers 42 of the respective colors. Thus, a color image is obtained (the direction indicated by the arrows in FIG. 13).

In the seventh embodiment, as in the case of the fifth embodiment, a patterning step (the step of forming the source electrodes 24a and 24x, the drain electrodes 24b and 24y, the pixel electrode 26, the gate electrodes 30a and 30b, and the via holes 32x and 32y) by photolithography which adversely affects the organic active layers 36a and 36b and the organic EL layer 3a is performed on the glass substrate 20 before the organic active layers 36a and 36b and the organic EL layer 3a are formed. Furthermore, after the organic active layers 36a and 36b, which are connected to the source electrodes 24a and 24x and the drain electrodes 24b and 24y, are formed on the glass substrate 20 by use of the ink jet method, the barrier insulating layer 37 which covers the organic active layers 36a and 36b is formed. Thus, a transfer layer is obtained. Subsequently, after the transfer layer is transferred in a state of being inverted upside down on the plastic film 40, the organic EL layer 3a is formed on the pixel electrode 26 by use of the ink jet method. Therefore, as in the case of the fifth embodiment, there is no longer a risk that the organic active layers 36a and 36b and the organic EL layer 3a are deteriorated by various processing in the photolithography step.

As described above, in the seventh embodiment, as in the case of the fifth embodiment, it is made possible to stably manufacture, with high yield, a flexible organic EL display which uses a plastic film as a substrate and includes organic TFTs.

Eighth Embodiment

FIGS. 14A to 14J are cross-sectional views showing a method of manufacturing a flexible display according to an eighth embodiment of the present invention. FIG. 15 is a cross sectional view showing a flexible display according to the eighth embodiment of the present invention.

The eighth embodiment is different from the fifth embodiment in having a different TFT structure. In FIGS. 14A to 14J and FIG. 15, the same components as those of the fifth embodiment are denoted by the same reference numerals, and detailed description of materials and formation methods thereof will be omitted.

Figure 14A:
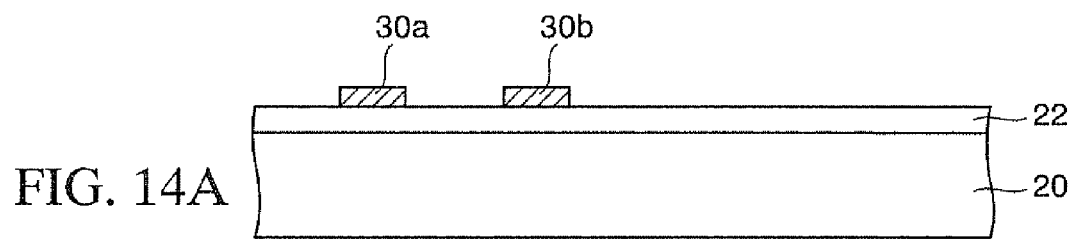
FIGS. 14A to 14J are cross-sectional views showing a method of manufacturing a flexible display according to an eighth embodiment of the present invention.
Figure 14B:
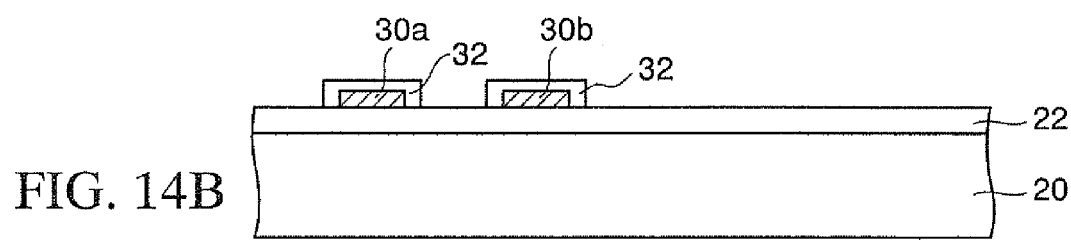
Figure 15:
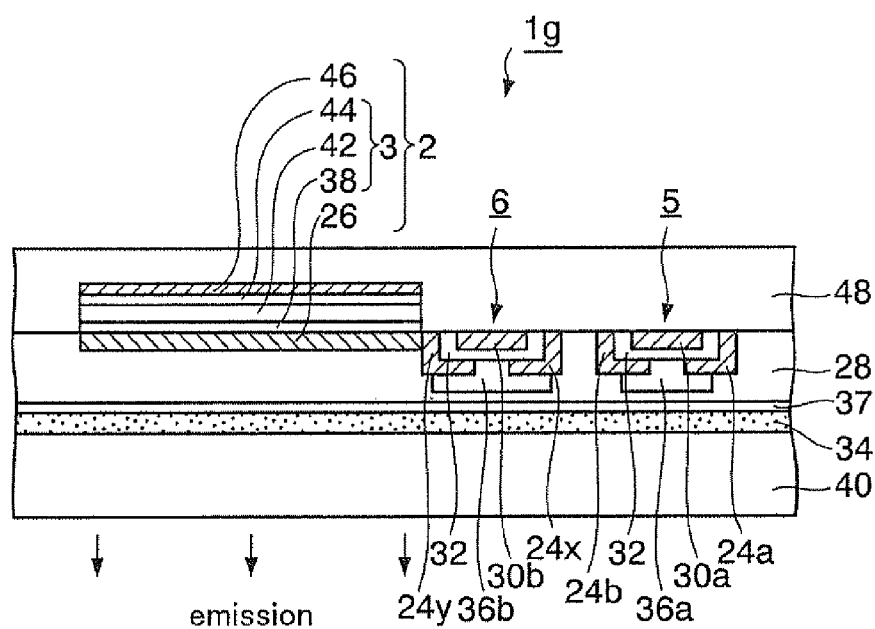
FIG. 15 is a cross-sectional view showing a flexible display according to the eighth embodiment of the present invention.

In the method of manufacturing a flexible display according to the eighth embodiment of the present invention, as shown in FIG. 14A, first, a peelable layer 22 is formed on a glass substrate 20 by use of the same method as that of the fifth embodiment. Thereafter, a gate electrode 30a for a Sw-TFT and a gate electrode 30b for a Dr-TFT are formed. Subsequently, as shown in FIG. 14B, gate insulating layers 32 are formed, the gate insulating layers covering upper surfaces and sides of the gate electrodes 30a and 30b.

Figure 14C:
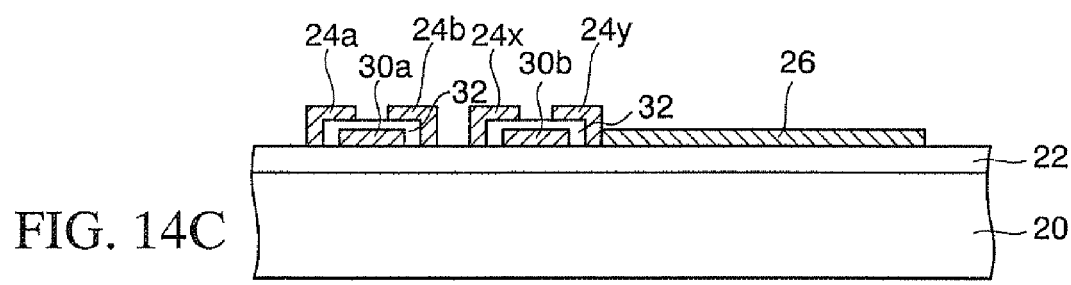

Subsequently, as shown in FIG. 14C, source and drain electrodes 24a and 24b for the Sw-TFT and source and drain electrodes 24x and 24y for the Dr-TFT are formed on the respective gate insulating layers 32 so as to be extended to sides of the gate insulating layers 32 from both ends thereof. Furthermore, a pixel electrode 26 electrically connected to the drain electrode 24y for the Dr-TFT is formed on the peelable layer 22.

Figure 14D:
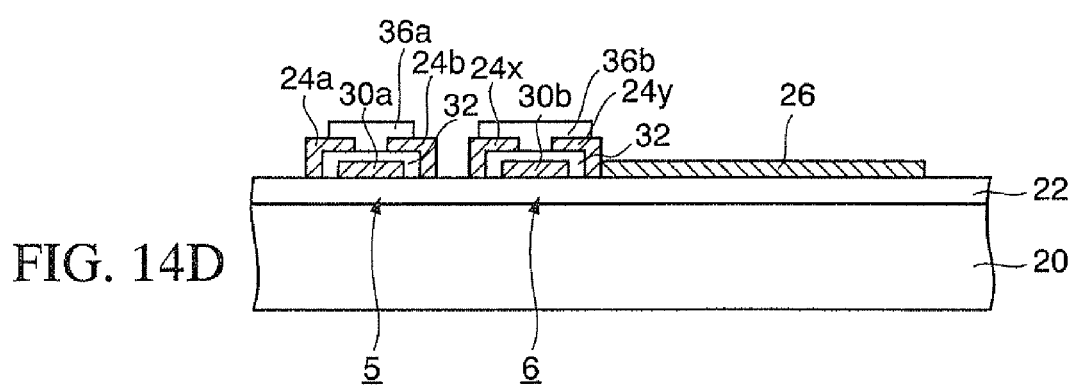

Next, as shown in FIG. 14D, an organic active layer 36a for the Sw-TFT, which is electrically connected to the source and drain electrodes 24a and 24b for the SW-TFT, is formed on the source and drain electrodes 24a and 24b. At the same time, an organic active layer 36b for the Dr-TFT, which is electrically connected to the source and drain electrodes 24x and 24y for the Dr-TFT, is formed on the source and drain electrodes 24x and 24y. As in the case of the fifth embodiment, the organic active layers 36a and 36b are formed by mask vapor deposition. Thus, there is no risk that performance of the organic active layers 36a and 36b is deteriorated by wet processing, plasma and the like in the photolithography step.

Accordingly, a Sw-TFT 5 is obtained, the Sw-TFT including the gate electrode 30a, the gate insulating layer 32, the source electrode 24a, the drain electrode 24b and the organic active layer 36a connected to the source and drain electrodes 24a and 24b. Moreover, a Dr-TFT 6 is obtained, the Dr-TFT including the gate electrode 30b, the gate insulating layer 32, the source electrode 24x, the drain electrode 24y and the organic active layer 36b connected to the source and drain electrodes 24x and 24y.

Figure 14E:
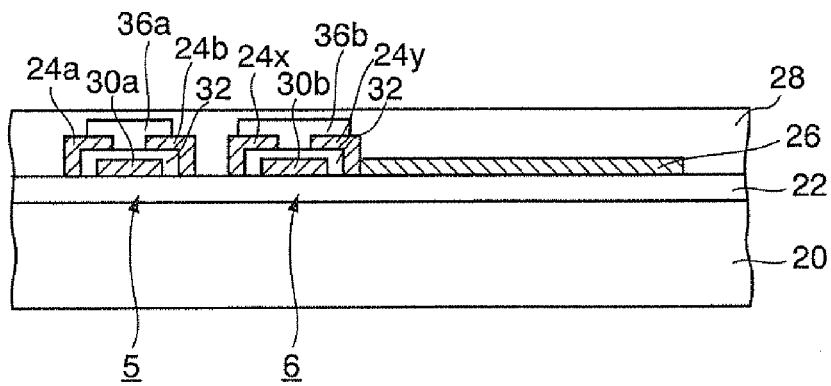
Figure 14F:
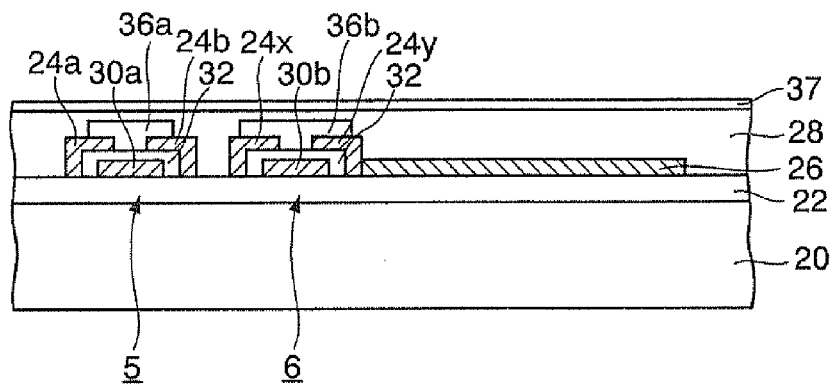

Next, as shown in FIGS. 14E and 14F, a protective layer 28 is formed on the Sw-TFT 5 and the Dr-TFT 6 to fill in gaps and obtain a flat surface. Thereafter, a barrier insulating layer 37 is formed on the protective layer 28.

Figure 14G:
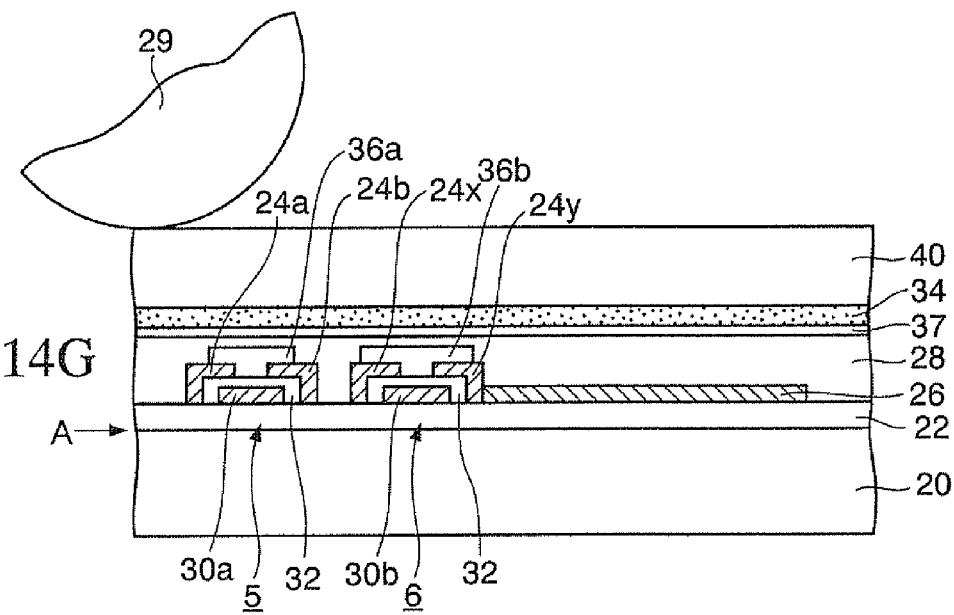

Subsequently, as shown in FIG. 14G, a plastic film 40 is attached to an upper surface of the barrier insulating layer 37 shown in FIG. 14F with an adhesive layer 34 interposed therebetween. Subsequently, as also shown in FIG. 14G, a roll 29 is fixed to one end of the plastic film 40, and the glass substrate 20 is peeled while the roll 29 is rotated. In this event, the glass substrate 20 is peeled along an interface (the portion A in FIG. 14G) between the glass substrate 20 and the peelable layer 22, and is discarded.

Figure 14H:
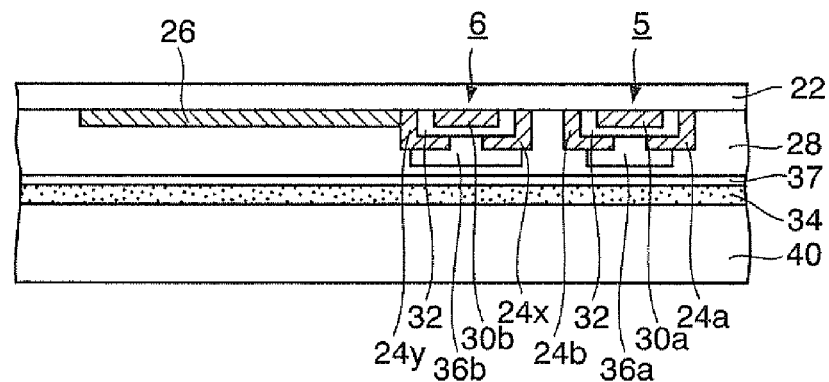

Thus, as shown in FIG. 14H, on the plastic film 40, the adhesive layer 34, the barrier insulating layer 37, the protective layer 28, the organic active layers 36a and 36b, the source electrodes 24a and 24x and the drain electrodes 24b and 24y, the gate insulating layer 32, the gate electrodes 30a and 30b, the pixel electrode 26 connected to the drain electrode 24y of the Dr-TFT 6, and the peelable layer 22 are transferred and formed sequentially from the bottom in a state of being inverted upside down.

Figure 14I:
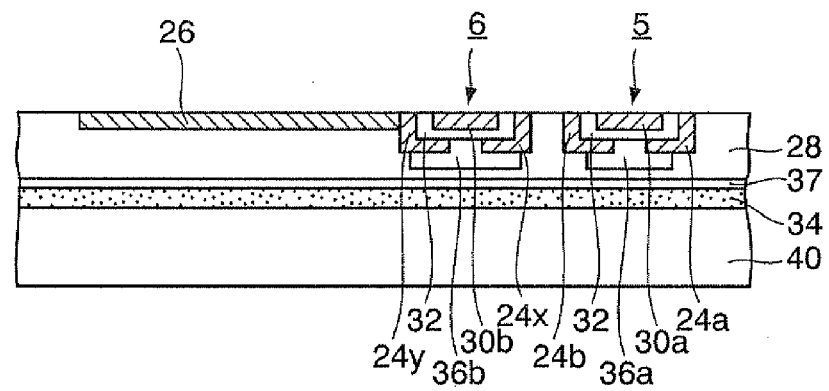

Thereafter, as shown in FIG. 14I, the peelable layer 22 is removed to expose upper surfaces of the gate electrodes 30a and 30b and the pixel electrode 26.

Also in the eighth embodiment, adopted is the method of transferring and forming the respective TFTs 5 and 6 in a state of being inverted upside down on the plastic film 40 after the TFTs are formed to have a structure in which the organic active layers 36a and 36b are disposed on the upper side on the glass substrate 20. Therefore, the organic active layers 36a and 36b are never exposed to the upper side of the plastic film 40 but are set in a state of being buried in the bottom. Thus, there is no longer a risk that the organic active layers 36a and 36b are damaged by the subsequent various processing steps.

Figure 14J:
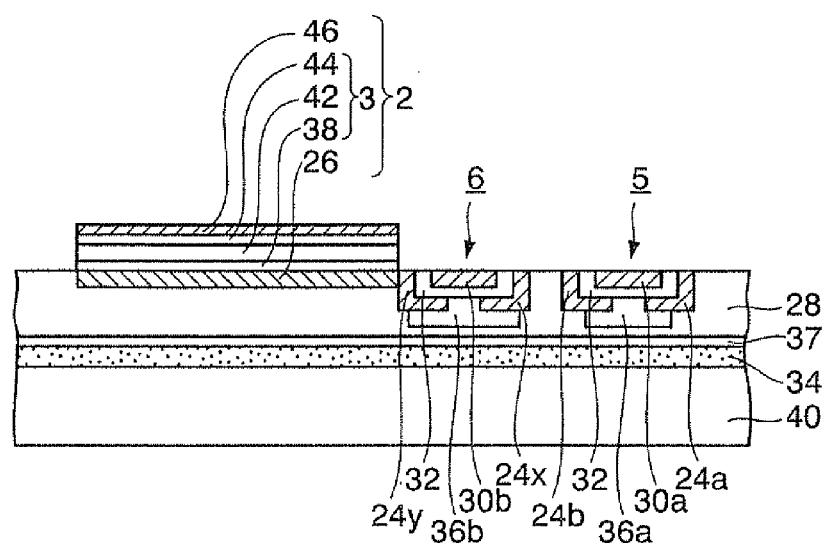

Subsequently, as shown in FIG. 14J, a hole transport layer 38, an emitting layer 42, an electron transport layer 44 and a metal electrode 46 are sequentially formed on the pixel electrode 26 by mask vapor deposition. Thus, an organic EL layer 3 is obtained, the organic EL layer including the hole transport layer 38, the emitting layer 42 and the electron transport layer 44. At the same time, an organic EL element 2 is obtained, the organic EL element including the pixel electrode 26, the organic EL layer 3 and the metal electrode 46.

As described above, in this embodiment, photolithography is not used in the step of forming the organic active layers 36a and 36b and the organic EL layer 3 and in the subsequent steps. Thus, there is no risk that performance of the organic active layers 36a and 36b and the organic EL layer 3 is deteriorated by various processing in the photolithography step.

Thereafter, as shown in FIG. 15, a sealing layer 48 is formed, the sealing layer covering the organic EL element 2, the SW-TFT 5 and the Dr-TFT 6. Accordingly, a flexible organic EL display 19 according to the eighth embodiment of the present invention is completed.

As shown in FIG. 15, in the flexible display 19 of the eighth embodiment, the adhesive layer 34, the barrier insulating layer 37 and the protective layer 28 are sequentially formed on the plastic film 40. In the protective layer 28, the SW-TFT 5 and the Dr-TFT 6 are buried and formed. The SW-TFT 5 and the Dr-TFT 6 have configurations in which the organic active layers 36a and 36b, the source electrodes 24a and 24x and the drain electrodes 24b and 24y, the gate insulating layers 32, and the gate electrodes 30a and 30b are sequentially formed from the bottom.

The source electrodes 24a and 24x and the drain electrodes 24b and 24y are formed so as to be extended upward from between both ends of the organic active layers 36a and 36b and the gate insulating layers 32, respectively. Furthermore, the pixel electrode 26 electrically connected to the drain electrode 24y of the Dr-TFT 6 is buried in the protective layer 28. Accordingly, respective upper surfaces of the gate electrodes 30a and 30b and the pixel electrode 26 are set to be the same surface as the upper surface of the protective layer 28.

Moreover, as in the case of the fifth embodiment, the organic EL layer 3 is formed on the pixel electrode 26, and the metal electrode 46 is formed thereon. Thus, the organic EL element 2 is formed. Furthermore, the organic EL element 2 is covered with the sealing layer 48.

Also in the eighth embodiment, a full•color display may be realized by using emitting layers of three primary colors as in the case of the fifth embodiment or by using white emitting layers and combining color filters as in the case of the sixth embodiment.

Moreover, as in the case of the seventh embodiment, the organic active layers and the organic EL layers may be formed by use of the ink jet method or printing. In the case where the organic active layers 36a and 36b are formed by use of the ink jet method, an organic insulating layer having openings provided in portions where those layers are formed may be formed before the organic active layers 36a and 36b are formed, as in the case of the seventh embodiment. Moreover, if the organic EL layer 3 is formed by use of the ink jet method, as in the case of the seventh embodiment, after the peelable layer 22 is formed (before the gate electrodes 30a and 30b are formed), an organic insulating layer is formed after formation of a mask metal layer including an opening in a region where a pixel electrode is formed. Subsequently, after transferring onto a plastic film, the organic insulating layer may be patterned by using the mask metal layer as a mask.

In the eighth embodiment, the structures of the TFTs 5 and 6 are different from those of the fifth embodiment. However, the eighth embodiment achieves the same effects as those of the fifth embodiment.

Ninth Embodiment

FIGS. 16A to 16K are cross•sectional views sequentially showing a method of manufacturing a flexible display according to a ninth embodiment of the present invention. FIG. 17 is a cross-sectional view showing a flexible display (a liquid crystal display) according to the ninth embodiment of the present invention. In the ninth embodiment, the case of applying the present invention to a liquid crystal display will be described as an example. In the ninth embodiment, detailed description of the same steps as those of the fifth embodiment will be omitted. Moreover, the same components as those of the fifth embodiment are denoted by the same reference numerals, and description thereof will be omitted.

Figure 16A:
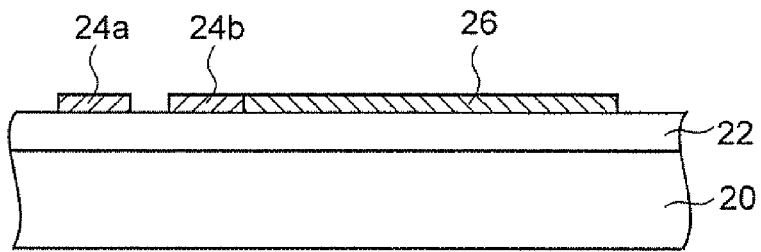
FIGS. 16A to 16K are cross-sectional views showing a method of manufacturing a flexible display according to a ninth embodiment of the present invention.
Figure 17:
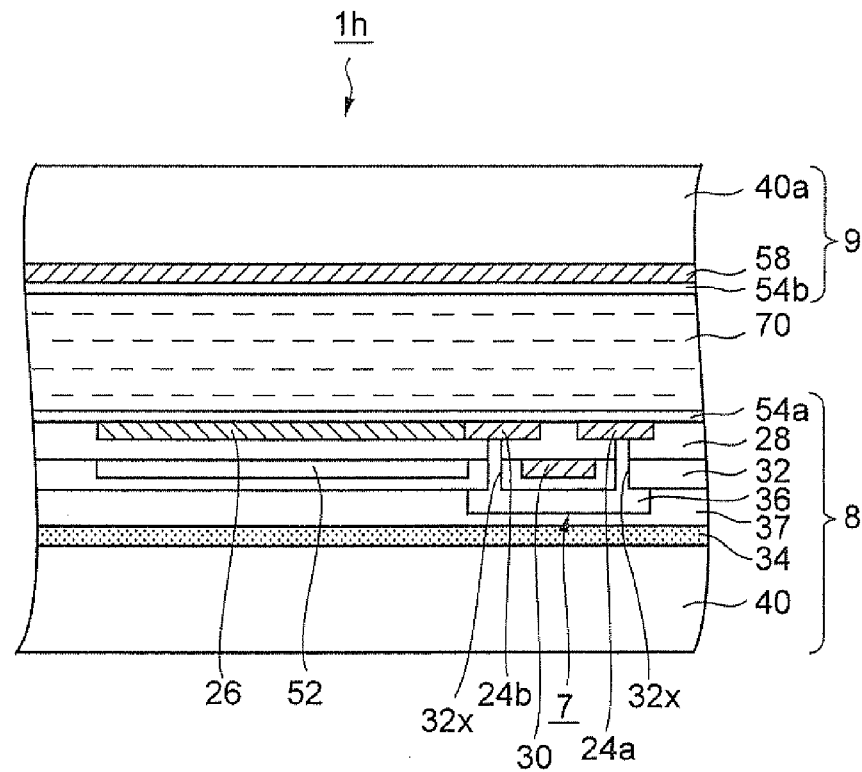
FIG. 17 is a cross-sectional view showing a flexible display (a liquid crystal display) according to the ninth embodiment of the present invention.

In the method of manufacturing a flexible display according to the ninth embodiment of the present invention, as shown in FIG. 16A, first, a peelable layer 22 is formed on a glass substrate 20 as a temporary substrate. Thereafter, source and drain electrodes 24a and 24b of a TFT for switching are formed on the peelable layer 22. Subsequently, a pixel electrode 26, which is electrically connected to the drain electrode 24b and is made of ITO or the like, is formed on the peelable layer 22.

Figure 16B:
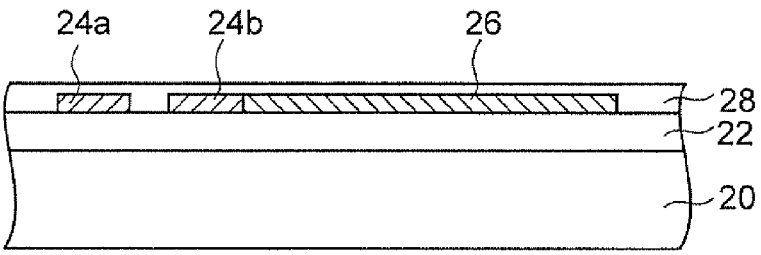
Figure 16C:
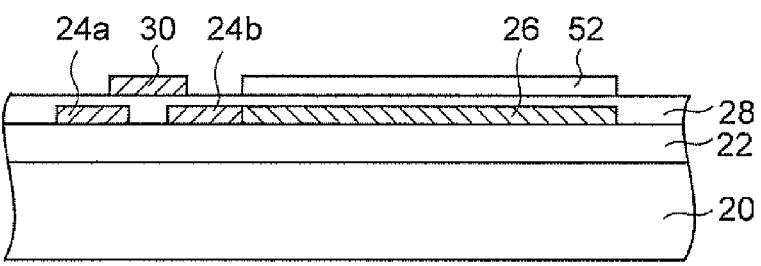

Next, as shown in FIG. 16B, a protective layer 28 is formed, the protective layer covering the source electrode 24a, the drain electrode 24b and the pixel electrode 26. Thereafter, as shown in FIG. 16C, a gate electrode 30 for the TFT, which is the same as that of the fifth embodiment, is formed on the protective layer 28 above a space between the source and drain electrodes 24a and 24b so as to overlap above ends thereof. Subsequently, a color filter layer 52 corresponding to the pixel electrode 26 is formed on the protective layer 28. In this embodiment, description is given of the case where a full•color display is realized by using the color filter layer 52, as an example. Although FIG. 16C shows only one pixel part, a red (R) color filter layer, a green (G) color filter layer and a blue (B) color filter layer are formed, respectively, above the respective pixel electrodes 26 in respective pixel parts (R), (G) and (B) of the three primary colors as shown in FIG. 10 of the fifth embodiment. The pixel parts (subpixels) of the three primary colors form a pixel that is a display unit. The respective color filter layers 52 of the three primary colors are formed by sequentially patterning photosensitive coating films of a pigment dispersion type, for example, by photolithography.

Figure 16D:
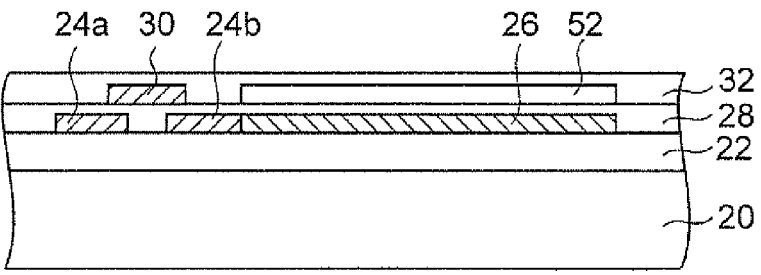
Figure 16E:
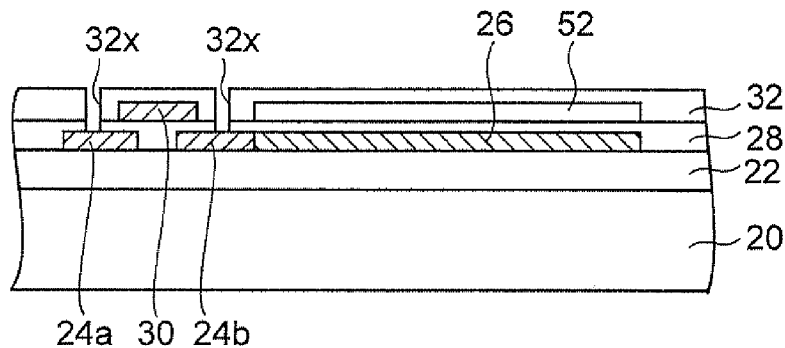
Figure 16F:
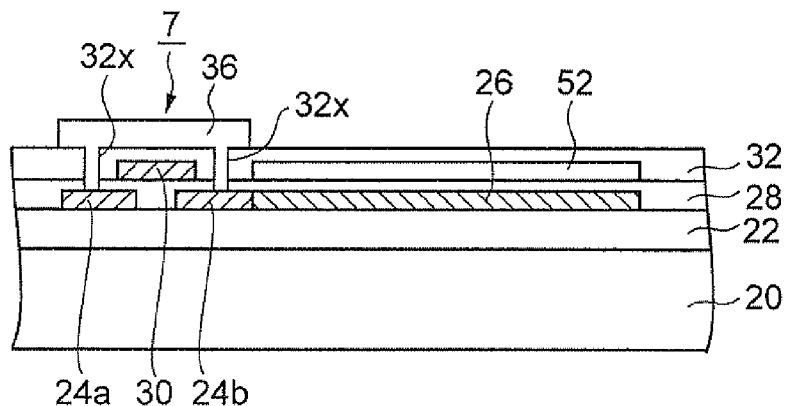

Subsequently, as shown in FIG. 16D, a gate insulating layer 32, which covers the gate electrode 30 and the color filter layer 52, is formed. Next, as shown in FIG. 16E, via holes 32x are formed in portions of the protective layer 28 and the gate insulating layer 32 on the source and drain electrodes 24a and 24b. Furthermore, as shown in FIG. 16F, as in the case of the fifth embodiment, an organic active layer is formed by mask vapor deposition, the organic active layer connected to the source and drain electrodes 24a and 24b through the via holes 32x. As in the case of the sixth embodiment, an organic insulating layer pattern having an opening provided therein may be formed to form the organic active layer 36 in the opening by use of the ink jet method.

Thus, a TFT 7 for switching is obtained, the TFT including the gate electrode 30, the gate insulating layer 28, the source electrode 24a, the drain electrode 24b and the organic active layer 36. Thereafter, as shown in FIG. 16G, a barrier insulating layer 37 which covers the organic active layer 36 is formed.

Figure 16G:
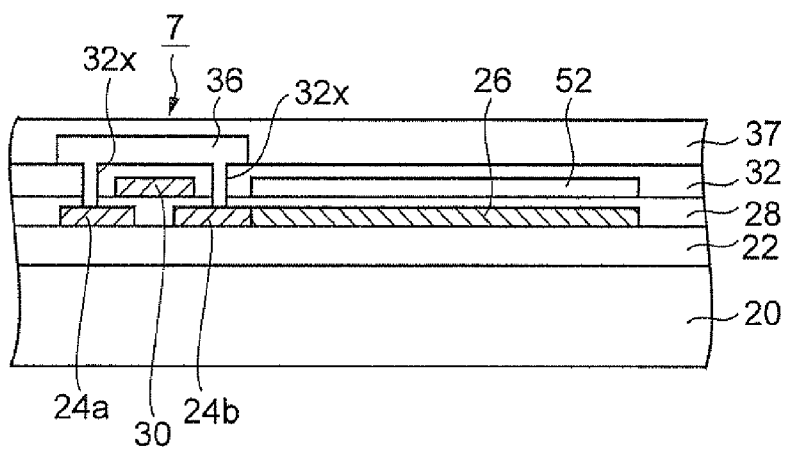
Figure 16H:
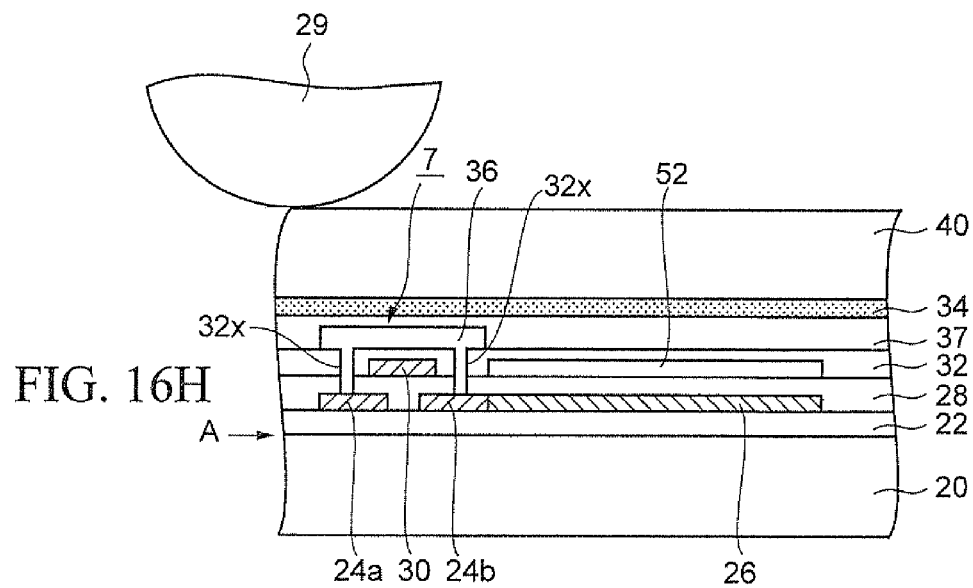

Next, as shown in FIG. 16H, a first plastic film 40 is attached to the barrier insulating layer 37 shown in FIG. 16G with the adhesive layer 34 interposed therebetween. Thereafter, the glass substrate 20 is peeled while a roll 29 fixed to one end of the first plastic film 40 is being rotated. In this event, the glass substrate 20 is peeled along an interface (the portion A in FIG. 16H) between the glass substrate 20 and the peelable layer 22, and is discarded.

Figure 16I:
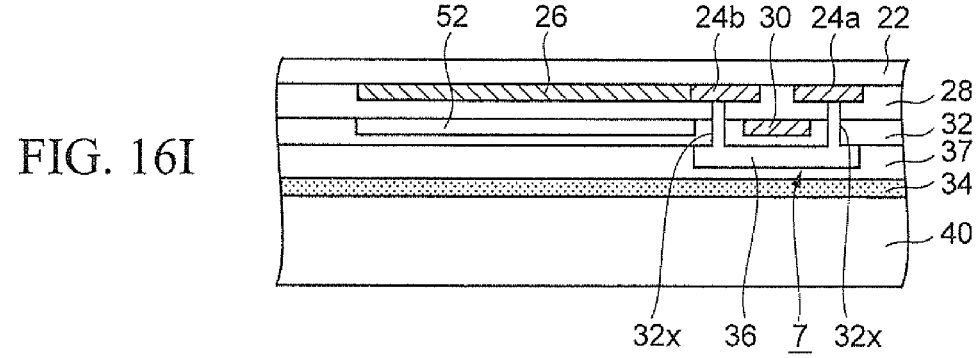

Thus, as shown in FIG. 16I, on the first plastic film 40, the adhesive layer 34, the barrier insulating layer 37, the organic active layer 36, the gate insulating layer 32, the gate electrode 30 and the color filter layer 52, the protective layer 28, the source and drain electrodes 24a and 24b and the pixel electrode 26, and the peelable layer 22 are transferred and formed sequentially from the bottom.

Figure 16J:
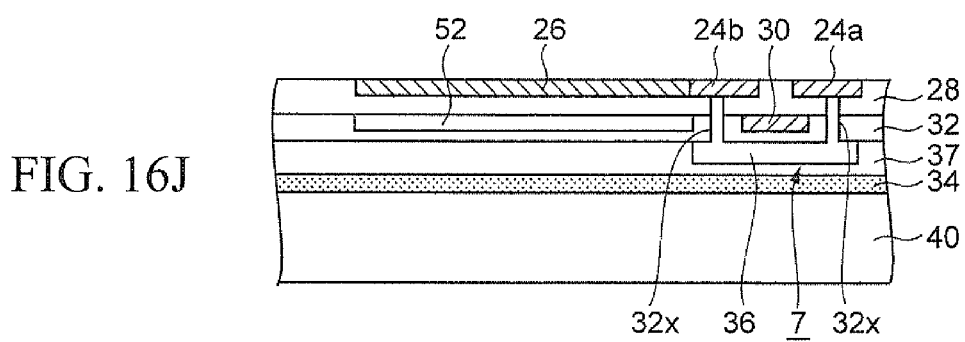

Next, as shown in FIG. 16J, by removing the peelable layer 22, upper surfaces of the source electrode 24a, the drain electrode 24b and the pixel electrode 26 are exposed.

Figure 16K:
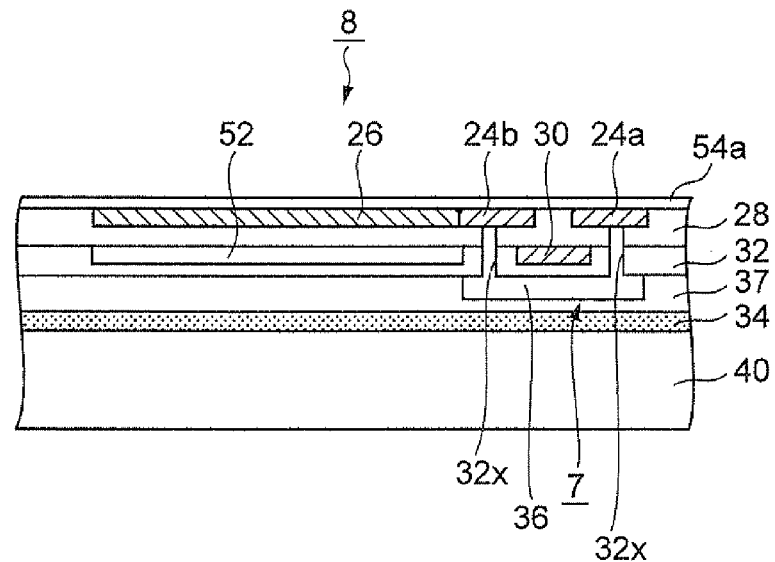

Thereafter, as shown in FIG. 16K, an alignment film 54a for aligning liquid crystal is formed on the source electrode 24a, the drain electrode 24b and the pixel electrode 26. Thus, a TFT substrate 8 for a flexible liquid crystal display is obtained.

As shown in FIG. 16K, in the TFT substrate 8 for the flexible liquid crystal display, the first plastic film 40 is used as a substrate, and the adhesive layer 34 and the barrier insulating layer 37 are sequentially formed thereon. On the barrier insulating layer 37, the organic active layer 36 and the gate insulating layer 32 for the TFT are sequentially formed.

Moreover, the gate electrode 30 for the TFT and the color filter layer 52 are formed on the gate insulating layer 32, and the protective layer 28 is formed thereon. Furthermore, the source and drain electrodes 24a and 24b for the TFT and the pixel electrode 26 connected to the drain electrode 24b are formed on the protective layer 28, and the alignment film 54a is provided thereon.

Next, as shown in FIG. 17, a counter substrate 9 for the TFT substrate 8 is prepared. The counter substrate 9 is basically formed of a second plastic film 40a, a common electrode 58 which is formed thereon and made of ITO or the like, and an alignment film 54b formed thereon. In a state where a predetermined space is secured, by use of a spacer, between the TFT substrate 8 and the counter substrate 9, the both substrates are attached so as to face each other by use of a seal member (not shown) which is provided in a peripheral part. Furthermore, liquid crystal 70 is sealed between the TFT substrate 8 and the counter substrate 9.

Thus, a flexible liquid crystal display 1h of the ninth embodiment is completed.

Note that a TFT substrate including TFTs obtained by use of the manufacturing method of the eighth embodiment described above may be used. Moreover, the color filter layer 52 may be formed at any stage as long as the layer is formed before the organic active layer 36 is formed after the pixel electrode 26 is formed. Therefore, the color filter layer 52 may be provided between the gate insulating layer 32 and the barrier insulating layer 37. Alternatively, the color filter layer 52 may be provided in the counter substrate 9.

Although not particularly shown in the drawings, a data bus line is connected to the source electrode 24a of the TFT 7, and a gate bus line is connected to the gate electrode 30 of the TFT 7. At a predetermined timing, a gradation voltage is sequentially applied to the pixel electrode 26 of each pixel from the gate bus line and the data bus line through the TFT 7. Thus, an image is displayed.

Also in the ninth embodiment, as in the case of the fifth embodiment, it is not required to perform a photolithography step after the organic active layer 36 is formed. Thus, there is no longer a risk that performance of the organic active layer 36 is deteriorated by various processing in the photolithography step.

Moreover, a main part of the organic active layer 36 is buried in and provided on the plastic film 40 which is relatively distant from the liquid crystal 70 through the source electrode 24a, the drain electrode 24b, the protective layer 28, the gate electrode 30 and the gate insulating layer 32. Thus, it is possible to prevent deterioration in characteristics due to influence of the liquid crystal 70. Furthermore, the barrier insulating layer 37 is formed below the organic active layer 36 (on the plastic film). Thus, water vapor from the outside air and moisture in the plastic film 40 are prevented from entering the organic active layer 36 and the liquid crystal 70.

Consequently, deterioration in performance of the organic active layer 36 and the liquid crystal 70 is prevented, and reliability of a flexible liquid crystal display including organic TFTs can be improved. As described above, in the ninth embodiment, it is made possible to stably manufacture, with high yield, an active matrix flexible liquid crystal display which uses an element substrate having organic TFTs formed on a plastic film.

Note that the present invention can also be applied to a flexible electrophoretic display, besides the flexible organic EL display and the liquid crystal display.

What is claimed is:

1. An active matrix flexible display in which a TFT is provided for each pixel, comprising:

a TFT substrate including a first plastic film, an adhesive layer formed on the first plastic film, a protective layer formed on the adhesive layer, a gate electrode for the TFT, which is buried in the protective layer so that the gate electrode is in direct contact with the protective layer and is in a state such that an upper surface portion of the gate electrode and an upper surface portion of the protective layer are arranged at an identical height position relative to the plastic film and constitute an identical surface, wherein the protective layer is located between a lower surface portion of the gate electrode and the adhesive layer and wherein the upper surface portion of the gate electrode and the upper surface portion of the protective layer face away from the plastic film and the adhesive layer, a gate insulating layer for the TFT, which covers the gate electrode and contacts the gate electrode only at the upper surface portion of the gate electrode, source and drain electrodes for the TFT, which are formed on the gate insulating layer and disposed at predetermined intervals on the gate electrode, a pixel electrode which is formed on the gate insulating layer and is electrically connected to the drain electrode, an organic active layer for the TFT, which is formed on a space between the source and drain electrodes and is electrically connected to the source and drain electrodes, and a first alignment film formed above the pixel electrode and the organic active layer;

a counter substrate including a second plastic film, a common electrode formed on the second plastic film, and a second alignment film formed on the common electrode; and liquid crystal sealed between the TFT substrate and the counter substrate.

2. The flexible display according to claim 1, wherein a color filter layer is further formed between the adhesive layer and the protective layer.

3. An active matrix flexible display in which a TFT is provided for each pixel, comprising:

a TFT substrate including a first plastic film, an adhesive layer formed on and directly in contact with the first plastic film, a barrier insulating layer formed on and directly in contact with the adhesive layer, a TFT which is formed on or above the barrier insulating layer and has a structure in which an organic active layer, a gate insulating layer arranged on and above the organic active layer and a gate electrode arranged on the gate insulating layer are formed and source and drain electrodes are electrically connected to the organic active layer, in which the gate electrode is buried in the gate insulating layer so that the gate electrode is in direct contact with the gate insulating layer and is in a state that an upper surface portion of the gate electrode and an upper surface portion of the gate insulating layer are arranged at an identical height position relative to the plastic film and constitute an identical surface, wherein the gate insulating layer is present between a lower surface portion of the gate electrode and the organic active layer, and wherein the upper surface portion of the gate electrode and the upper surface portion of the gate insulating layer face away from the plastic film and the adhesive layer, a pixel electrode which is formed above the barrier insulating layer and is electrically connected to the drain electrode of the TFT, and a first alignment film formed on the TFT and the pixel electrode;

a counter substrate including a second plastic film, a common electrode formed on the second plastic film, and a second alignment film formed on the common electrode; and liquid crystal sealed between the TFT substrate and the counter substrate.

4. The flexible display according to claim 3, wherein a color filter layer is further provided in the TFT substrate.

* * * * *